(12) United States Patent
Dayton et al.

(10) Patent No.: US 8,870,003 B2
(45) Date of Patent: Oct. 28, 2014

(54) BIODEGRADABLE CONTAINER FOR LIQUID AND/OR SEMI-SOLID PRODUCTS

(75) Inventors: Douglas C. Dayton, Harvard, MA (US); Sung K. Park, Chestnut Hill, MA (US)

(73) Assignee: Greater Good, Inc., Newton, MA (US)

( * ) Notice: Subject to any disclaimer, the term of this patent is extended or adjusted under 35 U.S.C. 154(b) by 992 days.

(21) Appl. No.: 12/751,568

(22) Filed: Mar. 31, 2010

(65) Prior Publication Data
US 2010/0252617 A1 Oct. 7, 2010

Related U.S. Application Data

(63) Continuation-in-part of application No. 12/572,132, filed on Oct. 1, 2009.

(60) Provisional application No. 61/101,845, filed on Oct. 1, 2008, provisional application No. 61/104,840, filed on Oct. 13, 2008, provisional application No. 61/108,591, filed on Oct. 27, 2008, provisional application No. 61/113,241, filed on Nov. 11, 2008, provisional application No. 61/168,957, filed on Apr. 14, 2009, provisional application No. 61/218,165, filed on Jun. 18, 2009, provisional application No. 61/233,039, filed on Aug. 11, 2009.

(51) Int. Cl.
| | | |
|---|---|---|
| *A47G 19/22* | (2006.01) | |
| *B65D 65/46* | (2006.01) | |
| *B65D 8/00* | (2006.01) | |
| *B65D 41/04* | (2006.01) | |
| *B31B 43/00* | (2006.01) | |
| *B31C 9/00* | (2006.01) | |

(52) U.S. Cl.
CPC .............. *B31C 9/00* (2013.01); *B65D 65/466* (2013.01); *B65D 15/08* (2013.01); *B31B 2201/226* (2013.01); *B65D 41/0492* (2013.01); *B65D 2565/385* (2013.01); *B31B 43/00* (2013.01)
USPC ........ 215/40; 215/341; 206/557; 220/495.05; 220/495.01; 220/713; 220/711; 220/714; 229/4.5; 425/412; 426/138; 428/35.6

(58) Field of Classification Search
USPC ........ 215/40, 341; 428/36.4, 34.2, 34.6, 35.6; 426/138, 307, 607, 74; 229/110, 113, 229/116.1, 117, 117.03, 117.14–117.24, 229/4.5, 125.23, 125.24, 5.81; D9/418, D9/423, 431; 220/495.05, 495.01, 713, 220/711, 714; 493/108, 110, 153
See application file for complete search history.

(56) References Cited

U.S. PATENT DOCUMENTS 2,385,145 A * 9/1945 MacDonald .................. 162/224
2,530,124 A    11/1950 Kieckhefer
(Continued)

OTHER PUBLICATIONS

U.S. Appl. No. 12/572,132, Non-Final Office Action mailed Oct. 26, 2012, 12 pgs.

(Continued)

*Primary Examiner* — Fenn Mathew
*Assistant Examiner* — Cynthia Collado
(74) *Attorney, Agent, or Firm* — Strategic Patents, P.C.

(57) ABSTRACT

A container includes a body, a liner attached to the interior of the body, a lid dimensioned to attached to the top of the liner, and a perimeter seal attached to the lid. The lid includes a hole and the perimeter seal includes a region dimensioned to create a friction fit when disposed in the hole. Each of the body, the liner, and the lid may include a paper pulp coated with a biodegradable, organically derived, plastic resin. Methods of constructing the container are also disclosed.

11 Claims, 40 Drawing Sheets

(56) References Cited

U.S. PATENT DOCUMENTS

| | | | |
|---|---|---|---|
| 2,858,647 A * | 11/1958 | Cotton | 47/74 |
| 3,866,845 A * | 2/1975 | Keeler et al. | 215/341 |
| 4,280,648 A * | 7/1981 | Boursier | 206/521.1 |
| 5,738,921 A * | 4/1998 | Andersen et al. | 428/36.4 |
| 6,520,361 B2 | 2/2003 | Joulia | |
| 6,699,226 B2 | 3/2004 | Velázquez | |
| 7,422,780 B2 | 9/2008 | Suzuki | |
| 2004/0087918 A1 | 5/2004 | Johnson, III et al. | |
| 2004/0105941 A1 * | 6/2004 | Terada et al. | 428/34.2 |
| 2006/0131319 A1 | 6/2006 | McDonald | |
| 2009/0045206 A1 | 2/2009 | Walker | |
| 2010/0084361 A1 | 4/2010 | Dayton et al. | |
| 2012/0138503 A1 | 6/2012 | Patel | |
| 2012/0292226 A1 | 11/2012 | Hilbish | |
| 2012/0311972 A1 | 12/2012 | Hunter | |
| 2012/0315362 A1 * | 12/2012 | Dale et al. | 426/138 |

OTHER PUBLICATIONS

U.S. Appl. No. 12/572,132, Non-Final Office Action mailed Feb. 11, 2014, 14 pages.

U.S. Appl. No. 12/572,132, Final Office Action mailed May 20, 2013, 15 pages.

* cited by examiner

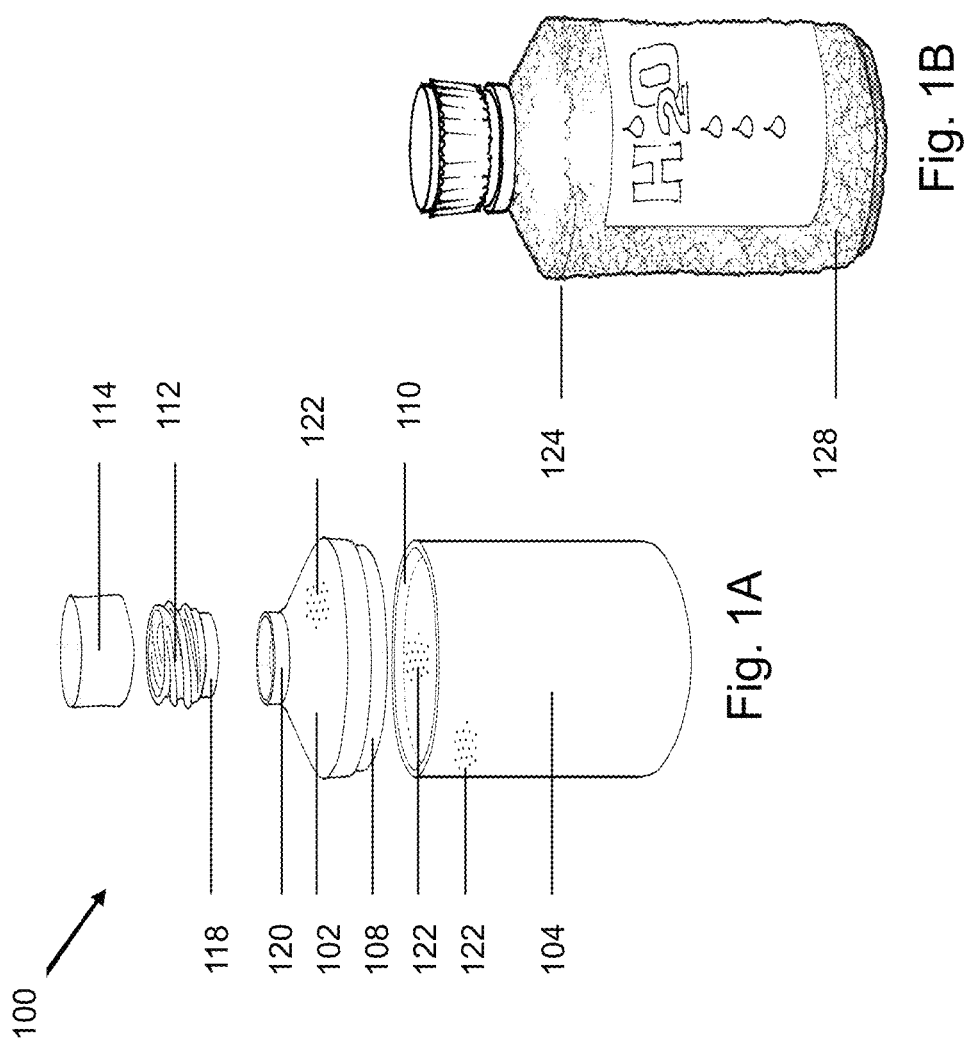

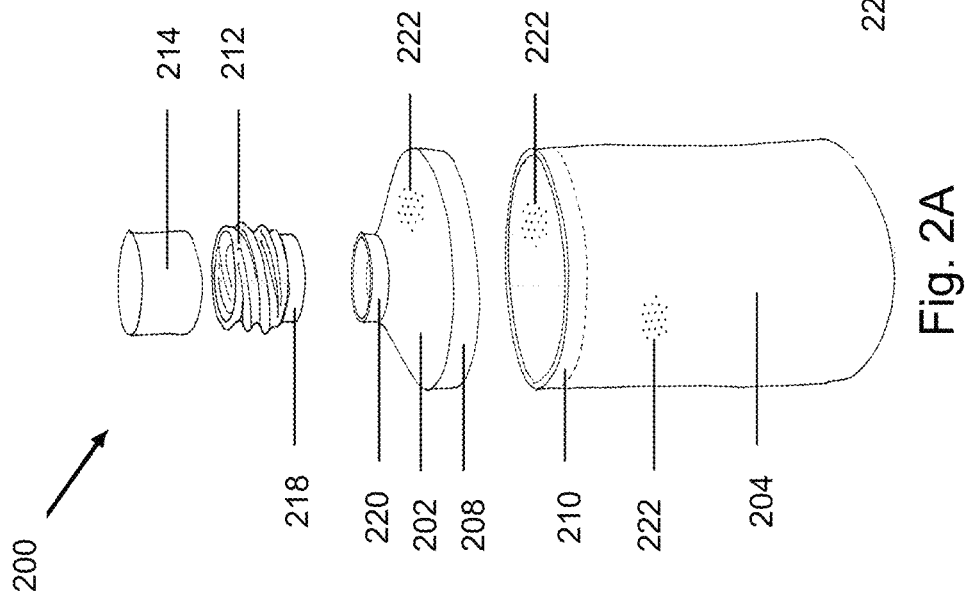
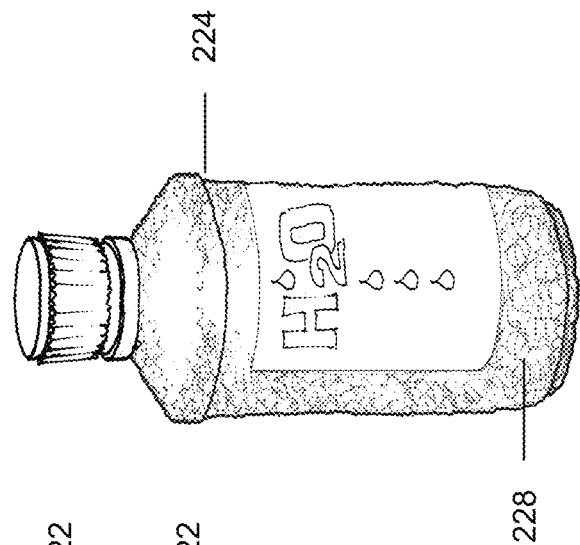
Fig. 2A
Fig. 2B

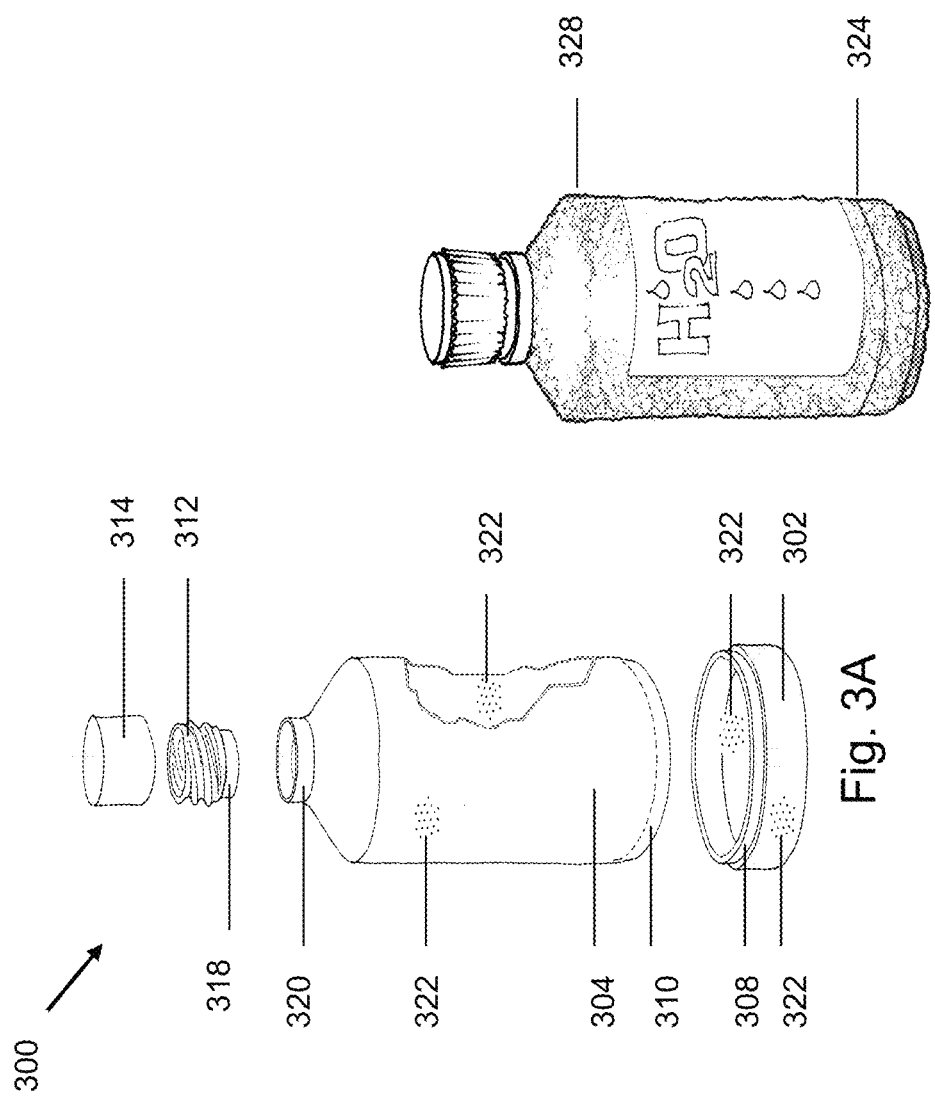

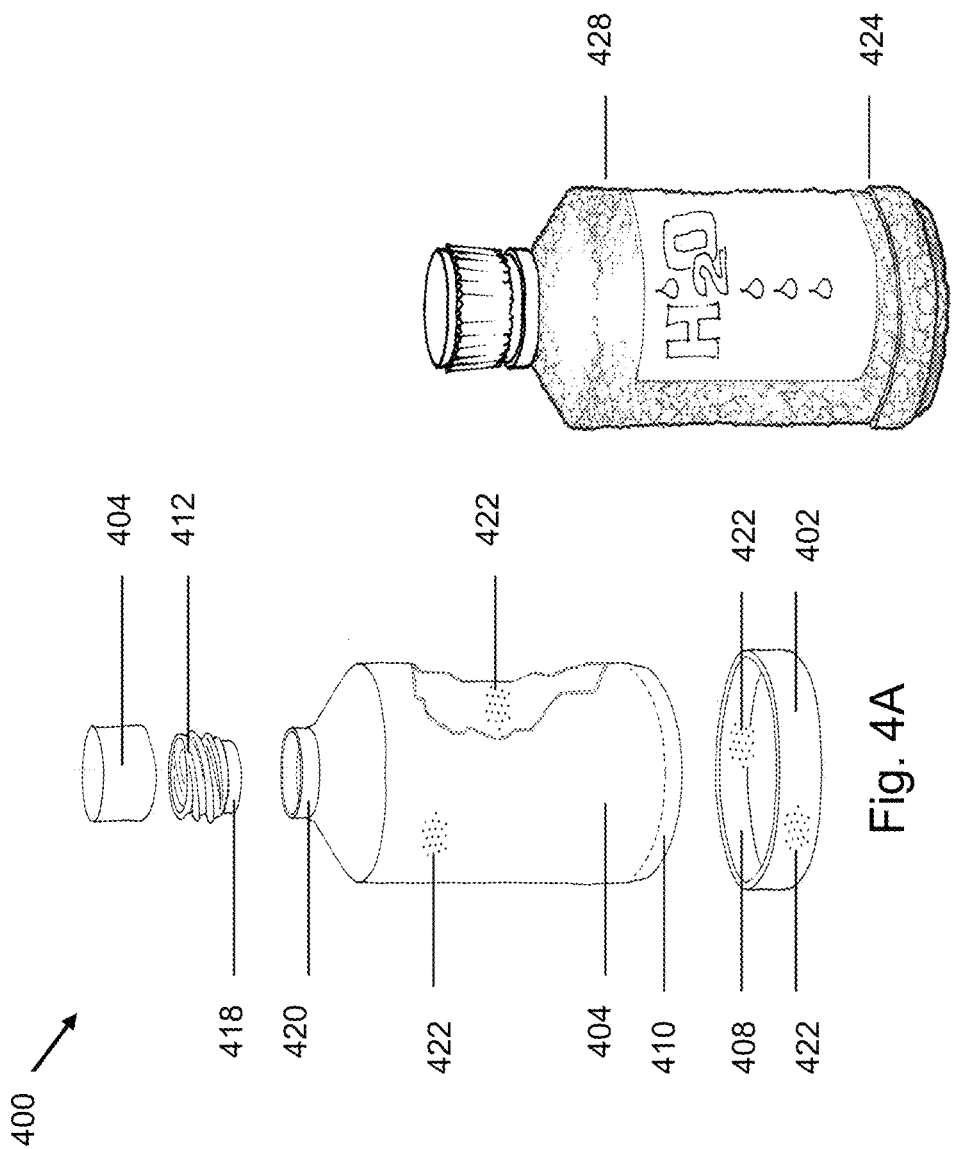

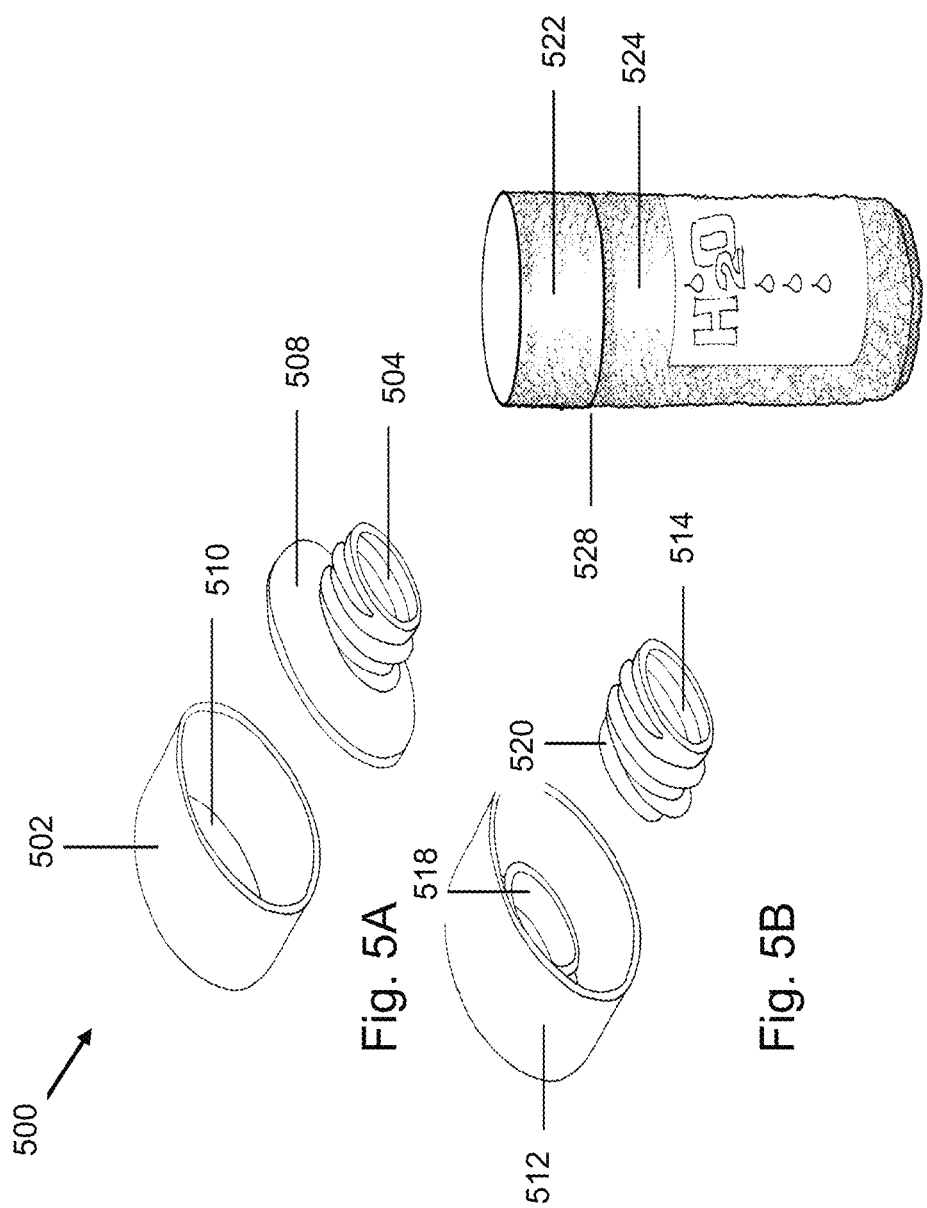

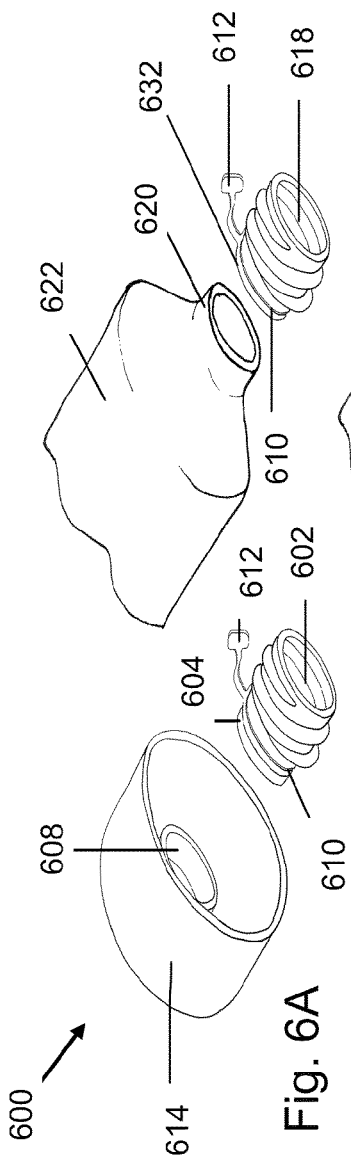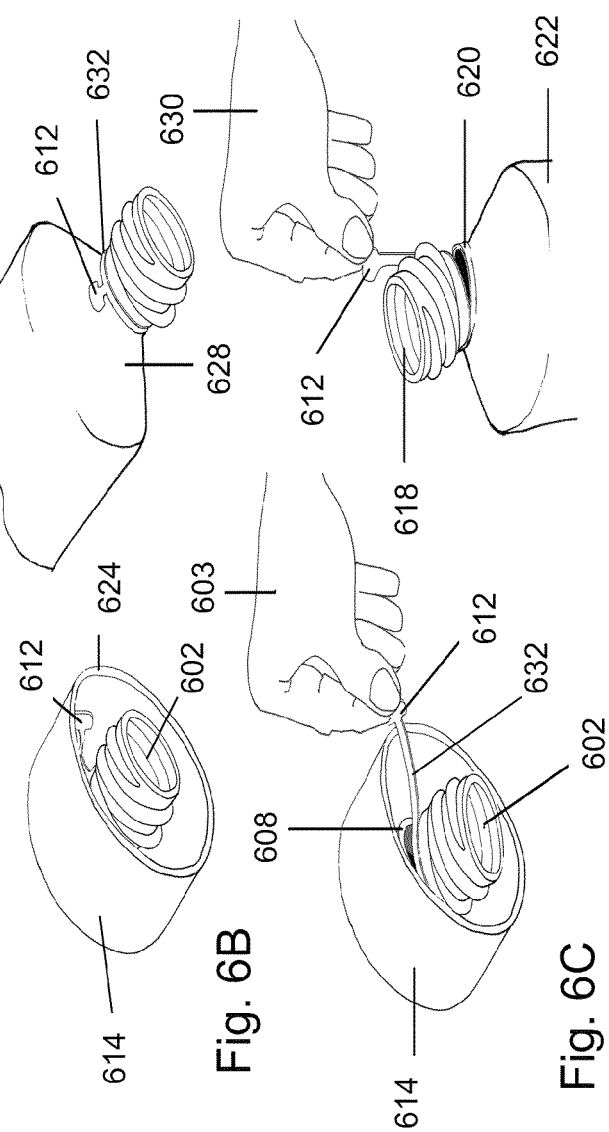

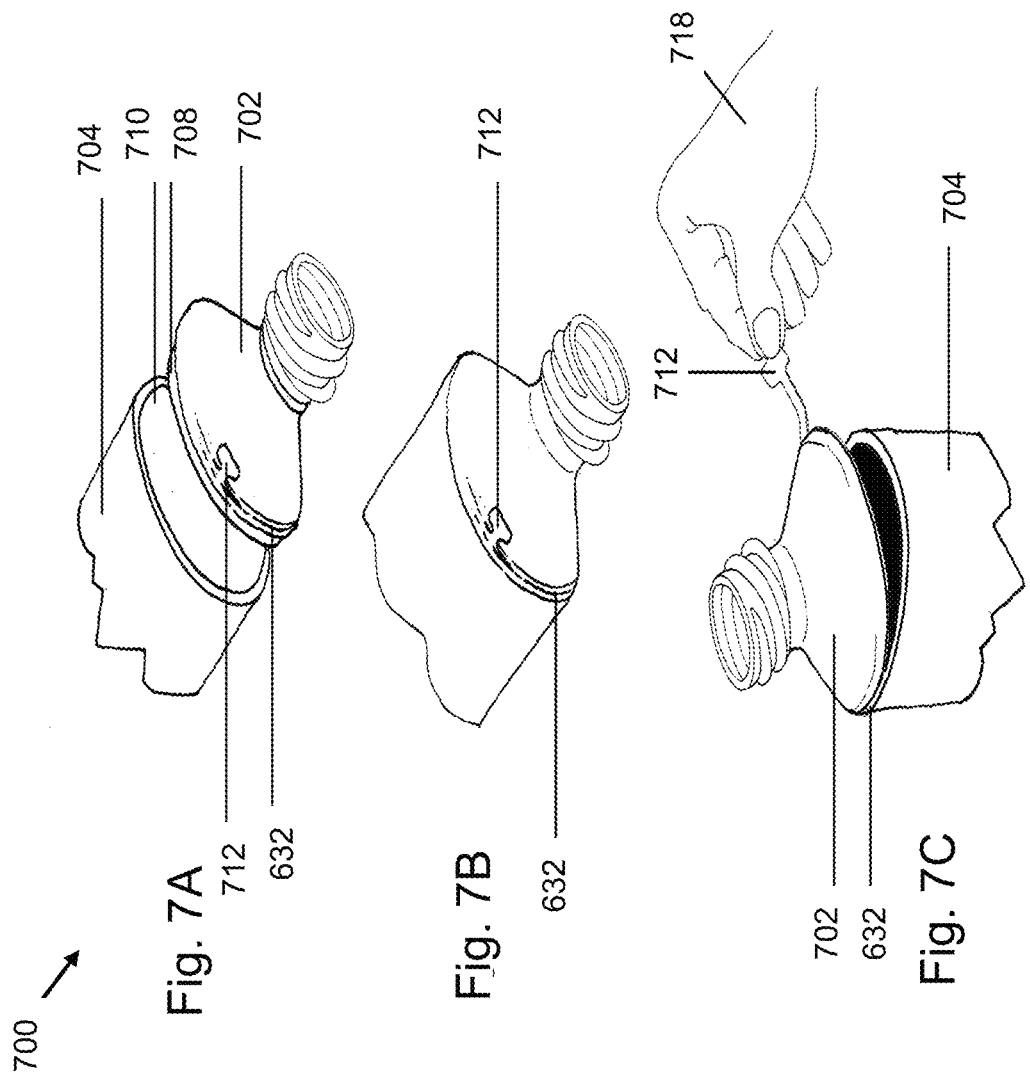

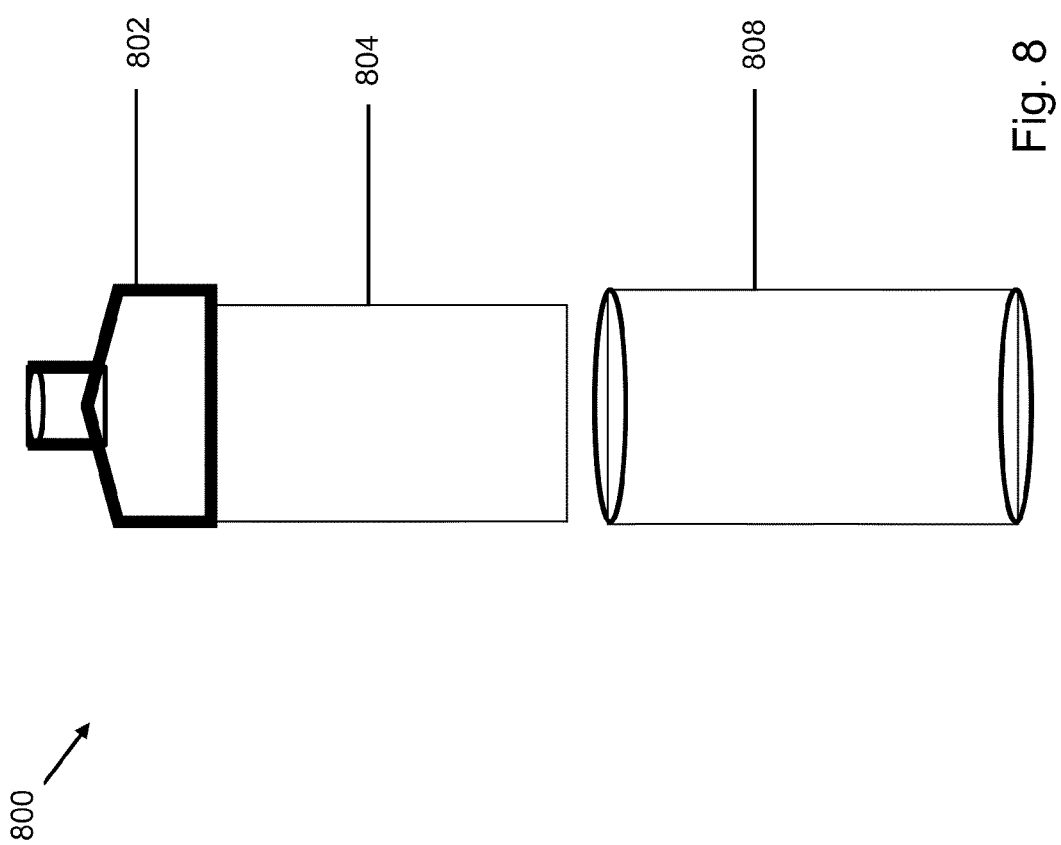

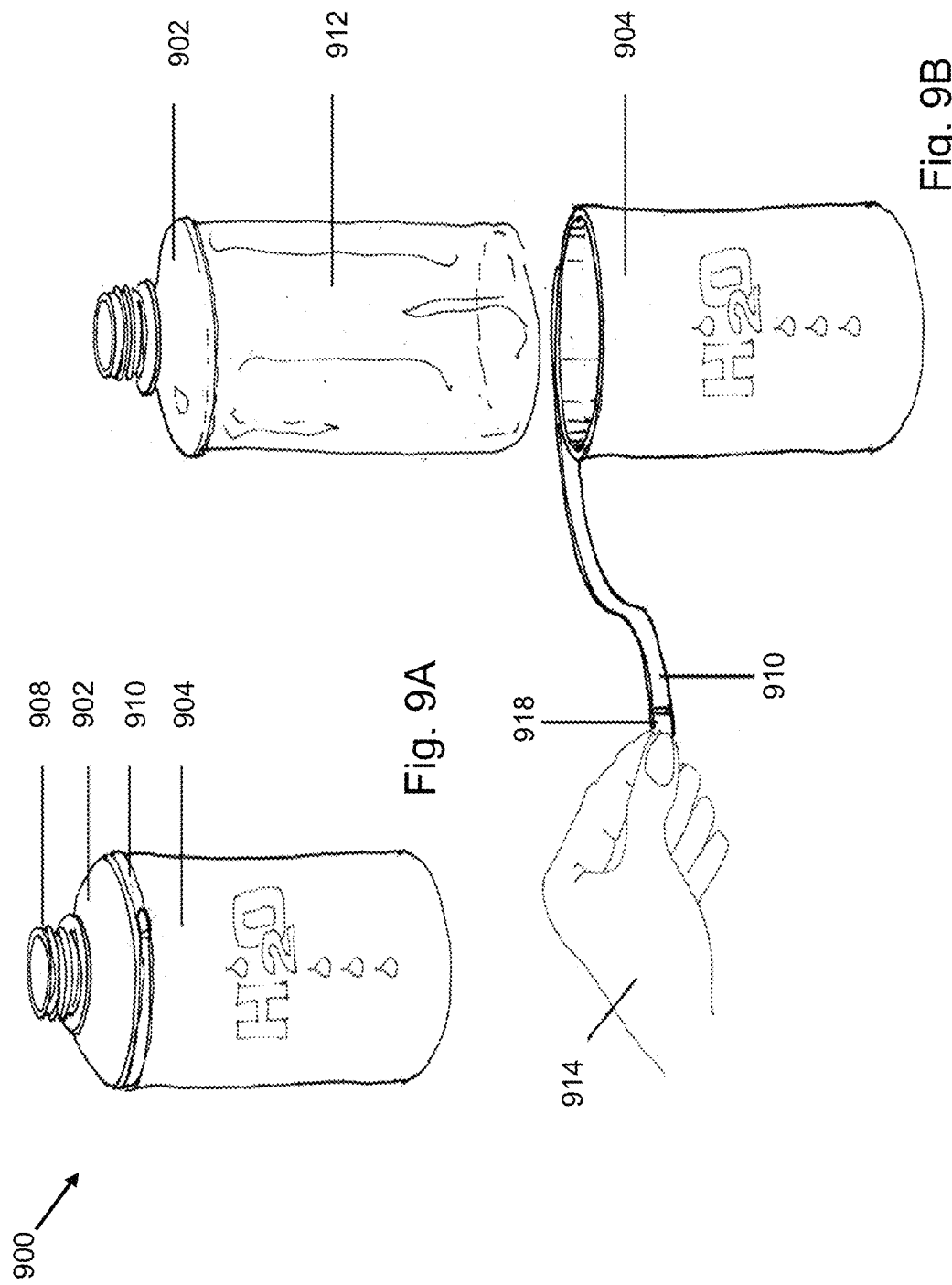

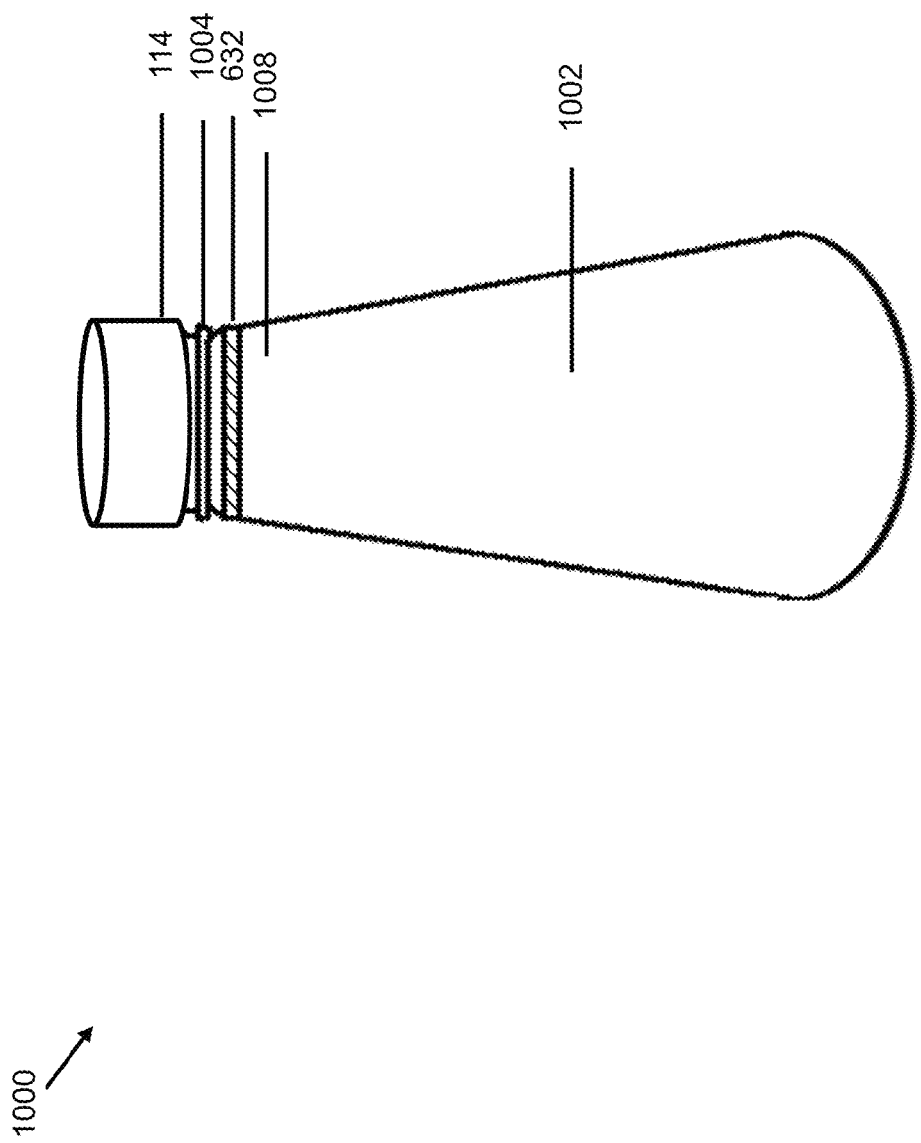

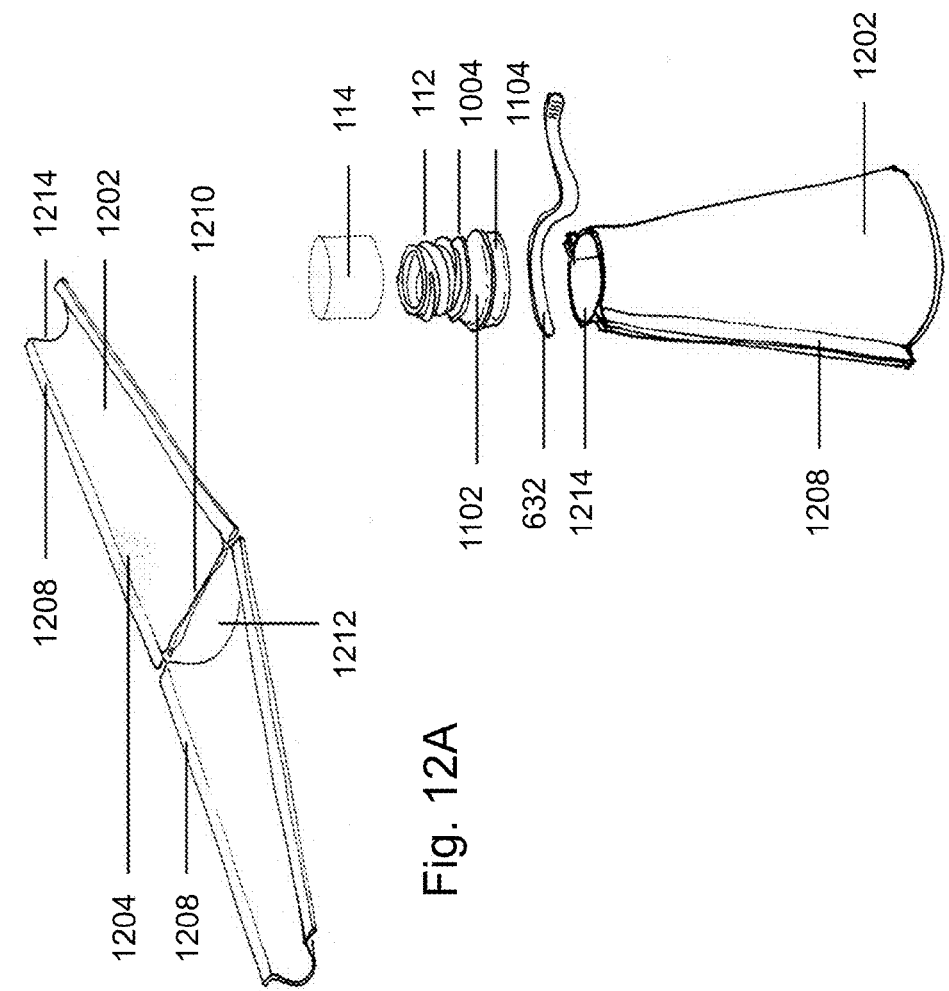

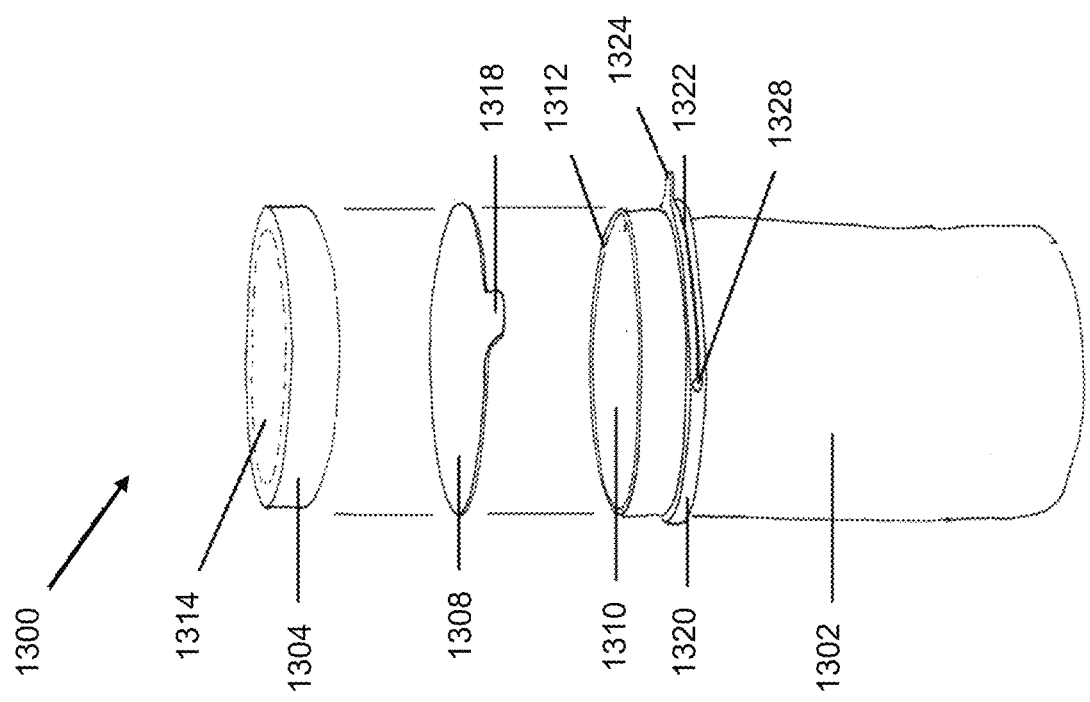

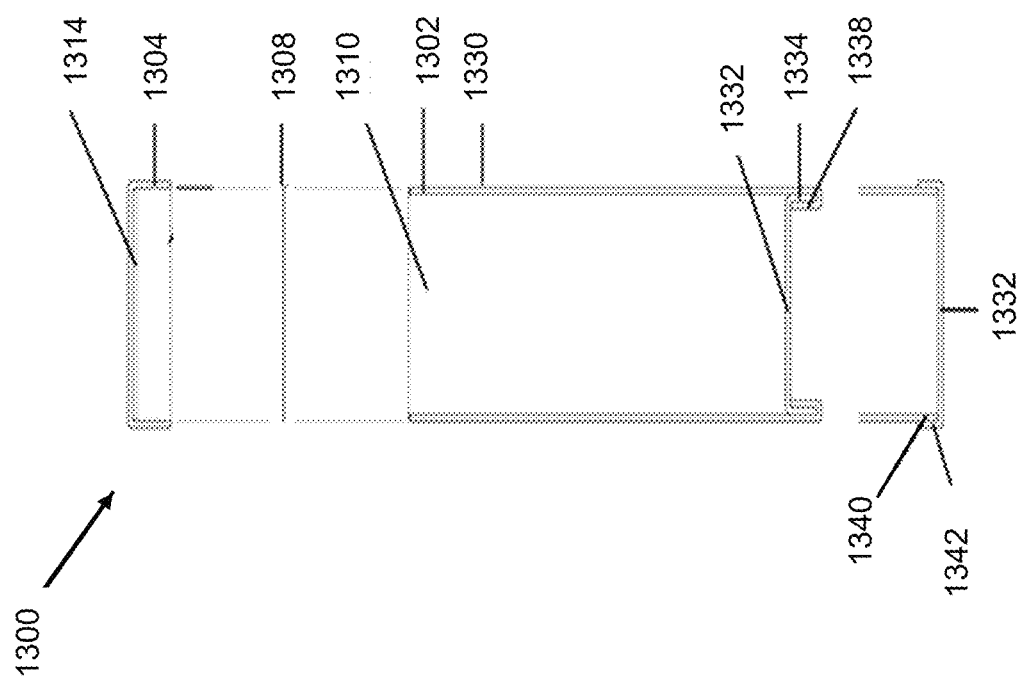

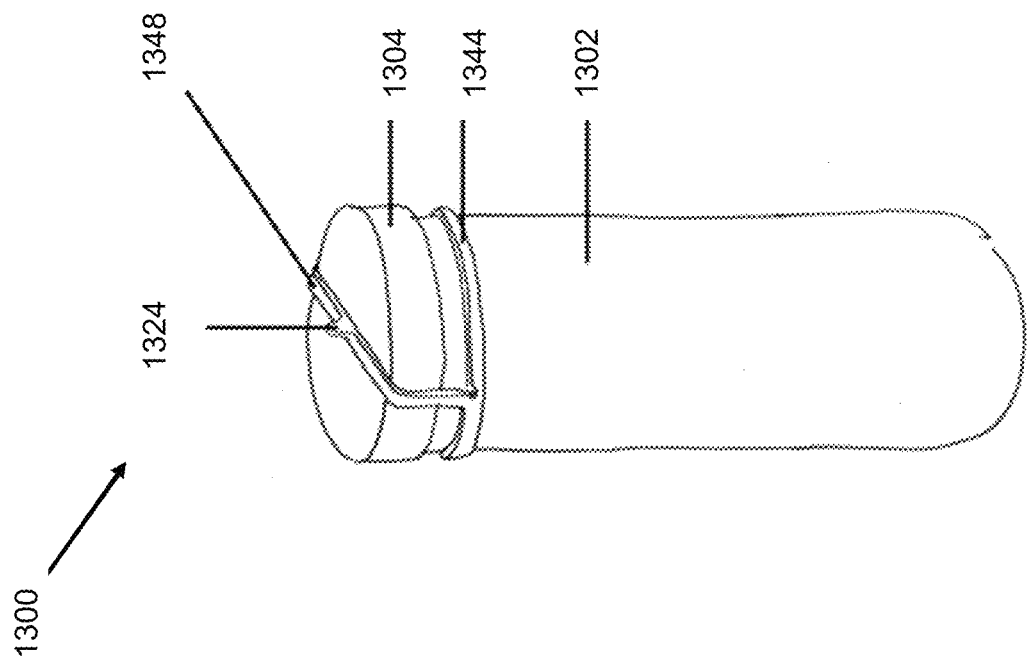

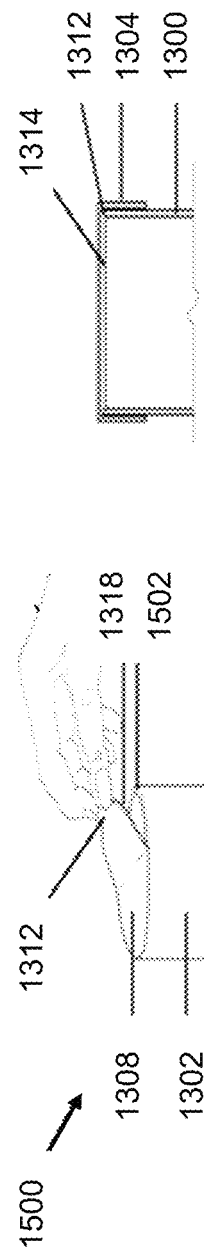

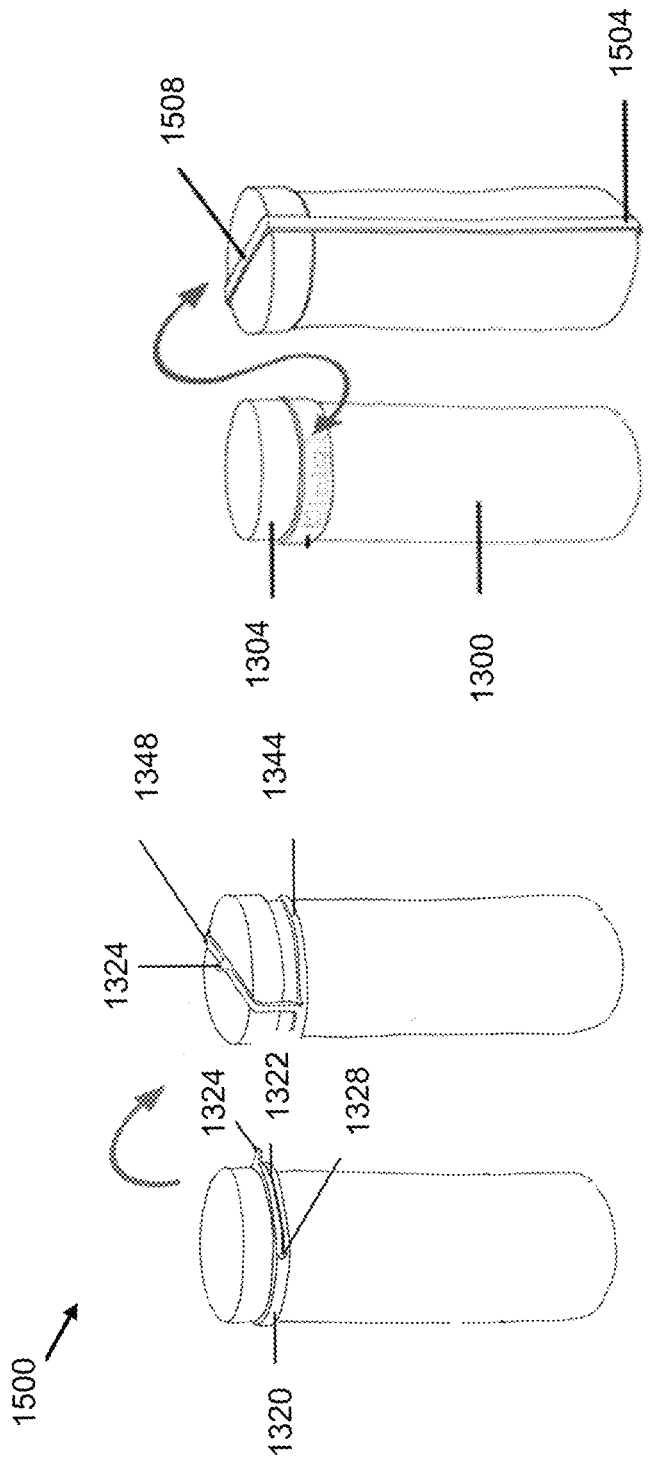

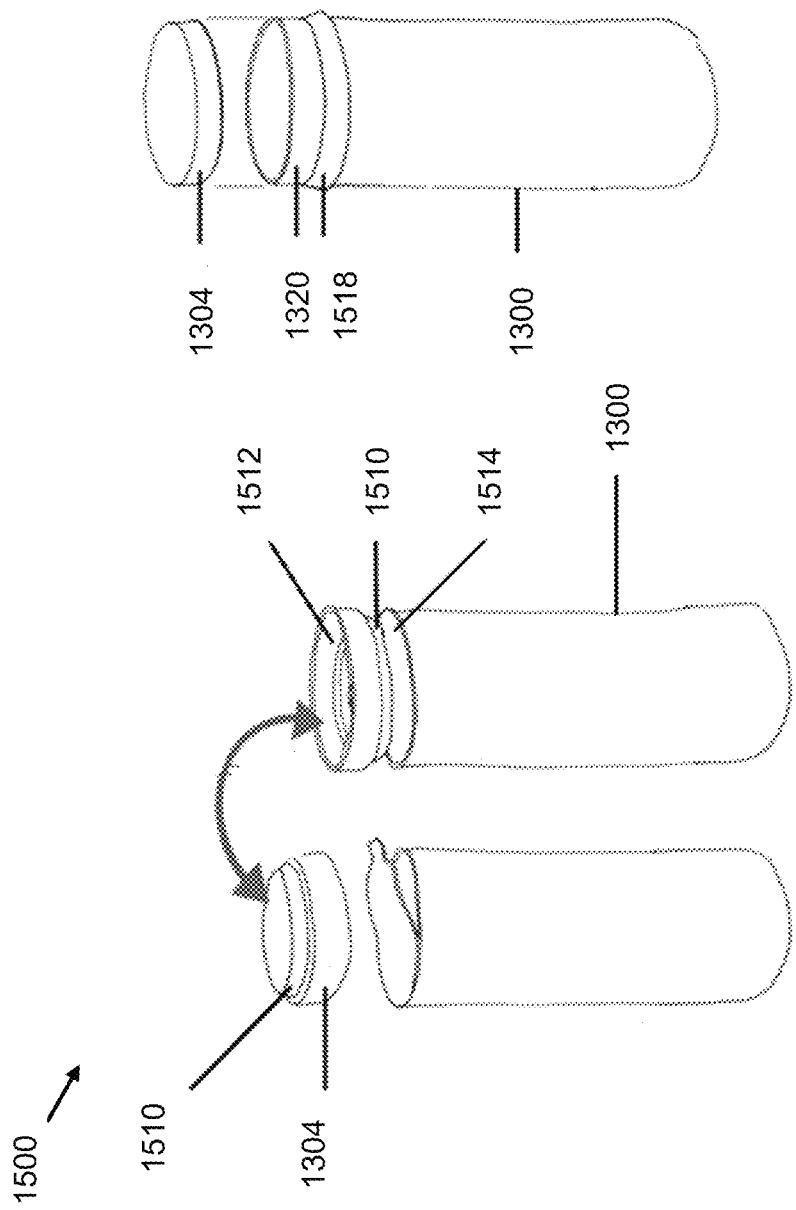

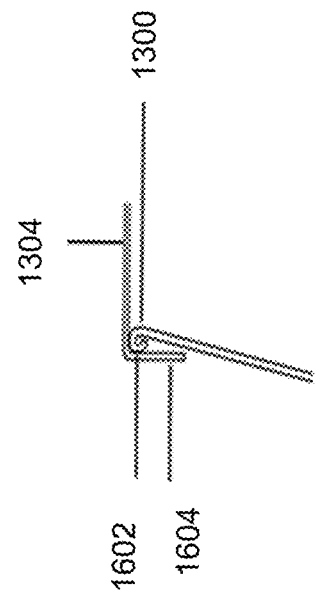
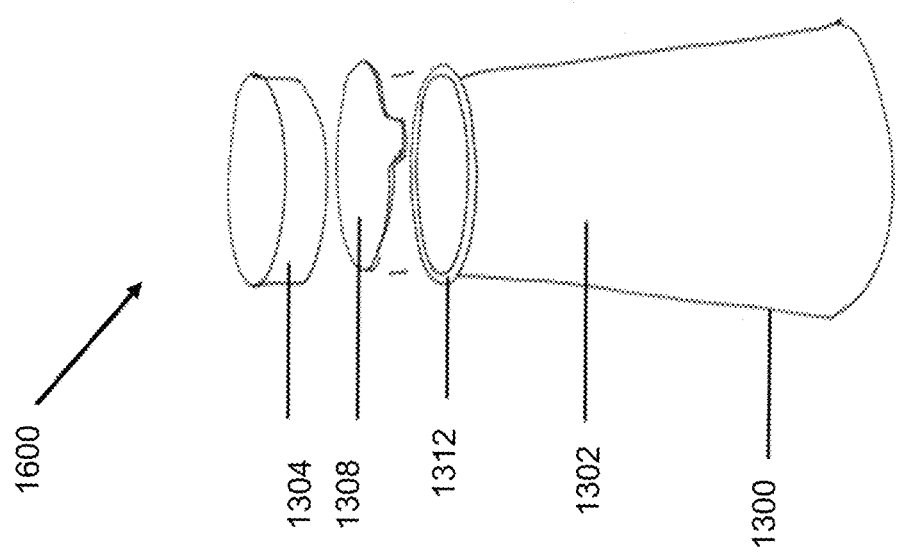

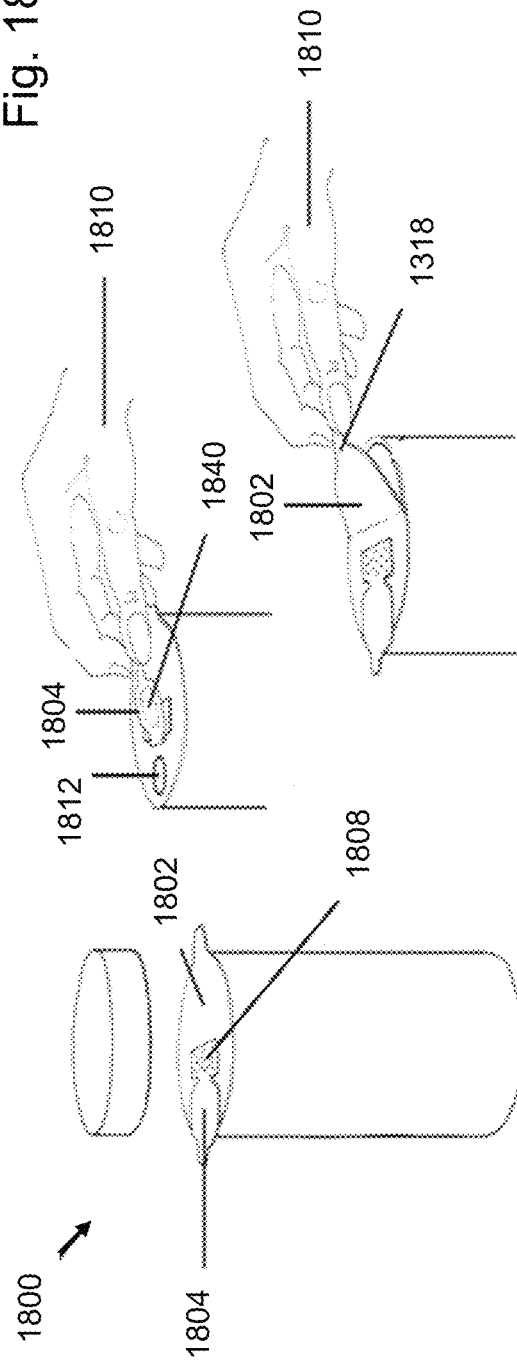

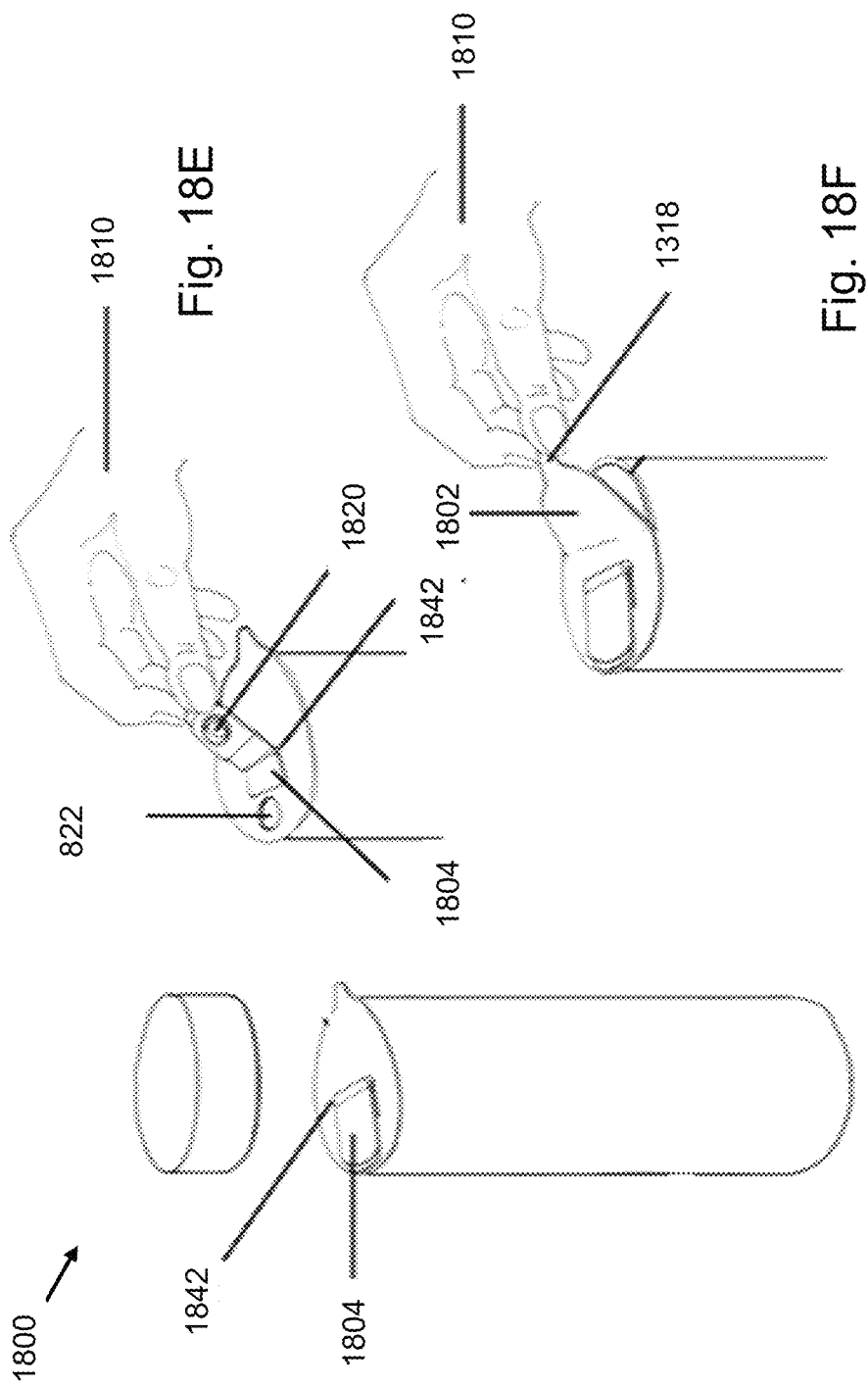

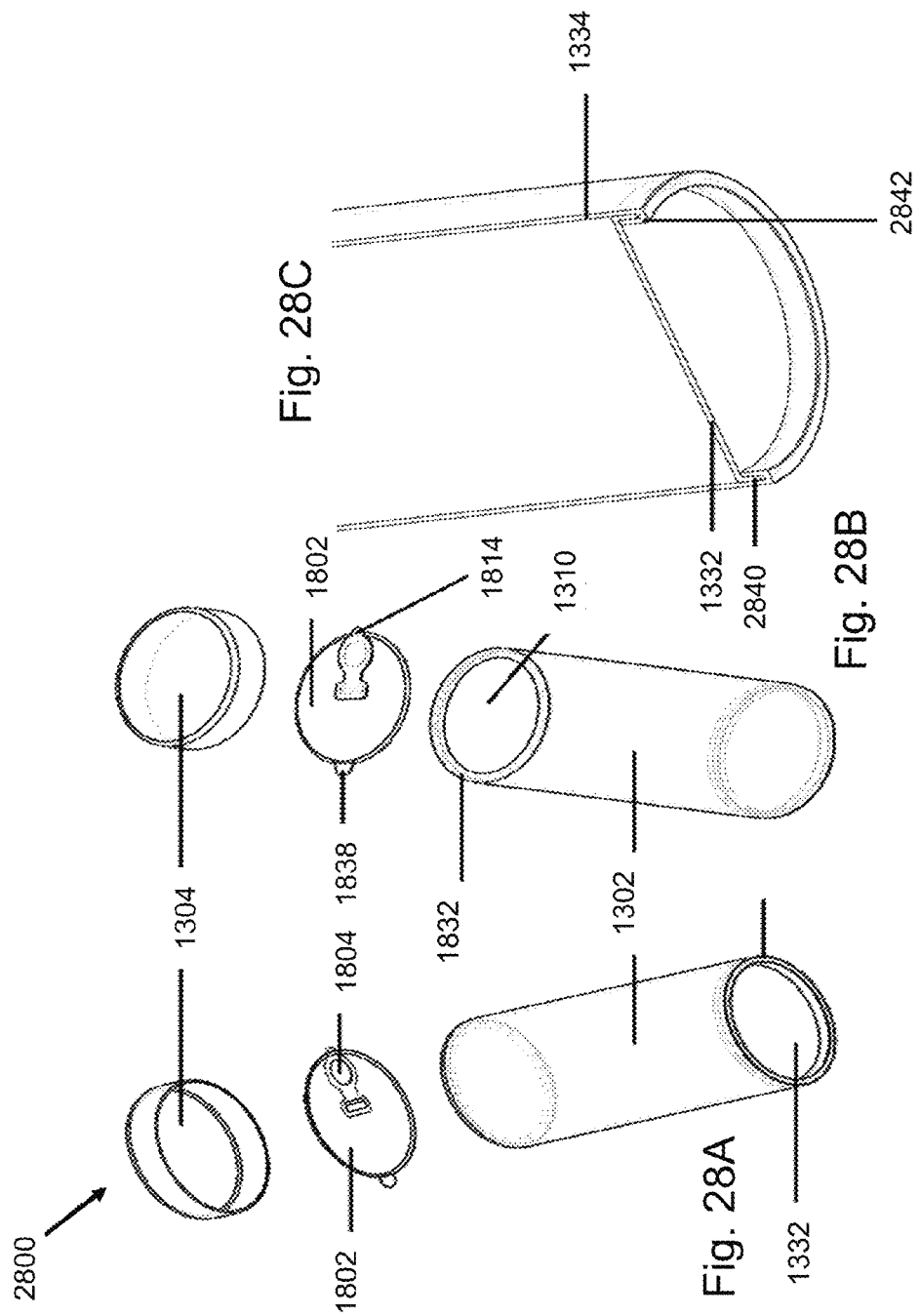

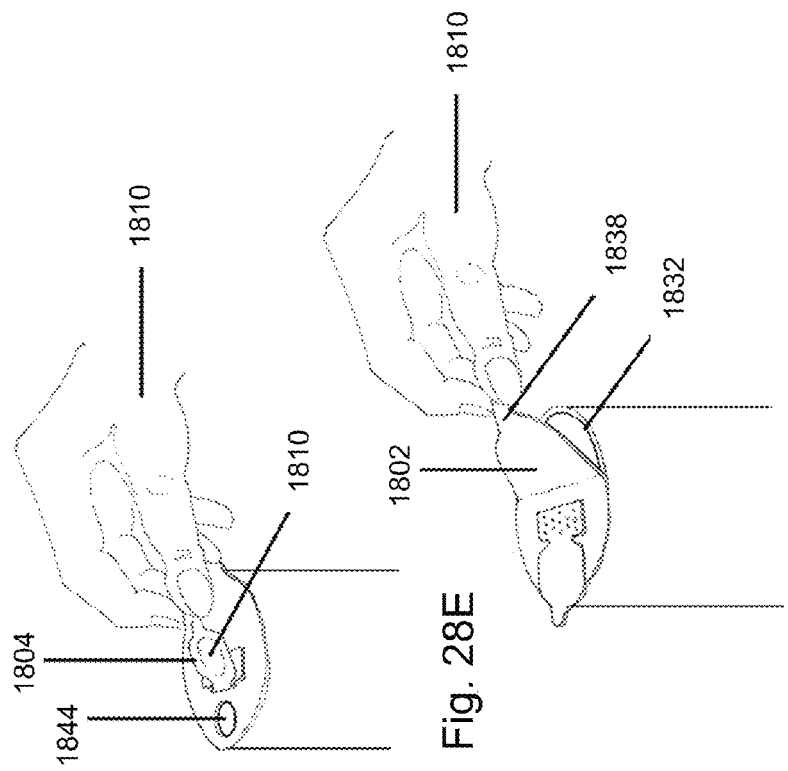
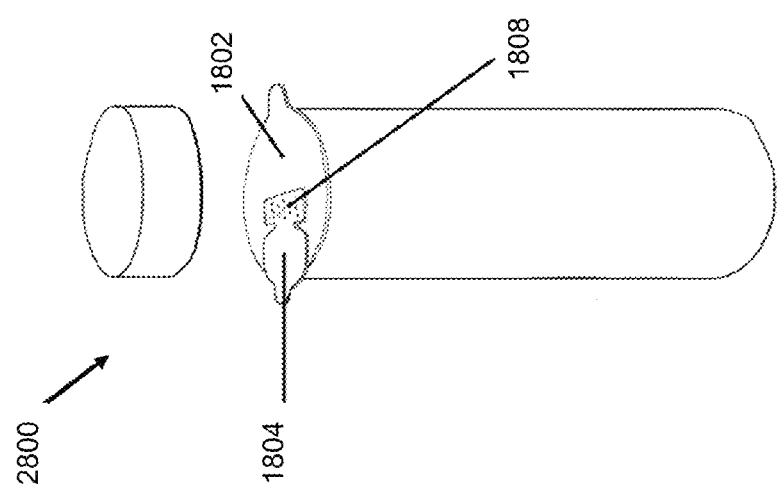
Fig. 28E
Fig. 28F
Fig. 28D

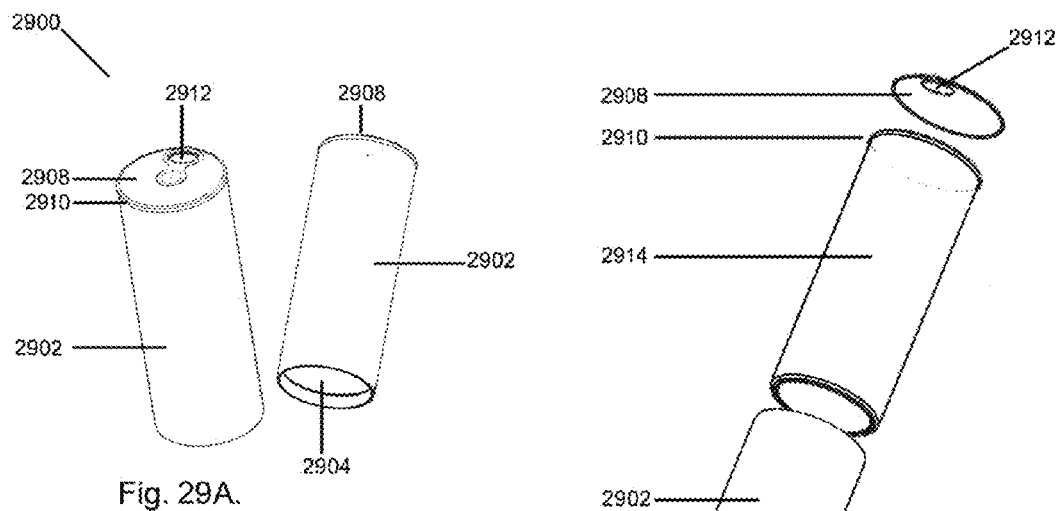
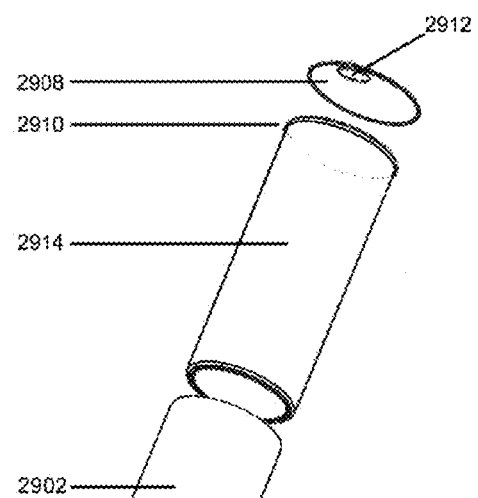
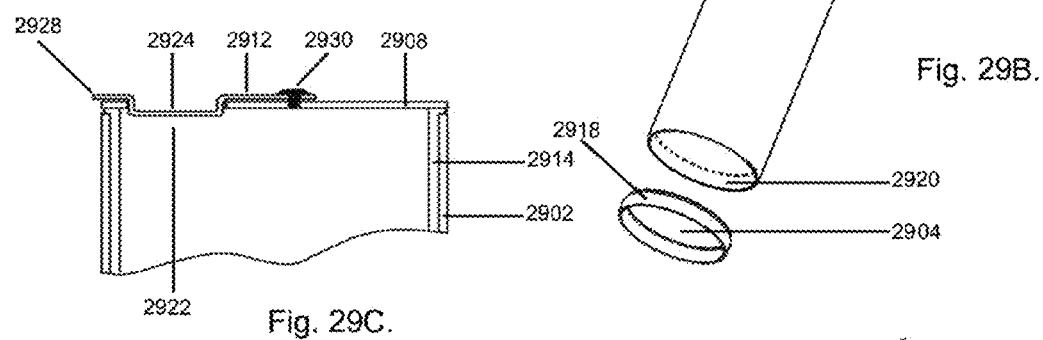
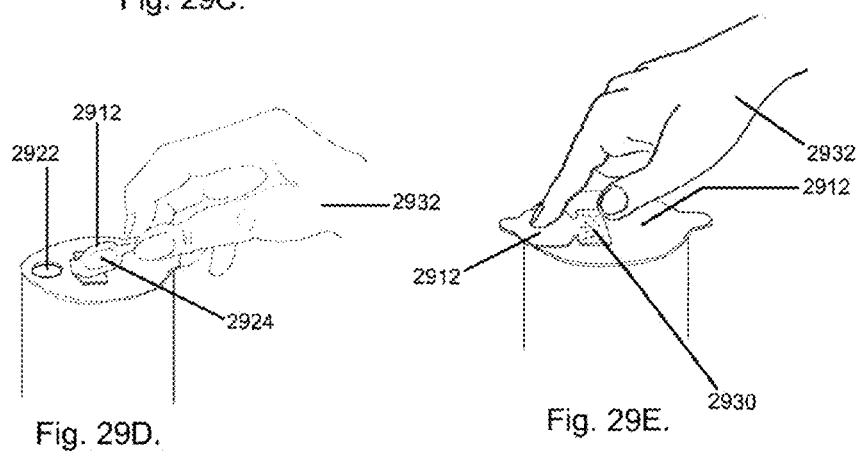
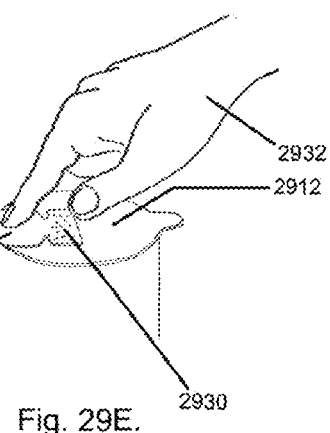
Fig. 29.

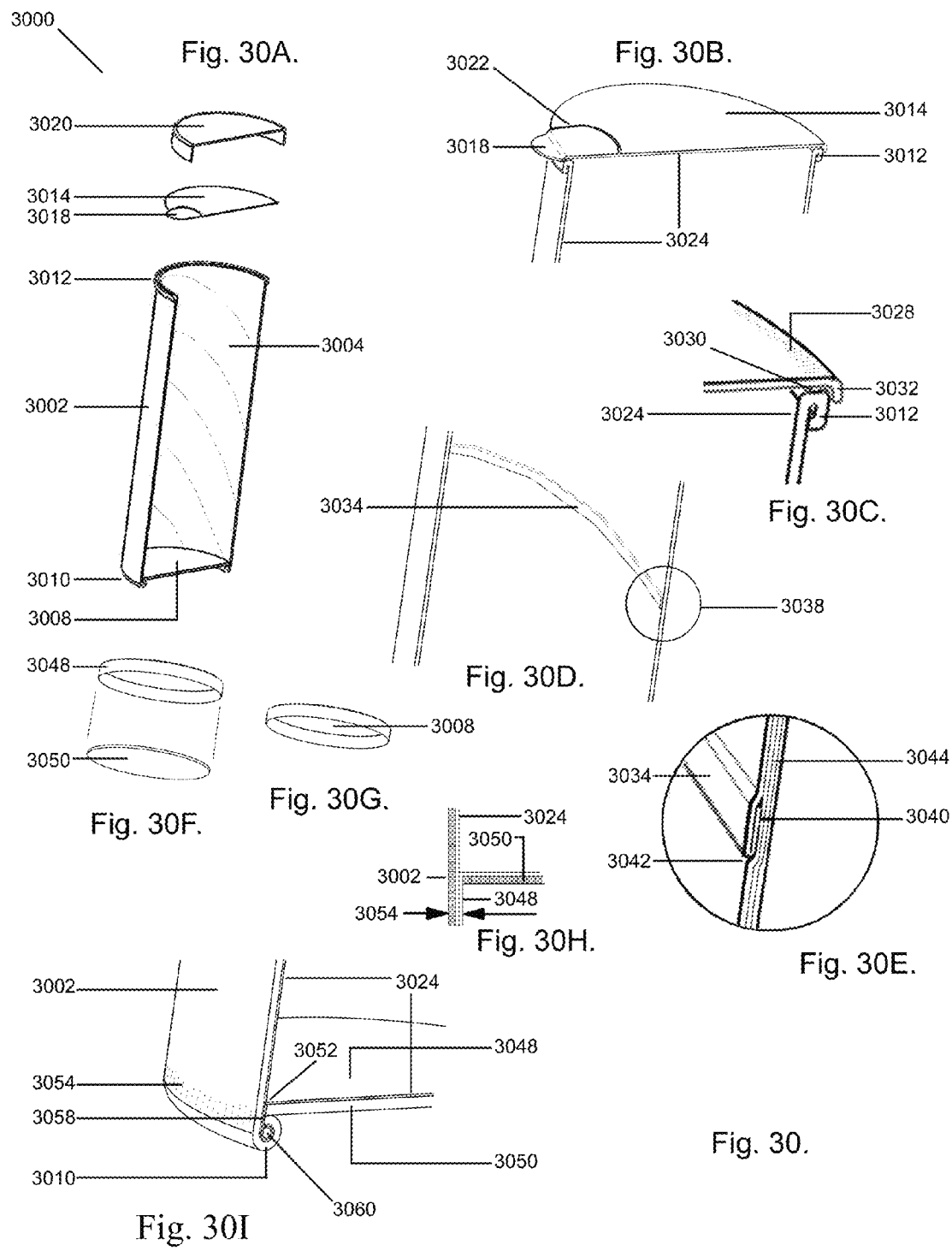

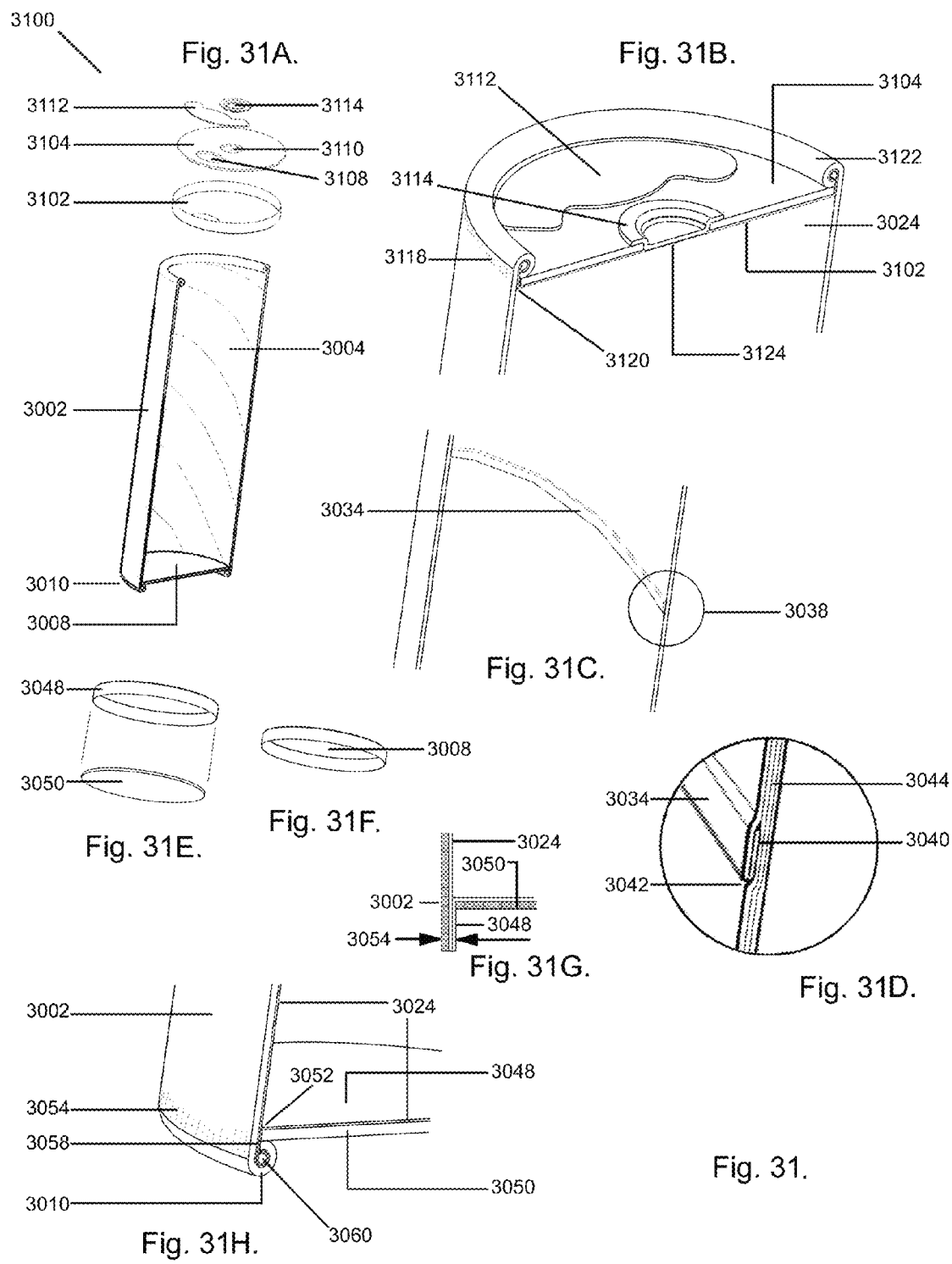

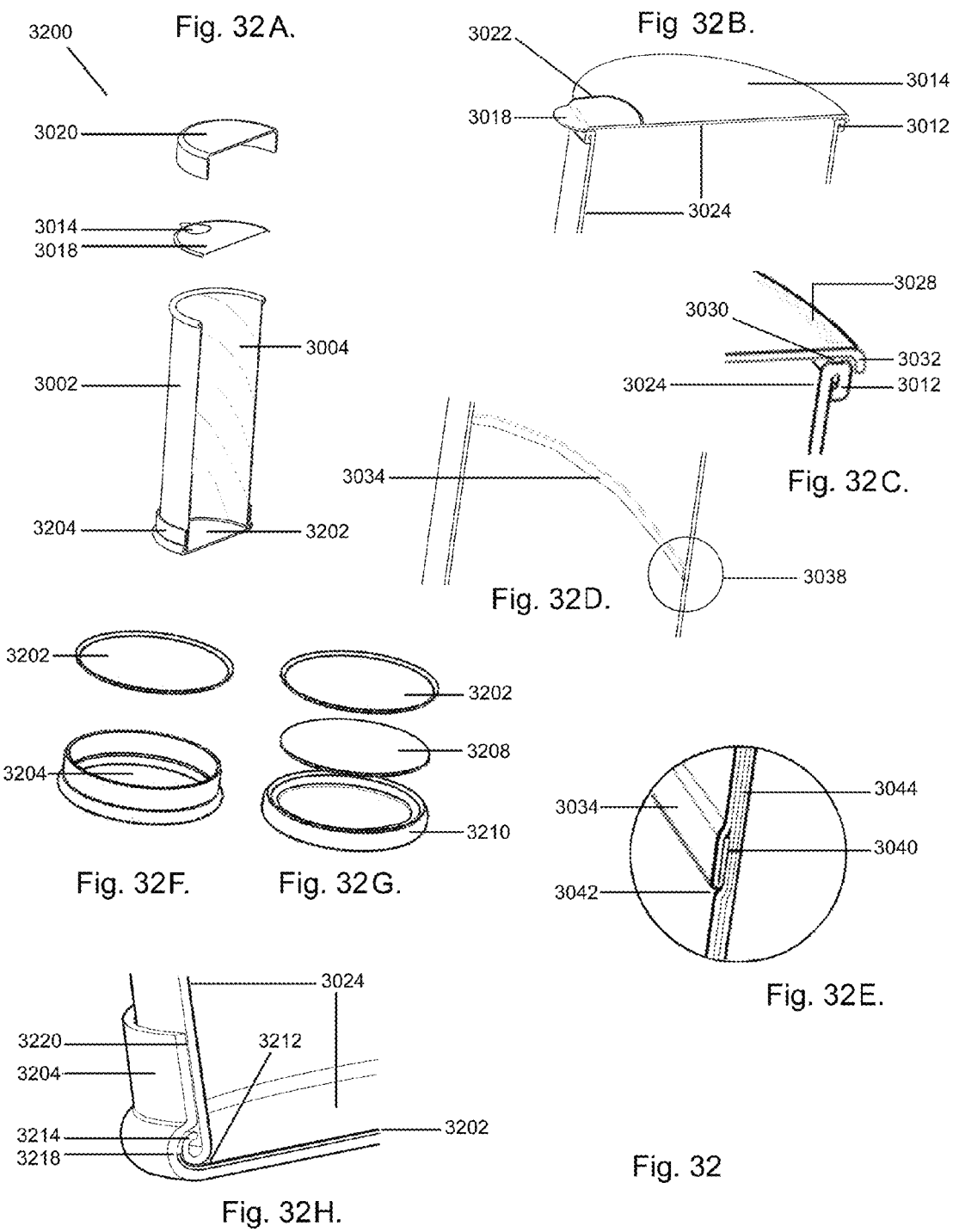

BIODEGRADABLE CONTAINER FOR LIQUID AND/OR SEMI-SOLID PRODUCTS

CROSS-REFERENCE TO RELATED APPLICATIONS

This application is a continuation-in-part of U.S. patent application Ser. No. 12/572,132, filed Oct. 1, 2009, which is hereby incorporated by reference in its entirety, and which claims the benefit of the following provisional applications, each of which is hereby incorporated by reference in its entirety: U.S. Provisional Application No. 61/101,845, filed Oct. 1, 2008; U.S. Provisional Application No. 61/104,840, filed Oct. 13, 2008; U.S. Provisional Application No. 61/108,591, filed Oct. 27, 2008; U.S. Provisional Application No. 61/113,241, filed Nov. 11, 2008; U.S. Provisional Application No. 61/168,957, filed Apr. 14, 2009; U.S. Provisional Application No. 61/218,165, filed Jun. 18, 2009; and U.S. Provisional Application No. 61/233,039, filed Aug. 11, 2009.

BACKGROUND

1. Field

This invention relates to a container and more specifically to a biodegradable container for storing products.

2. Description of the Related Art

The packaging industry has recently experienced rapid growth. Plastic packaging is now commonly used for many products including semi-solid and liquid items such as food, beverages, water, consumer products, lotions, medicines, wet chemicals, and the like. These plastic packaged products generate waste in the form of plastics and its derivatives, and where non-biodegradable materials are used for this ever-increasing packaging, it may result in contamination of the landscape and the environment. In addition, it now appears that some of these plastics may leach various toxic substances into the products that they enclose, endangering the safety and health of the consumers of such products.

Paper containers are sometimes used instead to package dry goods and liquids. While paper is typically biodegradable, paper poses other difficulties when used as a liquid packaging material. Paper containers are typically compound structures formed of multiple flat paper sections. These assemblies have multiple seams and other potential weak points that may rupture or otherwise leak as liquids find their way into voids left by imperfect manufacture or wick into the cut edges of the coated paper where it is exposed on the inside surfaces of the container. These paper containers may also include additional materials such as plastic films or composite sheets that are not biodegradable.

There remains a need for a biodegradable and/or recyclable container that may be used for the storage and transport of semi-solid and/or liquids items.

SUMMARY

A biodegradable and/or recyclable container for water and other beverages permits storage and transport of a contained liquid. The body of the container is manufactured from a paper pulp material that is protected from condensation and other moisture by an organic, vegetable based and biodegradable plastic resin coating such as PLA on the outside of the container.

In some embodiments, an inserted and bonded seamless liner protects the inside of the container. Preferably, the liner includes an organic, vegetable based and biodegradable plastic resin coating, which makes the liner water and air tight yet able to biodegrade into compostable material.

In some embodiments, a spiral wound liner protects the inside of the container. Preferably, the liner includes an organic, vegetable based and biodegradable plastic resin coating, which makes the liner water and air tight yet able to biodegrade into compostable material. The leading edge of the liner's winding may be folded back upon itself so that there is no cut edge of paper that would allow water to wick into the paper.

In any case, a biodegradable plastic double-coated paper lid adhered to the top edge of liner seals the container. This lid may have a drink opening at the edge and a secondary peel away covering of a mouth-sized opening bonded at the perimeter to the lid. When the peel away covering is removed, a user may partake of the contained liquid without removing the entire lid for the container. The peel away covering of the drink opening may have a pressure formed feature that protrudes into the drink opening and provides a friction fit closure after the seal has been broken that can be used for secondary short term closure once the container has been opened.

In one aspect, a container disclosed herein includes a top section that has provision for a connection to a threaded neck and a threaded mouth component, and a lower section with an integral bottom. A lower edge of a wall of the top funnel section may be thinned to create a scarf joint that mates with a similar feature on an upper edge of a wall of the lower section. The container may be formed by joining the top and lower sections. The container may be entirely compostable and/or recyclable. The top section may be a funnel section. The lower section may be a cylindrical section or a conical section. Joining the top and lower sections may include using an adhesive. Inside and outside surfaces of the sections may be coated with a thin waterproof and biodegradable coating. The coating may be formed from one or more biodegradable plastic resin and a corn-based PLA plastic. An opening to the top section may include a threaded spout that mates with a threaded cap. The threaded spout and threaded cap may be molded from one or more of a biodegradable plastic resin and a corn-based PLA plastic. The threaded cap may include a larger outer cap molded of a paper pulp and a smaller inner threaded cap that mates to the threaded mouth of the container. The inner threaded cap may be detachably associated with the larger outer cap. The detachable association may include a pull tab. The threaded neck to the container may have a cylindrical surface mating feature that engages to a similar cylindrical surface either on an inside or on an outside of the threaded neck of the container. The container may further include a structural element for inserting the container to provide additional support for contents of the container.

In another aspect, a container disclosed herein is a biodegradable and/or recyclable container for storing semi-solid and liquid items such as beverages, water, oil-based creams, food products, lotions, medicines, wet chemicals, and the like. The container may be manufactured from a paper pulp material, and may have a biodegradable plastic resin coating on the inside and/or outside to protect it from exposure to air and moisture. The paper pulp may degrade into compost material when exposed to biodegrading influences, such as extreme biodegrading influences. The container may be sealed by a membrane adhered to its top edge. A slip fit lid may slide onto an upper portion of the container. This lid may be used for re-closing the container for a short time after the container has been opened. Further, the lid may be secured to provide a water-resistant and air-resistant seal using various techniques described herein.

In another aspect, a container disclosed herein includes an open top end, one or more sidewalls integrally formed therewith, and a closed bottom end. The container may further include a removable lid that has a diameter slightly smaller than an internal diameter of the container, and a sealant material that may include one or more extensible flaps that may be folded onto an exposed face of the removable lid and may be removed when the container is opened. The container may include a sheet paper or a cardboard. The container may include inner and outer surfaces that are coated with a coating to resist penetration of moisture and air.

In one aspect, there is disclosed herein a process for manufacturing a paper container with a seamless liner. The process may include pre-heating the paper container inside of a tool body, and heating a liquid-proof lining material over an open end of the paper container with a heating element in the top of a tool. The liquid-proof lining material may begin to soften and sag from its own weight into the open end of the paper container as it approaches its melting point. The process may further include sealing a perimeter of an opening of the paper container by pressing a film of the liquid-proof lining material against a top edge of the paper container. The liquid-proof lining material may continue to soften and sag from its own weight into the open end of the paper container. The process may further introduce pressurized air through the top of the tool into a cavity above the container body. This may pressurize the film of the liquid-proof lining material to expand to the confines of the container body and bond to inner walls of the paper container in one seamless lining that wraps over the top edge of the paper container. The process may further separate the paper container with the seamless liquid-proof lining material from the remainder of a sheet material with a perimeter die knife that is actuated from the top cover to cut an external material at an outer edge of the paper container. The paper container may include porosities to facilitate the pressure forming operation of the seamless liner. The paper container may include porosities to facilitate a vacuum process to pull the seamless liner into intimate contact with inner surfaces of the paper container.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures:

FIG. 1A depicts an exploded view of bottle components with scarf joint top and FIG. 1B depicts a fully assembled bottle in accordance with various embodiments of the present invention.

FIG. 2A depicts an exploded view of bottle components with lap joint top and FIG. 2B depicts a fully assembled bottle in accordance with various embodiments of the present invention.

FIG. 3A depicts an exploded view of bottle components with scarf joint bottom and FIG. 3B depicts a fully assembled bottle in accordance with various embodiments of the present invention.

FIG. 4A depicts an exploded view of bottle components with lap joint bottom and FIG. 4B depicts a fully assembled bottle in accordance with various embodiments of the present invention.

FIGS. 5A and 5B depict a bottle cap with two alternative assemblies and FIG. 5C depicts a fully assembled bottle in accordance with various embodiments of the present invention.

FIG. 6A depicts an exploded view of a pull tab bottle and cap in accordance with various embodiments of the present invention.

FIG. 6B depicts a fully assembled bottle and cap in accordance with various embodiments of the present invention.

FIG. 6C depicts separation of the threaded plastic neck from the bottle and cap in accordance with various embodiments of the present invention.

FIG. 7A depicts an exploded view of the pull tab separable bottle in accordance with various embodiments of the present invention.

FIG. 7B depicts a fully assembled bottle in accordance with various embodiments of the present invention.

FIG. 7C depicts separation of the threaded plastic funnel and neck from the body of the bottle in accordance with various embodiments of the present invention.

FIG. 8 depicts a view of the bottle with an attachable structural element in accordance with various embodiments of the present invention.

FIG. 9A depicts an assembled bottle in accordance with various embodiments of the present invention.

FIG. 9B depicts a separation of the biodegradable plastic top and liner from the paper body of the bottle in accordance with various embodiments of the present invention.

FIG. 10 depicts a view of the paper bottle showing the basic components in accordance with various embodiments of the present invention.

FIG. 12A depicts the shape of the molded hinged bottle body in accordance with various embodiments of the present invention.

FIG. 12B depicts an assembled molded hinged bottle body in accordance with various embodiments of the present invention.

FIG. 13A illustrates a perspective view of a container and its associated components in accordance with various embodiments of the present invention.

FIG. 13B illustrates the cross sectional view of the container and its associated components in accordance with various embodiments of the present invention.

FIG. 13C illustrates a perspective view of the container with an elastic band in accordance with various embodiments of the present invention.

FIG. 15A depicts a perspective view the removal of a container seal in accordance with various embodiments of the present invention.

FIG. 15B illustrates a re-closable lid of a container with an internal sealing element in accordance with various embodiments of the present invention.

FIG. 15C illustrates a re-closable lid retained by a split elastic band in accordance with various embodiments of the present invention.

FIG. 15D illustrates a re-closable lid retained by a long extension elastic band in accordance with various embodiments of the present invention.

FIG. 15E illustrates a re-closable lid retained by a cone interference fit in accordance with various embodiments of the present invention.

FIG. 15F illustrates a re-closable lid retained by an elastic wedging gasket in accordance with various embodiments of the present invention.

FIG. 16A illustrates a perspective view of cone wrap container with a bead edge in accordance with various embodiments of the present invention.

FIG. 16B depicts a cross sectional view of sealing action of a container with a bead edge in accordance with various embodiments of the present invention.

FIG. 18A shows a container with an inner and outer membrane seal in accordance with various embodiments of the present invention.

FIG. 18B illustrates a container with an inner and outer membrane seal having inner seal open for access to the stored material in accordance with various embodiments of the present invention.

FIG. 18C illustrates a container with an inner and outer membrane seal showing removal of the outer seal element in accordance with various embodiments of the present invention.

FIG. 18D illustrates a container with an inner and outer molded seal in closed configuration in accordance with various embodiments of the present invention.

FIG. 18E illustrates a container with an inner and outer molded seal having the inner seal open for access to the stored material in accordance with various embodiments of the present invention.

FIG. 18F illustrates a container with an inner and outer molded seal showing removal of the outer seal element in accordance with various embodiments of the present invention.

FIG. 28A depicts an exploded bottom view of container components showing container, double action seal and cap in accordance with various embodiments of the present invention.

FIG. 28B depicts an exploded top view of container components showing container, double action seal and cap in accordance with various embodiments of the present invention.

FIG. 28C depicts a section of bottom seal construction in accordance with various embodiments of the present invention.

FIG. 28D depicts a container with inner and outer membrane seal in closed configuration in accordance with various embodiments of the present invention.

FIG. 28E depicts a container with inner and outer membrane seal having inner seal open for contents access in accordance with various embodiments of the present invention.

FIG. 28F depicts a container with inner and outer membrane seal showing removal of outer seal element in accordance with various embodiments of the present invention.

FIG. 29A depicts a perspective view of top and bottom of assembled biodegradable and compostable container.

FIG. 29B depicts an exploded view of biodegradable and compostable container showing components of cardboard tube, bottom closure, plastic liner and double action seal and cap.

FIG. 29C depicts a section of lid seal and peel away drink access seal construction.

FIG. 29D depicts a view of container being opened by the user.

FIG. 29E depicts a view of the container being temporarily closed by the user.

FIG. 30A depicts a cut away/exploded view of biodegradable and compostable container.

FIG. 30B depicts a detail cut away drawing of container top seal.

FIG. 30C depicts a detail cut away drawing of container top seal bonded joint.

FIG. 30D depicts a cut away drawing of container spiral wound lining.

FIG. 30E depicts a cut away drawing of container spiral wound lining with folded edge seam.

FIG. 30F depicts an exploded view of bottom seal and disc construction with separate components.

FIG. 30G depicts a view of bottom seal and disc construction with bonded components.

FIG. 30H depicts a section view of bottom seal prior to edge curl

FIG. 30I depicts a section view of bottom seal after the bonded edge is curled.

FIG. 31A depicts a cut away/exploded view of biodegradable and compostable container.

FIG. 31B depicts a detail cut away drawing of container top seal.

FIG. 31C depicts a cut away drawing of container spiral wound lining.

FIG. 31D depicts a detail cut away drawing of container spiral wound lining with folded edge seam.

FIG. 31E depicts an exploded view of bottom seal and disc construction with separate components.

FIG. 31F depicts a view of bottom seal and disc construction with bonded components.

FIG. 31G depicts a section view of bottom seal prior to edge curl.

FIG. 31H depicts a section view of bottom seal after the bonded edge is curled.

FIG. 32A depicts a cut away/exploded view of biodegradable and compostable container.

FIG. 32B depicts a detail cut away drawing of container top seal.

FIG. 32C depicts a detail cut away drawing of container top seal bonded joint.

FIG. 32D depicts a cut away drawing of container spiral wound lining.

FIG. 32E depicts a cut away drawing of container spiral wound lining with folded edge seam.

FIG. 32F depicts an exploded view of bottom seal and disc construction with single heavy bottom disc.

FIG. 32G depicts an exploded view of bottom seal and disc construction with two-part film and heavy disc.

FIG. 32H depicts a section view of bottom seal showing reinforcing of film closure on edge curl.

Figure 11A:
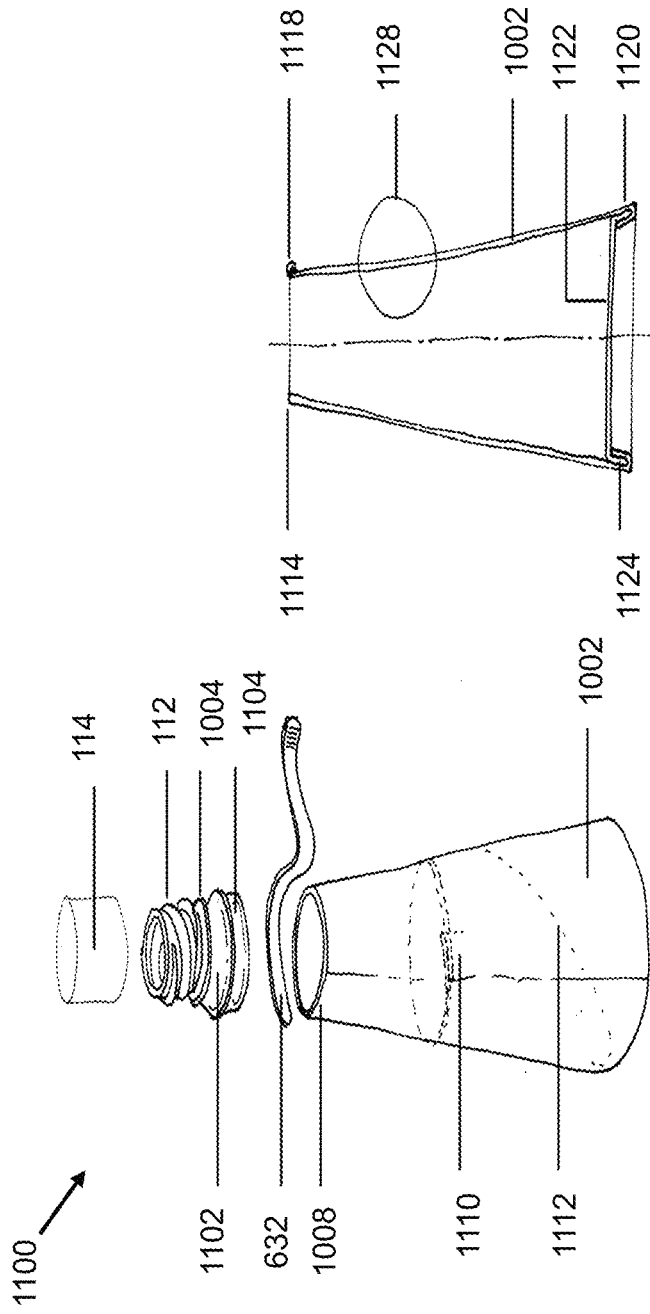
FIG. 11A depicts an exploded view of bottle components with lap joint top in accordance with various embodiments of the present invention.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

DETAILED DESCRIPTION

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms "a" or "an," as used herein, are defined as one or more than one. The term "another," as used herein, is defined as at least a second or more. The terms "including" and/or "having" as used herein, are defined as comprising (i.e., open transition). The term "coupled" or "operatively coupled," as used herein, is defined as connected, although not necessarily directly and not necessarily mechanically.

Referring to FIG. 1A, a container such as a bottle 100 for storage and transport of liquid items such as water, beverages, and the like is depicted. The entirety of the bottle 100 may be biodegradable and/or recyclable, and may include an assemblage of four primary components, each of which may be biodegradable. The body of the bottle 100 may include two parts manufactured from a paper pulp and bonded together to create a water-tight and air-tight assembly. The two parts may include a top funnel section 102 that has provision for a connection to a threaded neck and mouth component 112, and a lower cylindrical section with an integral bottom 104. It will be appreciated that the provision for connection to a threaded neck and mouth may include a variety of suitable attachment mechanisms such as a friction fit, threaded fit, tabs, slots, inserts, flaps, flanges, or the like that can be used alone or in combination to sealably attach the top funnel section 102 to a screw top, mouth piece, or other suitable top structure for a liquid container, or to otherwise secure the corresponding pieces in position during an adhesive, welding, or other attachment process. In an embodiment, the shape of the lower section may be conical. A lower edge of a wall of the top element may be thinned to create a scarf joint feature 108 that mates with a similar feature 110 on an upper edge of a wall of the lower element. These two components may be bonded with an adhesive applied to these surfaces that may then be pressed coincident to each other, thereby creating a permanent water-tight and air-tight joint 124. The inside and outside surfaces of these two paper pulp components may be coated with a thin waterproof and biodegradable coating 122, such as corn-based polylactic acid ("PLA") plastic that will degrade when exposed to extreme biodegrading influences sufficient to break the coating down into natural components. The opening to the paper pulp body of the bottle 100 may be created by a molded part that includes the threaded neck and mouth component 112. A similarly threaded screw cap assembly 114 may be provided for sealing and opening the container. In embodiments, both may be molded from a biodegradable plastic resin such as corn-derived PLA or similar biodegradable resin. The threaded neck to the bottle may include a cylindrical surface mating feature 118 that engages to a similar cylindrical surface either on an inside or on an outside of the neck of the bottle 120. These two components may be bonded together with an adhesive applied to these surfaces that may then be pressed coincident to each other, thereby creating a permanent water and air tight joint at the mouth of the bottle. The molded plastic part may provide a high-tolerance re-sealable closure for the bottle, e.g., to securely retain pressurized fluid such as carbonated drinks. The molded plastic part may also or instead provide a better mouth feel for a user than would the paper pulp used for the body of the bottle.

Referring to FIG. 1B, the finished biodegradable bottle 128 may have a range of aesthetic treatments that may convey its ability to biodegrade with either a textured or a smooth exterior surface. A scarf joint may be used to bond the two elements together to form an almost imperceptible seam line at the water-tight and air-tight joint 124.

Referring to FIG. 2A, a bottle may include a top funnel section 202 that has provision for a connection to a threaded neck and mouth component 212 and a lower cylindrical section with integral bottom 204. An inner cylindrical surface 208 of the top element may have a diameter large enough to slip over a wall of a lower cylinder 210 to create a large surface area joint feature. In an embodiment, these two components may be bonded with an adhesive applied to these surfaces that are then pressed coincident to each other, thereby creating a permanent water-tight and air-tight joint 224. Inside and outside surfaces of these two paper pulp components may be coated with a thin waterproof and biodegradable coating 222, such as corn-based PLA plastic, that may degrade when exposed to extreme biodegrading influences that are able to break the coating down into natural components. The opening to the paper pulp body of the bottle may be created by a molded part that is the threaded neck and mouth component 212 and with a similarly threaded cap 214. In embodiments, both may be molded from a biodegradable plastic resin such as corn-derived PLA or similar biodegradable resin. The threaded neck to the bottle may have a cylindrical surface mating feature 218 that engages to a similar cylindrical surface either on an inside or an outside of the neck of the bottle 220. These two components may be bonded together with an adhesive applied to these surfaces that are then pressed coincident to each other thereby creating a permanent water and air tight joint at the mouth of the bottle. The molded plastic part may provide a high tolerance re-sealable closure for the bottle and the molded plastic may create a better mouth feel for the user than would the paper pulp used for the body of the bottle.

Referring to FIG. 2B, a finished biodegradable bottle 228 may have a range of aesthetic treatments that can convey its ability to biodegrade with either a textured or a smooth exterior surface. In an embodiment, a lap joint for bonding the two elements together may form a distinctive seam line at the water-tight and air-tight joint 224.

Referring to FIG. 3A, a bottle for storage and transport of beverages may include a bottom cap section 302 that may connect to an upper cylindrical main body of a bottle 304 with an integral molded neck 320. The integral molded neck 320 may have a connection feature to bond it to a threaded spout and mouth component 312. An upper edge of a wall of the bottom cap section 302 may be thinned to create a scarf joint feature 308 that mates with a similar internal feature 310 on a lower edge of the upper cylindrical main body of the bottle 304. These two components may be bonded with an adhesive applied to these surfaces that are then pressed coincident to each other, thereby creating a permanent water-tight and air-tight joint 324. In an embodiment, inside and outside surfaces of these two paper pulp components are coated with a thin waterproof and biodegradable coating 322, such as corn-based PLA plastic, that will degrade when exposed to extreme biodegrading influences that are able to break the coating down into natural components.

An opening to the paper pulp body of the bottle may be created by a molded part that is the threaded spout and mouth component 312 and with a similarly threaded cap 314. In an embodiment, both may be molded from a biodegradable plastic resin such as corn-derived PLA or similar biodegradable resin. The threaded neck to the bottle may have a cylindrical surface mating feature 318 that engages to a similar cylindrical surface either on the inside or on the outside of the integral molded neck 320 of the bottle. These two components may be bonded together with an adhesive applied to these surfaces that are then pressed coincident to each other thereby creating a permanent water and air tight joint at the mouth of the bottle. The molded plastic part may provide a high tolerance re-sealable closure for the bottle and the molded plastic creates a better mouth feel for the user than would the paper pulp used for the body of the bottle.

Referring to FIG. 3B, a finished biodegradable bottle 328 may have a range of aesthetic treatments that may convey its ability to biodegrade with either a textured or a smooth exterior surface, and by utilizing a scarf joint for bonding the two elements together to form an imperceptible seam line at the joint water-tight and air-tight joint 324. The scarf joint may in generally including two flat planes meeting on an angle relative to the surfaces being joined, or any other similarly mated surfaces. The scarf joint may also or instead include interlocking faces that include one or more features to mechanically interconnect the two surfaces when properly aligned.

Referring to FIG. 4A, a bottle for storage and transport of beverages may include a bottom cap section 402 that may have provision for a connection to an upper cylindrical main body of the bottle 404 with integral molded neck 420 that may have a connection feature to bond it to a threaded spout and mouth component 412. An inner cylindrical surface 408 of the bottom cap section 402 may have a diameter large enough to slip over a wall of a lower cylinder 410 to create a large surface area joint feature. These two components may be joined using an adhesive or the like (e.g., by pressing coincident to one another with sufficient pressure and over sufficient time for the adhesive to cure) to form a permanent water-tight and air-tight joint 424. Inside and outside surfaces of these two paper pulp components may be coated with a thin waterproof and biodegradable coating 422, such as corn-based polylactic acid ("PLA") plastic or any other suitable material that will degrade when exposed to extreme biodegrading influences that are sufficient to break the coating down into natural components. An opening to the paper pulp body of the bottle may be created with a molded part formed of a corn-derived PLA plastic or the like that includes a threaded spout and mouth component 412. A similarly threaded cap 414, also molded from a biodegradable plastic resin such as corn-derived PLA or similar biodegradable resin, may be provided for unsealable/resealable use of the bottle. The integral molded neck 420 may have a cylindrical surface mating feature 418 that engages to a similar cylindrical surface either on an inside or on an outside of the integral molded neck 420 of the bottle. These two components may be joined using an adhesive or the like as described above to form a permanent water-tight and air-tight joint at the mouth of the bottle. A molded plastic part may provide a high tolerance re-sealable closure for the bottle. The molded plastic may also or instead create a better mouth feel for the user than would the paper pulp used for the body of the bottle.

Referring to FIG. 4B, a finished biodegradable bottle 428 may have a range of aesthetic treatments that can convey its ability to biodegrade with either a textured or a smooth exterior surface. The lap joint for bonding the two elements together may form a distinctive seam line at the water-tight and air-tight joint 424.

Referring to FIG. 5A, a construction of a cap 500 of a biodegradable bottle may utilize a paper pulp construction for enhanced aesthetic appeal by multiple methods. For example, an outer cap 502 may be molded of paper pulp with a wide range of sizes and aesthetic treatments that can convey its ability to biodegrade with either a textured or a smooth exterior surface. An inner threaded cap 504 that may mate to a threaded mouth of the bottle as described herein may be molded from a biodegradable plastic resin such as corn-derived PLA or similar biodegradable resin. In embodiments, the size of the outer cap 502 may be larger than the size of the inner threaded cap 504. The inner threaded cap 504 may be of closed construction so that the outer cap 502 does not have to resist the liquid contents of the bottle. The outer cap 502 may have an internal surface 510 that provides a mating plane for the adhesive bonding of a similar mating plane feature 508 on the inner threaded cap 504.

Referring to FIG. 5B, in another example, a larger outer cap 512 may be molded of paper pulp with a wide range of sizes and aesthetic treatments that can convey its ability to biodegrade with either a textured or a smooth exterior surface. A smaller inner threaded cap 514 that may mate to a threaded mouth of the bottle as described herein may be molded from a biodegradable plastic resin such as corn-derived PLA or similar biodegradable resin. This smaller inner threaded cap 514 may be of closed construction so that the larger outer paper pulp cap does not have to resist the liquid contents of the bottle. The larger outer cap 512 may have an internal cylindrical feature 518 that provides a slip fit cylindrical mating surface for the adhesive bonding of a similar mating cylindrical feature 520 on the molded threaded inner cap. Either component may be the larger cylinder containing the other within the mating feature. Likewise, the threads of the cap may be either male or female with the corresponding thread providing a part of the mouth of the bottle itself.

Referring to FIG. 5C, a finished biodegradable bottle 524 may have a range of aesthetic treatments that can convey its ability to biodegrade with either a textured or a smooth exterior surface. For example and without limitation, embodiments of the finished biodegradable bottle 524 and the outer cap 522 may be constructed of paper pulp, creating a distinctive look with only a joint line 528 between them. There are myriad options for the aesthetic treatment of this overall method of creating a biodegradable bottle.

Referring to FIG. 6A, the construction of a pull tab bottle and cap 600 may enable a user to separate an inner threaded cap 602, such as a molded PLA plastic inner threaded neck and cap, from the more quickly biodegradable bottle body and a larger outer cap 614. A neck 618 of the bottle may mate with the inner threaded cap 602 as described herein. The neck 618 of the bottle may be molded from a biodegradable plastic resin such as corn-derived PLA or similar biodegradable resin. The inner threaded cap 602 may be of closed construction so that the larger outer paper pulp cap 614 does not have to resist the liquid contents of the bottle. The neck 618 of the bottle may have a surface 620 that provides a mating plane for the adhesive bonding of a similar mating feature 610 on the molded threaded inner cap. The larger outer cap 614 may have an internal surface 608 that may provide a mating plane for the adhesive bonding of a similar mating plane feature 604 on the molded threaded inner cap. Both the neck 618 of the bottle and the inner threaded cap 602 may incorporate a tear band 632 around the circumference where the molded plastic has a deliberate thin wall to facilitate an easy tear zone. Connected to this tear band may be a pull tab 612 that is anchored in such a way that tension on the pull tab 612 may create a fracture of the tear band 632, and may facilitate release of the neck 618 of the bottle and of the inner threaded cap 602 from their respective assembly. Without limitation, in some embodiments the tear band may be a peel-away fastening feature.

Referring to FIG. 6B, when the inner threaded cap 602 is assembled to the outer cap, the pull tab 612 may be recessed below a rim 624 of the larger outer paper pulp cap 614 so as not to interfere with the closure of the inner threaded cap 602. When the neck 618 of the bottle is assembled to the body of the bottle, the pull tab 612 may be flush against a bottle 628 so as not to interfere with the closure of the inner threaded cap 602.

Referring to FIG. 6C, in order to release the neck 618 of the bottle from a body 622 of the bottle, a user 630 may grasp and pull firmly on the pull tab 612 thus initiating a tear at the bonded joint 620. As the tear proceeds around the circumference of the neck 618 of the bottle, it separates from the body 622 of the bottle. In order to release the inner threaded cap 602 from the larger outer paper pulp cap 614, the user 630 may grasp and pull firmly on the pull tab 612 thus initiating a tear at the bonded joint 620. As the tear proceeds around the circumference of the cap, the inner threaded cap 602 may separate from the larger outer paper pulp cap 614.

Referring to FIG. 7A, a construction of a pull tab bottle 700 enables a user 718 to separate a neck-and-funnel part 702 from a more quickly biodegradable part 704. A neck-and-funnel part 702 of the bottle 700 as described herein may be molded from a biodegradable plastic resin such as corn-derived PLA or similar biodegradable resin. The more quickly biodegradable part 704 of the bottle 700 may be molded of paper pulp over-coated with a biodegradable plastic coating as previously disclosed. The top neck and funnel of the bottle may have a surface 708 that provides a mating plane for the adhesive bonding of a similar mating feature 710 on the more quickly biodegradable part 704 of the bottle 700. The neck-and-funnel part 702 of the bottle 700 may incorporate a tear band 632 around the circumference where the molded plastic may have a deliberate thin wall to facilitate an easy tear zone. A pull tab 712 may be connected to this tear band and may anchor in such a way that tension on the pull tab 712 may create a fracture of the tear band 632. This may facilitate the release of the neck-and-funnel part 702 of the bottle 700 from the more quickly biodegradable part 704 of the bottle 700.

Referring to FIG. 7B, the neck-and-funnel part 702 of the bottle 700 may be assembled to the more quickly biodegradable part 704 of the bottle 700. In this case, the pull tab 712 may be flushed against the more quickly biodegradable part 704 of the bottle 700 so as not to interfere with handling of the bottle, and the tear band 632 may be flushed with the circumference of the more quickly biodegradable part 704 of the bottle 700.

Referring to FIG. 7C, in order to release the neck and top funnel top 702 of the bottle from the more quickly biodegradable part 704 of the bottle 700, the user 718 may grasp and pull firmly on the pull tab 712. This may eventually initiate a tear at the bonded joint 714 and as the tear proceeds around the circumference of the bottle 700, the neck-and-funnel part 702 may separate from the more quickly biodegradable part 704 of the bottle.

Referring to FIG. 8, a bottle for storage and transport of beverages is depicted, where the entirety of the bottle is biodegradable. The body of the bottle may include two parts manufactured from biodegradable plastic and bonded together to create a water-tight and air-tight assembly. The two parts may include a top funnel section 802 that may have a molded neck and mouth component and a lower body section 804. The top funnel section 802 and lower body section 804 may be made from a biodegradable plastic, such as corn-based PLA plastic, paper pulp, or any biodegradable material that may degrade when exposed to extreme biodegrading influences that are able to break the coating down into natural components. An opening to the top funnel section 802 of the bottle may be threaded to mate with a similarly threaded cap (not shown). The top funnel section 802 may be made from a thicker biodegradable material than the lower body section 804. In an embodiment, the lower body section 804 may not be able to support the weight of the contents by itself. In order to support the contents, the lower body section 804 may be placed into a structural component 808. The structural component 808 may be made from cardboard, fiberboard, thicker biodegradable plastic or resin, and the like. The user may remove the structural component 808 for recycling. The structural component 808 may be held on to the lower body section 804 by an adhesive, a mechanical fastener, and the like.

Referring to FIG. 9A, a construction of a biodegradable, separable, and composite bottle 900 may enable a user 914 to separate a top-neck-and-liner 902 from a more quickly biodegradable part 904. The top-neck-and-liner 902 may be blow molded from a thicker section of biodegradable plastic resin such as corn-derived PLA, polyethylene terephthalate ("PET") or similar biodegradable resin while a contiguous lower body 912 of the composite bottle 900 may be of a thin wall that permits economy of material. The more quickly biodegradable part 904, which in some embodiments may include a paper tube or other structural material that gives strength to the overall assembly, supports the contiguous lower body 912. Although, as depicted, the more quickly biodegradable part 904 may be cylindrical, it will be appreciated that the more quickly biodegradable part 904 may be shaped in a variety of ways. A top closure 908 may be any of a number of conventional closure mechanisms including a screw top closure, a snap top closure, a friction closure, an operable closure, and the like. The blow molded plastic portion of the bottle may incorporate a tear band 910 around the circumference where it is joined to the more quickly biodegradable part 904 that bonds the two components together and allows their separation when the bottle is to be recycled or composted.

In FIG. 9B, contents of the bottle may have been exhausted and the user 914 may wish to recycle or compost the empty bottle. In this case, the user 914 may separate the plastic portion of the bottle 902/908/912 from the more quickly biodegradable part 904. This may be accomplished by grasping a pull tab 918 of the tear band 910 that bonds the two components together and by exerting force on the pull tab 918. The tear band 910 may release the two components so that they can follow separate recycling or composting paths best suited to each of the two particular materials.

Referring to FIG. 10, a bottle for storage and transport of beverages may include the entirety of the bottle being biodegradable and includes an assemblage of four primary components each of which may be biodegradable. A body 1002 of the bottle may be manufactured in a way similar to paper cups and may include two parts manufactured from coated paper stock and bonded together to create a water and air tight bottle body. The body 1002, which in some embodiments may include a wrapped paper funnel, may be bonded to the threaded screw cap assembly 114 that may be molded of a biodegradable plastic such as PLA. The threaded screw cap assembly 114 may have a circumferential collar 1004 that may provide an industry standard indexing feature so that the bottle may be handled by standard bottle handling and filling equipment. The plastic screw cap assembly may be fastened to a neck 1008 of the body 1002 to create a watertight seal with the tear band 632. This may permit a user to disassociate the two elements so that the paper body may be recycled and the biodegradable plastic screw cap may be composted.

Referring to FIG. 11A, a bottle for storage and transport of beverages may include the entirety of the bottle being biodegradable and includes an assemblage of four primary components 1100 each of which may be biodegradable. The body of the bottle 1002 may be manufactured in a way similar to paper cups and may include two parts manufactured from coated paper stock and bonded together to create a water and air tight bottle body. The body 1002 may be bonded to a screw cap assembly 112/114 that may be molded of a biodegradable plastic such as PLA. The plastic screw cap assembly 112/114 may be fastened to the neck 1008 of the body 1002 to create a watertight seal with the tear band 632 that may permit the user to disassociate the two elements so that the paper body may be recycled and the biodegradable plastic screw cap may be composted. A molded biodegradable neck and closure of the bottle 1102 may have an interlocking feature 1104 that engages the neck 1008 of the bottle. This may provide a waterproof seal that may be locked together by the tear band 632. The molded biodegradable neck and closure of the bottle 1102 may feature the circumferential collar 1004 that may provide an industry standard indexing feature so that the bottle may be handled by standard bottle handling and filling equipment. The construction of the paper bottle may be accomplished by industry standard manufacturing techniques and may be created as a single wrap of paper with a lap joint 1110. The plastic coating may be sealed to itself to create a waterproof joint or by a spiral wrap 1112 providing a larger area of overlap with a similar waterproof seal created.

Figure 11B:
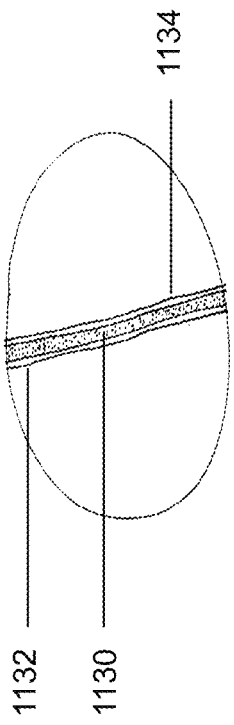
FIG. 11B depicts a cross section of the bottle showing wall construction in accordance with various embodiments of the present invention.

Referring to FIG. 11B, the construction of the body 1002 of the water bottle may be similar to an inverted paper cup. In the inverted paper cup, an open end may be formed to accept the plastic screw cap assembly that may be accomplished with a simple open edge to a paper body 1114, or it may include a rolled feature 1118 that provides a mechanical connection for the peel-away fastening feature. A bottom 1122 of the bottle may be created by a separate paper element. Inside and outside surfaces of the paper element may be coated with a very thin waterproof and biodegradable coating, such as corn-based PLA plastic, that may degrade when exposed to extreme biodegrading influences that are able to break the coating down into natural components. It may be bonded to a wrapped body 1120 of the bottle by a double fold closure 1124 that may be thermally sealed so that the plastic coating melts to provide a watertight seal or may be bonded by another method with adhesive, ultrasonically welded, or other method. The detail of a material 1128 of the sidewall and bottom element of the body of the bottle may be shown in FIG. 11C.

Figure 11C:
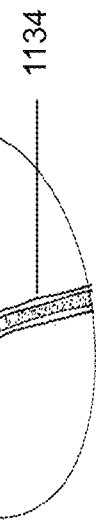
FIG. 11C depicts details of the wall material in accordance with various embodiments of the present invention.

Referring to FIG. 11C, the paper material of a bottle body 1130 may be coated with a very thin waterproof and biodegradable coating 1132, such as corn-based PLA plastic, that will degrade when exposed to extreme biodegrading influences that are able to break the coating down into natural components. The waterproof and biodegradable coating 1132 may be applied to the paper on the inside of the bottle where it will resist the degradation of the paper by the liquid contents and may also be applied to an outside 1134 to resist the weather if the makeup of the paper material is not adequate in its own right.

Referring to FIG. 12A, a shape of a molded hinged bottle body 1200 is depicted. A bottle may be manufactured to contain beverages for storage and transport. The entirety of the bottle assembly may be biodegradable or recyclable. The manufacturing process may include molding of the bottle body as an open, hinged, paper-pulp part 1202 that may be recyclable. The open, hinged, paper-pulp part 1202 may be molded to have a single hinge 1210 with integral sides and bottom surface 1212 and that doubles over on itself to create the closed bottle. The open, hinged, paper-pulp part 1202 may be provided with a waterproof flange 1208 that may be bonded along both sides at the time of assembly. The inside surface may have a pre-laminated thin waterproof and biodegradable coating 1204, such as corn-based PLA plastic, that will degrade when exposed to extreme biodegrading influences that are able to break the coating down into natural components that protects the paper product from the contained liquid. The coating may be thermally bonded at the waterproof flange 1208 to create a waterproof seal of the joint. A mouth 1214 of the bottle may receive the plastic screw cap assembly.

Referring to FIG. 12B, an assembled molded hinged bottle body is depicted. Here, the paper-pulp part 1202 is shown doubled over on itself to create the closed bottle. The paper-pulp part 1202 may be bonded to a screw cap assembly 112/114 that may be molded of a biodegradable plastic such as PLA. The plastic screw cap assembly 112/114 may be fastened to the mouth 1214 of the bottle body to create a watertight seal with the tear band 632. This may permit the user to disassociate the two elements so that the paper body can be recycled and the biodegradable plastic screw cap can be composted. The molded biodegradable neck and closure of the bottle 1102 may have the interlocking feature 1104 that may engage the mouth 1214 of the bottle. The molded biodegradable neck and closure of the bottle 1102 may be detailed to provide a waterproof seal that may be locked together by the tear band 632. The molded biodegradable neck and closure of the bottle 1102 may feature the circumferential collar 1004 that may provide an industry standard indexing feature so that the bottle may be handled by standard bottle handling and filling equipment. The construction of the paper bottle may retain the waterproof flange 1208 (as depicted), or secondary processing may remove the external portion of the flange to make it invisible. Likewise, the biodegradable and/or recyclable material may be used for constructing other containers such as a flask, a glass, a cup, a tube and the like.

Referring to FIGS. 13A, 13B, and 13C, a container 1300 and its associated components, which are biodegradable and/or recyclable are illustrated. The container 1300 may include a body 1302, a lid 1304, a membrane 1308, an inside surface 1310 of the container 1300, a top edge 1312 of the container 1300, an inner surface 1314 of the lid 1304, a flap 1318 located on the edge of the membrane 1308, an elastic band 1320, a split 1322 in the elastic band, a flap 1324 of the elastic band 1320, a separation point 1328 over the top surface of the lid 1304, an outside surface 1330 of the container 1300, a bottom part 1332 of the container 1300, a double round joint 1334, a bottom flange 1338, an external side wall 1340 of the container 1300, an external flange 1342 of the container 1300, a middle portion 1344 of the elastic band 1320, an upper portion 1344 of the elastic band 1320, and the like. In embodiments, the separation point 1328 may be a low-stress separation point. In embodiments, one or more associated components may be constructed form a biodegradable and/or recyclable without deviating from the scope of the invention.

In embodiments, the container 1300 may be used for storing liquids and semi-solids such as water, beverages, oil based creams, lotions, food items, and the like. In embodiments, the container 1300 may be biodegradable and/or recyclable. Referring to FIG. 13A, the body 1302 of the container 1300 may be manufactured using a paper pulp material. The paper pulp material may be derived from recyclable paper, cardboard, waste paper, sheet paper, and the like. This paper pulp material may be treated with a biodegradable plastic resin coating on the inside surface 1310 and the outside surface 1330 of the container 1300. This coating may be polylactic acid ("PLA") resin, high amylase corn starch based resins, oxo-PET or any other biodegradable modified plastic resins, etc. The paper pulp material may be treated with the plastic resin coating to prevent its degradation from air and moisture. Additionally, the container 1300 may degrade into compost when exposed to biodegrading influences.

In embodiments, the container 1300 may be sealed and the contents may be protected from exposure to the external environment by the membrane 1308. The membrane 1308 may be adhered to the top edge 1312 of the container 1300 that may be removed by taking hold of the flap 1318 and pulling to break the perimeter seal. In embodiments, the lid 1304 may be a slip fit lid that slides onto the upper portion of the container 1300. This lid 1304 may be used for short-term closure, once the container 1300 has been opened.

FIG. 13B depicts the cross sectional view of a container 1300 and its associated components. Referring to FIG. 13B, a bottom part 1332 of the container 1300 is shown. In embodiments, the bottom part 1332 may also be formed using a paper pulp material such as recyclable paper, cardboard, waste paper, sheet paper, and the like. This paper pulp material may be treated with a biodegradable plastic resin coating. This coating may be polylactic acid ("PLA") resin, high amylase corn starch based resins, oxo-PET or any other biodegradable modified plastic resin. In embodiments, the paper pulp material may be protected from air and moisture by the biodegradable plastic resin coating.

In embodiments, the plastic coating may be molded onto the sidewall of the container 1300 that may create a double round joint 1334. This double round joint 1334 along with the bottom part 1332 of the container 1300 may form a bottom flange 1338. Alternatively, the bottom part 1332 material may be formed into an external flange 1342 around the external side wall 1340 of the container 1300. In embodiments, the bottom part 1332 material may be fixed using thermal sealing, biodegradable/recyclable adhesive or any other fixing material to create a water tight seal. In embodiments, upon filling the content the container 1300 along with its components may be sealed by a membrane 1308. The membrane 1308 may also be formed using a paper pulp material such as sheet paper or cardboard. The membrane 1308 may be protected from air and moisture by a biodegradable plastic resin coating on the inside 1310 and outside 1330 of the container 1300. Alternatively, the membrane 1308 may be of aluminum or any other air tight material that may be recycled.

Referring to FIG. 13C, a container 1300 with an elastic band 1320 is shown. In embodiments, the container 1300 once opened may be re-closed for a short tenure by a lid 1304. This lid 1304 may slide onto the upper portion of the container 1300, thereby providing closure to the container 1300. In the process of re-closing the container 1300, the top edge 1312 of the container 1300 may contact the inner surface 1314 of the lid 1304. Such a contact may provide a water resistant seal to the container 1300, when light pressure is applied. In embodiments, this light pressure may be applied on the lid 1304 by a providing a split 1322 on the elastic band 1320 around the perimeter of the container 1300, as shown in FIG. 13A. The upper portion 1344 of this elastic band 1320 may be taken hold by the flap 1324. The flap 1324 may enable a user to pull and further lift the upper portion 1344 of the elastic band 1320 from the separation point 1328, thereby providing the downward light pressure on the lid 1304. A middle portion 1348 of the elastic band 1320 may remain around the body of the container 1300 and keep the elastic band 1320 in place.

Figure 14A:
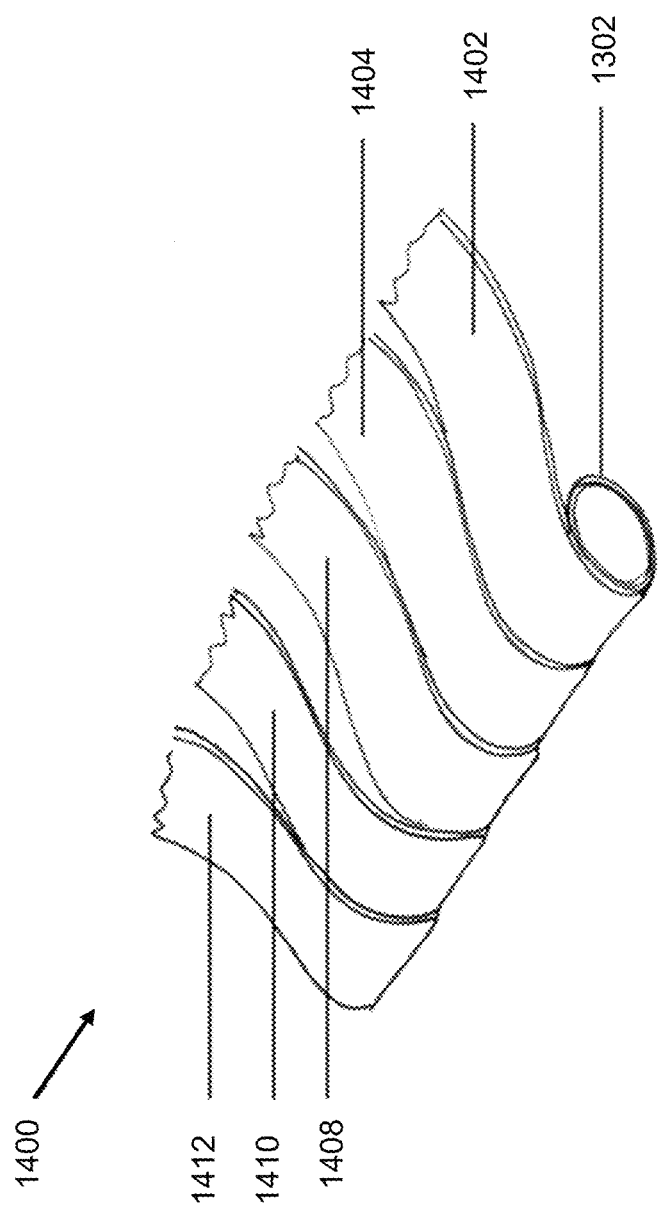
FIG. 14A depicts a spiral wrap tube body of a container made up of paper pulp material with a plastic coating in accordance with various embodiments of the present invention.

FIG. 14A depicts a spiral winding element 1400 made up of a paper pulp material with a plastic coating. In embodiments, the body 1302 of the container 1300 may be manufactured in the form of the spiral winding 1400, thereby retaining the shape of a cylindrical tube. This winding process may start with an inner winding of one layer 1402 or inner winding of more than one layer 1404. Such inner layer windings may further protect the outer pulp paper material from air and moisture. This winding material may be polylactic acid ("PLA") resin, high amylase corn starch based resins, or oxo-PET or any other biodegradable modified plastic resins, and the like.

In embodiments, optional winding layers 1408 may be formed using paper pulp material such as sheet paper or cardboard of a composition that may be recyclable and biodegradable. Further, these optional winding layers 1408 may be followed by an outer winding layer 1410 of a biodegradable plastic resin sheet material that protects the inner winding and optional winding layers 1408 from air and moisture. This sheet material may be polylactic acid ("PLA") resin, high amylase cornstarch based resins or oxo-PET or other biodegradable modified plastic resins, and the like. In embodiments, an optional outer layer 1412 may be laid upon it as a decorative sheet. This decorative sheet may be formed from a paper pulp material that is printable using biodegradable/recyclable printing material such as soy based inks.

Figure 14B:
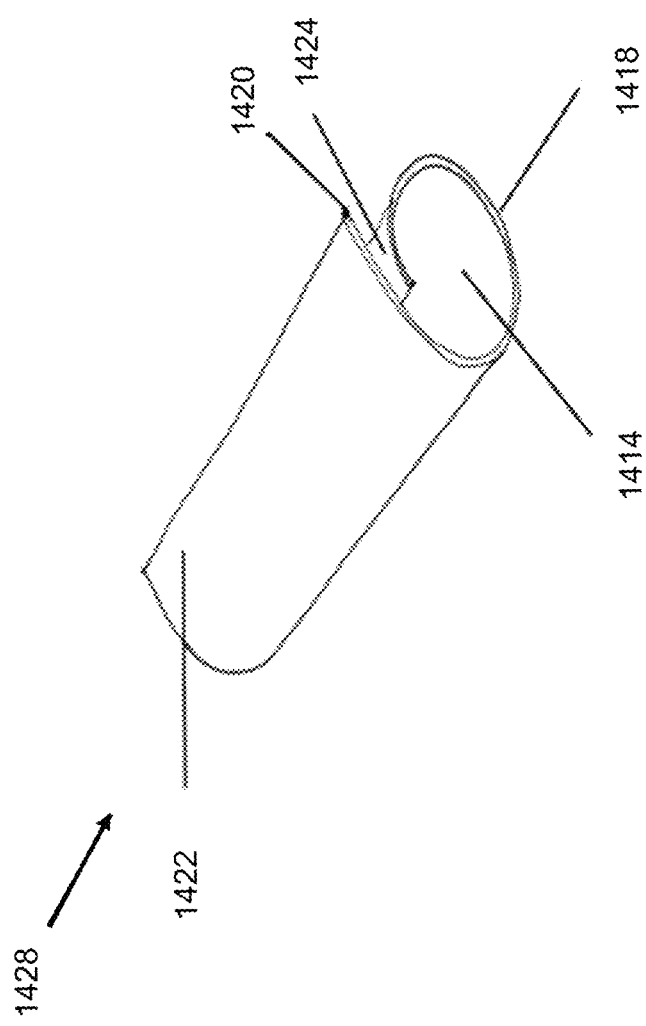
FIG. 14B depicts a round joint wrap tube body of a container made up of paper pulp material with a biodegradable plastic coating in accordance with various embodiments of the present invention.

FIG. 14B depicts a round joint wrap tube 1428 being formed into the body 1302 of the container 1300. In embodiments, the round joint wrap tube 1428 may be made up of paper pulp material with a plastic coating and may include one or more layers bonded together by thermal sealing; biodegradable, recyclable adhesives; or the like. In embodiments, the biodegradable plastic resin coating may include one or more inner layers 1414. There may be subsequent multiple layers 1418 to protect the container 1300 from air and moisture. In embodiments, the subsequent multiple layers 1418 may be optionally followed by an outer layer 1420 made up of a biodegradable plastic resin sheet material that may protect the inner paper layers from the air and moisture of the environment. In embodiments, an optional outer layer 1422 may be laid upon it as a decorative sheet. The decorative sheet may be formed from a paper pulp material that may be printable using biodegradable/recyclable printing material such as soy based inks. This sheet material may be laid upon a conical or cylindrical shape with an overlapping joint area 1424. This overlapping joint area 1424 may be sealed in a waterproof joint via thermal sealing, biodegradable/recyclable adhesives or other methods. The resulting container 1300 may be protected from moisture by a biodegradable plastic resin coating on the container 1300.

FIG. 15A depicts the removal of a container seal 1500. The body 1302 of the container 1300 may be manufactured from a paper pulp material that may be protected from air and moisture by a biodegradable plastic resin coating on the container 1300. The container 1300 may be sealed and the contents within may be protected from the environment by a membrane 1308. The membrane 1308 may be located along a perimeter 1502 of the container 1300 and may be adhered to the top edge 1312 of the container 1300 by taking hold of a flap 1318 and pulling to break the perimeter 1502 seal.

FIG. 15B illustrates a lid 1304 of a container 1300 with an internal sealing element. In embodiments, a lid 1304 may slide onto the upper portion of the container 1300. In some embodiments, the lid 1304 may be re-closable. This lid 1304 may be used for short-term closure, once the container 1300 has been opened. In the process of re-closing the container 1300, the top edge 1312 of the container 1300 may contact the inner surface 1314 of the lid 1304. Such a contact may provide a water resistant seal to the container 1300, when light pressure is applied.

FIG. 15C illustrates a lid 1304 retained by a split 1322 elastic band 1320. In embodiments, the container 1300 once opened may be re-closed for a short tenure by the lid 1304. This lid 1304 may slide onto the upper portion of the container 1300, thereby providing closure to the container 1300. In the process of re-closing the container 1300, the top edge 1312 of the container 1300 may contact the inner surface 1314 of the lid 1304. Such a contact may provide a water resistant seal to the container 1300, when light pressure is applied. In embodiments, light pressure may be applied on the lid 1304 by providing the split 1322 on the elastic band 1320 around the perimeter of the container 1300, as shown in FIG. 13A and FIG. 13C. A flap 1324 may hold the upper portion 1344 of this elastic band 1320. The flap 1324 may enable a user to pull and further lift the upper portion 1344 of the elastic band 1320 from a separation point 1328, thereby providing the downward light pressure on the lid 1304. The middle portion 1348 of the elastic band 1320 may remain around the body of the container and hence keep the elastic band 1320 in place.

FIG. 15D illustrates a lid 1304 retained by an elastic band 1320. In embodiments, the elastic band 1320 may be removed by the user to encircle the long axis of the container 1300 from under a base 1504 of the container 1300 to an upper surface 1508 of the lid 1304. As a result, the stretched band may provide downward pressure on the lid 1304, thereby keeping the lid closed for a short tenure.

FIG. 15E illustrates a lid 1304 retained on the container 1300 by a cone interference fit. In embodiments, the lid 1304 may provide a cover to the container 1300 that has a conical portion 1510. In embodiments, the lid 1304 may be inverted for a short tenure closure of the container 1300. In such a scenario, an inverted portion 1512 of the lid 1304 may have the conical portion 1510 as the bottom of the lid 1304. Further, this conical portion 1510 of the lid 1304 may be pushed firmly into a tight interference fit within an internal diameter 1514 of the container 1300. In an embodiment, the diameter of the lid 1304 may be smaller than the internal diameter 1514 of the container 1300. For example, the container 1300 and the lid 1304 may, when the lid 1304 is inverted, appear as a cork fitted in a bottle and may provide a water resistant seal.

FIG. 15F illustrates a lid 1304, inverted, retained by a wedging gasket 1518 of the elastic band 1320. In embodiments, the top portion of the container 1300 may have an elastic band 1320 with a gasket as the cylindrical surface mating features 318. In embodiments, the wedging gasket 1518 may have a downward lip portion with a flare. In embodiments, the elastic band 1320 may have the wedging gasket 1518, and may allow the lid 1304 to be pushed firmly into a firm interference fit within the internal diameter 1514 of the container 1300.

FIG. 16A illustrates a view 1600 of a container 1300 shaped as a cone. The body 1302 of the container 1300 may be manufactured from a paper pulp material that may be protected from moisture by a biodegradable plastic resin coating on the inside 1310 and outside 1330 of the container 1300. The container 1300 may be sealed and the contents may be protected from the environment by a membrane 1308 and adhered to the top edge 1312 of the container 1300. In addition, a lid 1304 adapted to provide an interference fit may be used for closing the container 1300 for a short tenure, once the container 1300 has been opened. The resulting container 1300 assembly may be recycled or biodegraded.

FIG. 16B depicts a cross sectional view of sealing action of a container 1300 with a bead edge. As shown in FIG. 16B, the lid 1304 once opened, may slide onto a rolled edge 1602 of the container 1300. As the rolled edge 1602 of the container 1300 may contact a downward facing flange 1604 of the lid 1304, it may compress along with the lid 1304. The assembly together may make for a watertight seal against the lid 1304.

Figure 16D:
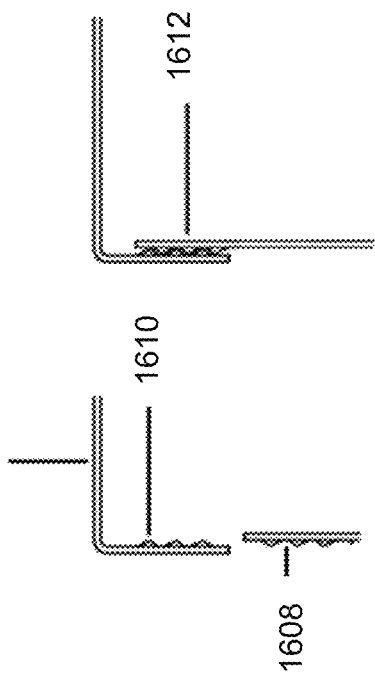
FIG. 16D depicts a cross sectional view of sealing action of a container with a corrugated edge seal in accordance with various embodiments of the present invention.
Figure 16C:
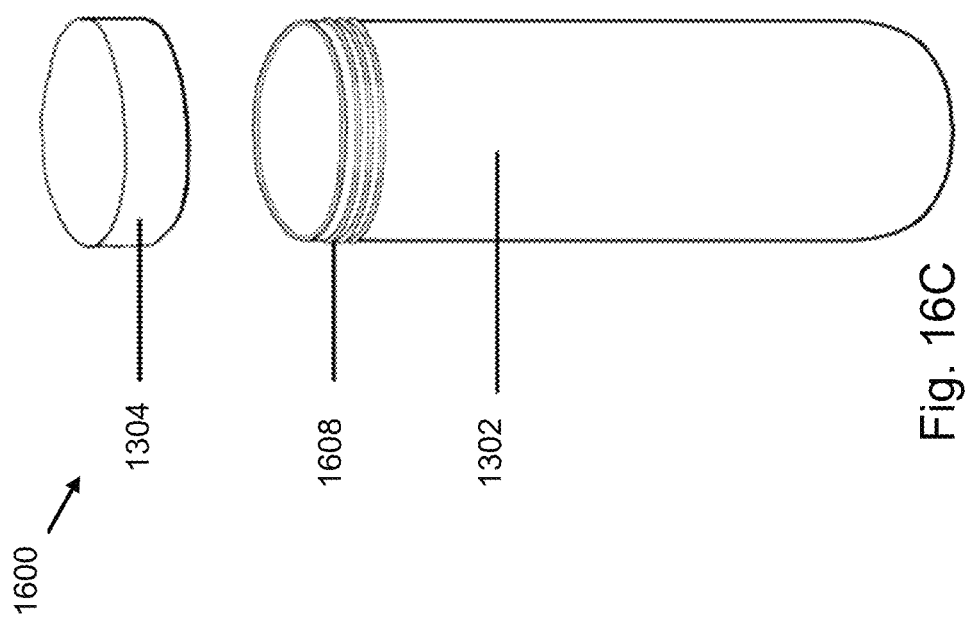
FIG. 16C illustrates a perspective view of the container with a corrugated edge seal in accordance with various embodiments of the present invention.

FIGS. 16C and 16D illustrate a container 1300 with a seal that includes corrugated ridges 1608 seal and a cross section of the sealing action of the container 1300 with the corrugated ridges 1608. In embodiments, the perimeter of the top edge 1312 of the container 1300 may have corrugated ridges 1608 that include a paper corrugated surface on the circumference with a plurality of corrugated ridges of coated paper material. The corrugated ridges 1608 may be used by the lid 1304 when the lid 1304 may be fitted to the container 1300. Now referring to FIG. 16D, the perimeter of the top edge 1312 of the container 1300 may have corrugated ridges 1608 on the circumference with a plurality of corrugated ridges of coated paper material. Similarly, the inside of the lid 1304 may have additional corrugated ridges 1610 such that when the lid 1304 and the container 1300 may be brought together the corrugated ridges 1608 and the additional corrugated ridges 1610 deflect and interlock 1612 to provide a water resistant seal.

Figures 17A, 17B:
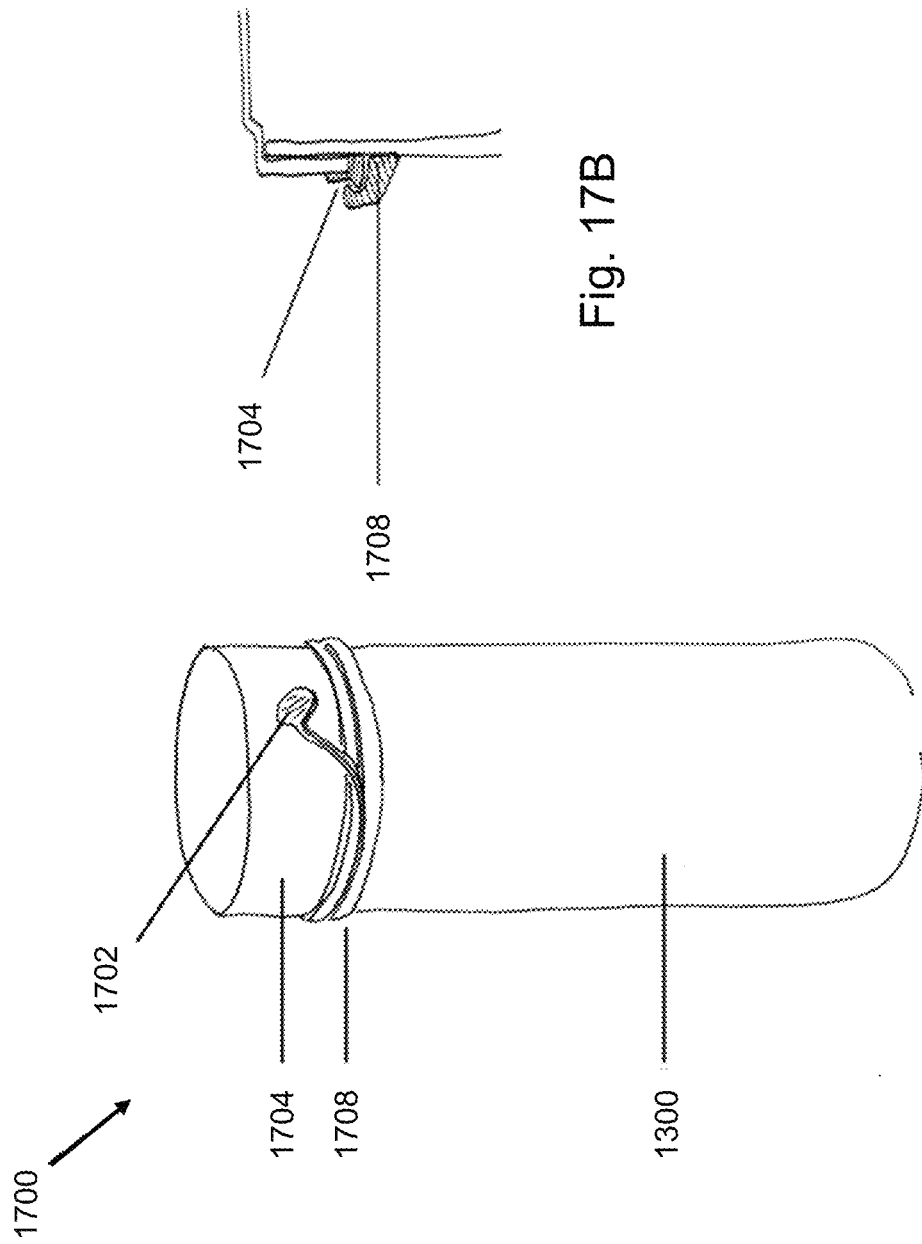
FIG. 17A illustrates a container with peel strip outer seal in accordance with various embodiments of the present invention.
FIG. 17B depicts a cross sectional view of a re-sealable feature in accordance with various embodiments of the present invention.

FIG. 17A illustrates a view 1700 of the container 1300 with a peel strip outer seal. In embodiments, the lid 1304 may be fixed with the container 1300 once the contents are placed inside the container 1300. In embodiments, after placing the contents, an elastic band 1320 may seal the container 1300. In embodiments, the elastic band 1320 may be recyclable or biodegradable. As shown in FIG. 17A, the elastic band 1320 may have a peel strip. Further, the elastic band 1320 may have a flap 1702 that may separate the elastic band 1320 into an upper lid band 1704 and a lower container band 1708, once the container 1300 is opened. In embodiments, the flap 1702 may be a pull flap that permits the user to apply pressure on the peel strip to rip the material and may cause it to disengage for further recycling.

FIG. 17B depicts a cross sectional view of a re-sealable feature. In embodiments, the container 1300 may be temporarily re-closed. The lid 1304 may be refitted to the upper portion of the container 1300. Further, the pressure on the lid 1304 may cause the upper lid band 1704 to engage in a deformation/interference fit with the lower container band 1708 that may further provide a water resistant seal.

FIG. 18A shows an assembly 1800 having a container 1300 with an outer 1802 and inner 1804 sealing membrane. The container 1300 may be sealed and the contents protected from the environment by a two-stage access system. Such a system may include a smaller sealing membrane 1804. The smaller sealing membrane 1804 may be placed upon the larger sealing membrane 1802. In embodiments, the larger sealing membrane 1802 may be adhered to the top edge 1312 of the container 1300. In addition, the larger sealing membrane 1802 may be removed by taking hold of the flap 1318 positioned on the edge. Further, the larger sealing membrane 1802 may be pulled off to break the seal.

As described previously, the larger sealing membrane 1802 may contain a smaller sealing membrane 1804 within it. To this end, the smaller sealing membrane 1804 may provide a cover to a plurality of apertures present on the container 1300. The content placed inside the container 1300 may be accessed using these apertures.

In embodiments, the smaller sealing membrane 1804 may be reused and may be hinged to the larger sealing membrane 1802 via a permanently bonded base 1808 may be attached to the larger sealing membrane 1802 using thermal sealing, biodegradable/recyclable adhesive, or the like.

FIG. 18B illustrates a container 1300 with an outer 1802 and inner 1804 membrane sealing with the inner sealing 1804 open for the access of the stored material. As shown in FIG. 18B, a user 1810 may access the stored contents of the container 1300 by lifting and breaking the seal of the smaller sealing membrane 1804 that may reveal an access opening 1812. The access opening 1812 may facilitate access to the contents of the container 1300. In embodiments, the perimeter of the smaller sealing membrane 1804 may have a reusable adhesive access door further facilitating the small inner sealing 1804 to provide a water resistant seal.

FIG. 18C illustrates a container 1300 with an outer 1802 and inner 1804 membrane sealing showing removal of the outer 1802 seal element. In embodiments, the user 1810 may remove the larger sealing membrane 1802 from the top edge of the container 1300 by pulling on the flap 1318 at the edge. Both the larger 1802 and smaller 1804 membrane seals may be composed of a paper pulp material such as sheet paper or cardboard that may be protected from moisture by a biodegradable plastic resin coating on the inside and outside of the sheet material. This coating may be a material such as polylactic acid ("PLA") resin, high amylase cornstarch based resins or oxo-PET or other biodegradable modified plastic resins. Alternatively, the container 1300 seal may be made up of aluminum or other air tight material that may be easily recycled.

FIG. 18D illustrates a container 1300 with an outer 1802 and inner 1804 sealing in closed configuration. The outer sealing 1802 may include the smaller sealing membrane 1804 that is a hinged re-sealable access door. This closure assembly may be molded from recyclable resin such as oxo-PET.

FIG. 18E illustrates a container 1300 with an outer 1802 and an inner 1804 sealing with the inner sealing 1804 open for access to the stored material. In embodiments, the larger sealing membrane 1802 may have a hinge 1842 across the smaller sealing membrane 1804 that may cover an access aperture 1822 to the contents of the container 1300. In embodiments, the smaller sealing membrane 1804 may include a re-sealable access door, which may be reused and may have an interference flexible plug closure 1820 that may engage and fill the re-sealable access door. In embodiments, the re-sealable access door may be hinged to the larger sealing membrane 1802 via a permanently bonded base 1824 attached by thermal sealing, biodegradable/recyclable adhesive, or the like.

FIG. 18F illustrates a container 1300 with an outer 1802 and inner 1804 sealing showing removal of the larger sealing membrane 1802 element. In embodiments, the user 1810 may have complete access to the contents without the need to reseal. In such a scenario, the larger sealing membrane 1802 may be removed permanently from the top edge 1312 of the container 1300 by the flap 1318 positioned at the edge.

Figure 19:
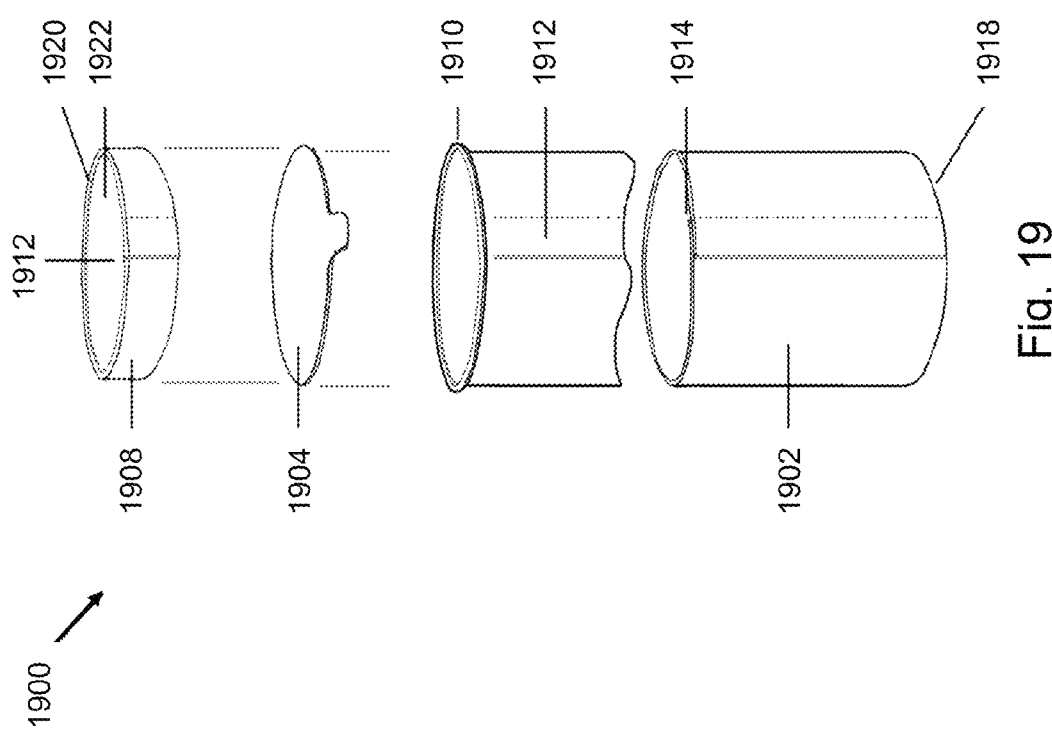
FIG. 19 depicts an exploded view of the container construction showing container, seal and cap in accordance with various embodiments of the present invention.

FIG. 19 illustrates an exploded view of the container construction. The paper containers have long been used for packaging dry goods and, more recently, liquids. A standard paper container construction may include a container body 1902, an applied safety and liquid proof seal 1904 and a secondary cap 1908 for re-closure after opening. This construction of the container body 1902 often employs a cylinder or cone created from a sheet of paper coated with a waterproof membrane, such as plastic, with a lap joint 1912 that is bonded thermally or with adhesive. This joint may expose a cut edge 1914 of the sheet of paper. The waterproof membrane may not protect the cut edge and liquid may wick into the paper stock, thereby causing weakening that may eventually rupture as a leak in the container. A paper container needs a stiffening feature at the open end such as a rolled edge 1910 that also provides a bond for the liquid proof seal 1904 that is bonded to this surface. A bottom surface 1918 may be formed by a number of methods and is a critical joint for liquid retention. A secondary lid often utilizes the same construction as the container with the lap joint 1912 and an internal rolled edge 1920 that secures a paper end plate 1922 bonded to the rolled edge or inserted with a friction fit. This cap construction is very difficult to make liquid-tight as the bonding surfaces are of minimal surface contact. All of these constructions will work for liquid containment if they are fitted with a seamless liner as is herein described.

Figure 20:
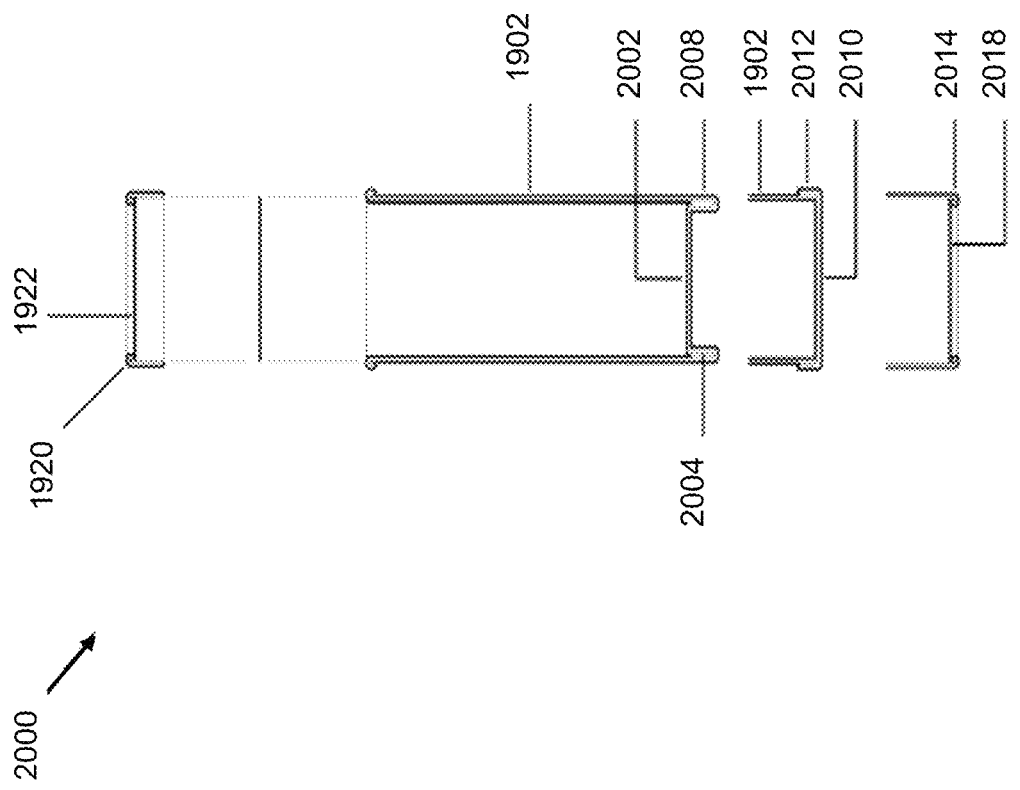
FIG. 20 depicts a cross-section of container components showing typical joints of the construction in accordance with various embodiments of the present invention.

Referring to FIG. 20, a cross section of a typical container demonstrates the multiple seams where leakage may occur in a paper container 2000. The container body 1902 may have a liquid tight bottom and this seam may be critical to the liquid carrying ability. One construction may utilize a paper disc 2002 with a downturned edge 2004 that may be captured by an upturned edge 2008 of the body cylinder to create a double lap joint. This is a favored construction for drink cups but must be executed perfectly to assure a liquid tight seal.

Another common construction may utilize a bottom paper disc 2010 with an upturned edge 2012 that is bonded to the cylinder wall on the outside surface creating a single lap joint. This seam has a more direct leak path than the double lap joint. Another common construction seldom used for liquid containment may utilize an inward rolled edge 2014 with an inserted flat paper disc 2018 that can be glued, but is often a friction fit. This has very little liquid retention capability. All of these constructions will work for liquid containment if they are fitted with a seamless liner as is herein described. A secondary lid often utilizes the same construction as the container with the lap joint 1912 and the internal rolled edge 1920 that secures the paper end plate 1922 bonded to the rolled edge or inserted with a friction fit. This cap construction is very difficult to make liquid tight as the bonding surfaces are of minimal surface contact; however, they may be made liquid tight with a seamless liner.

Figure 21:
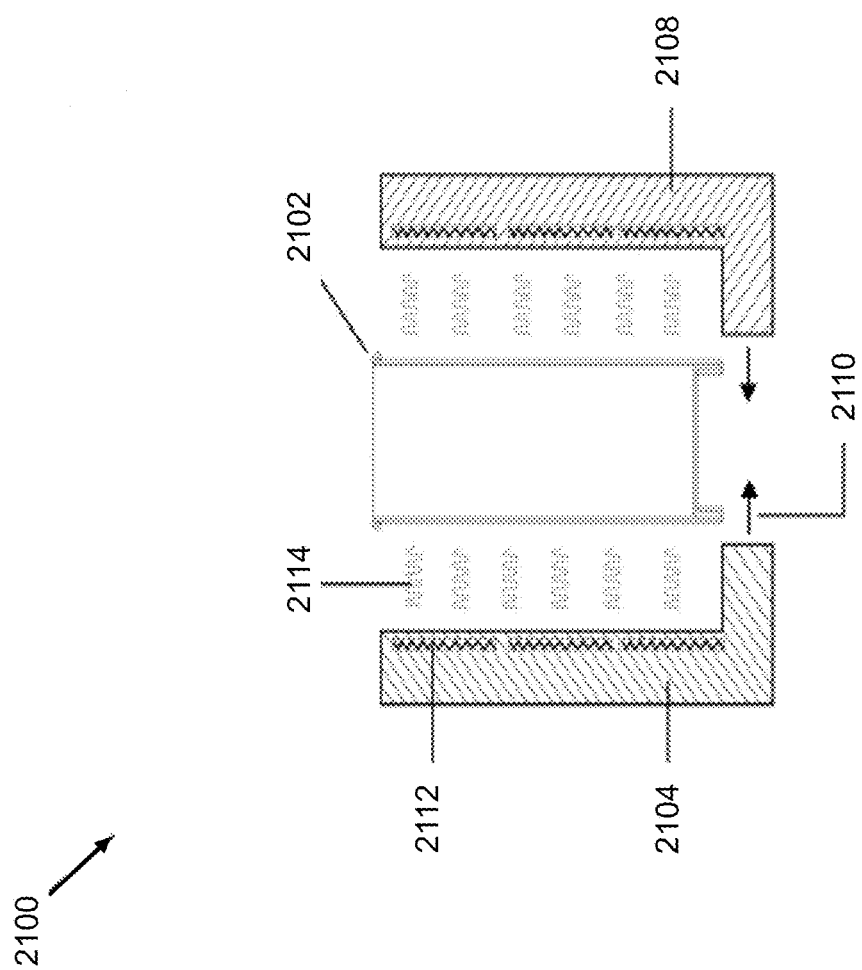
FIG. 21 depicts a section of a tool and a container showing the first step of thermal and pressure forming of the container lining in accordance with various embodiments of the present invention.

Referring to FIG. 21, step one of the seamless liner manufacturing process 2100 is depicted. Paper containers made by common manufacturing methods that are normally unsuited to containing liquids may be made liquid-tight by applying a seamless internal membrane as described herein. This may be highly advantageous as paper products may be both recycled into the paper pulp reprocessing stream and composted into soil nutrients when the appropriate biodegradable plant based resins are used for the seamless liner. Any paper container 2102, such as and without limitation a standard manufactured paper container, may have a seamless liner applied by a thermal and pressure forming operation as described herein. The standard manufactured paper container may be inserted into a tool body that comprises two operable halves 2104, 2108 that close 2110 to envelope the container body or may also be a single non-operable cavity into which the container body may be inserted from the open end. Heating elements 2112 in the tool body may preheat 2114 the paper container to bring it to an optimal temperature for bonding the seamless liner.

Figure 22:
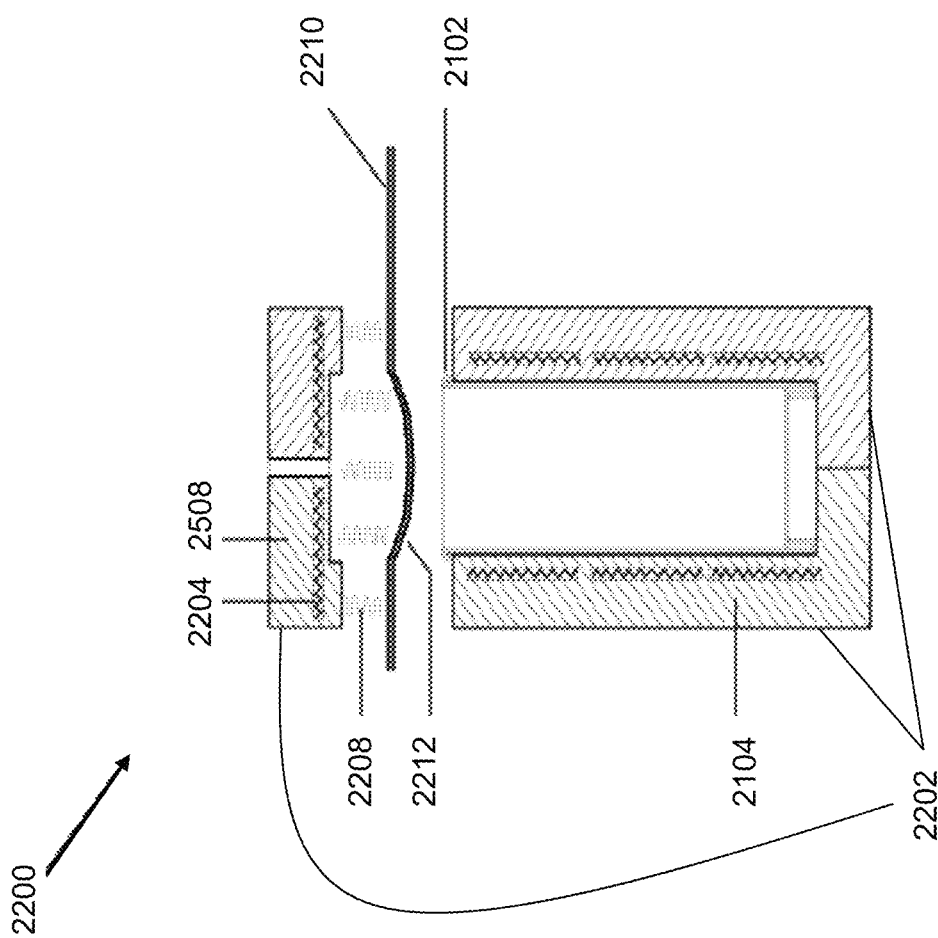
FIG. 22 depicts a section of a tool and a container showing the second step of thermal and pressure forming of the container lining in accordance with various embodiments of the present invention.

Referring to FIG. 22, step two of the seamless liner manufacturing process is depicted. The paper container 2102 may be held in the tool body and a film of a liquid-proof lining material 2210 may be brought over the open end of the container body. A top cover 2508 of a tool 2202 may contain heating elements 2204 that heat 2208 the liquid-proof lining material 2210 approaching the melting point of the material when it begins to soften and sag 2212 from its own weight into the open end of the paper container 2102.

Figure 23:
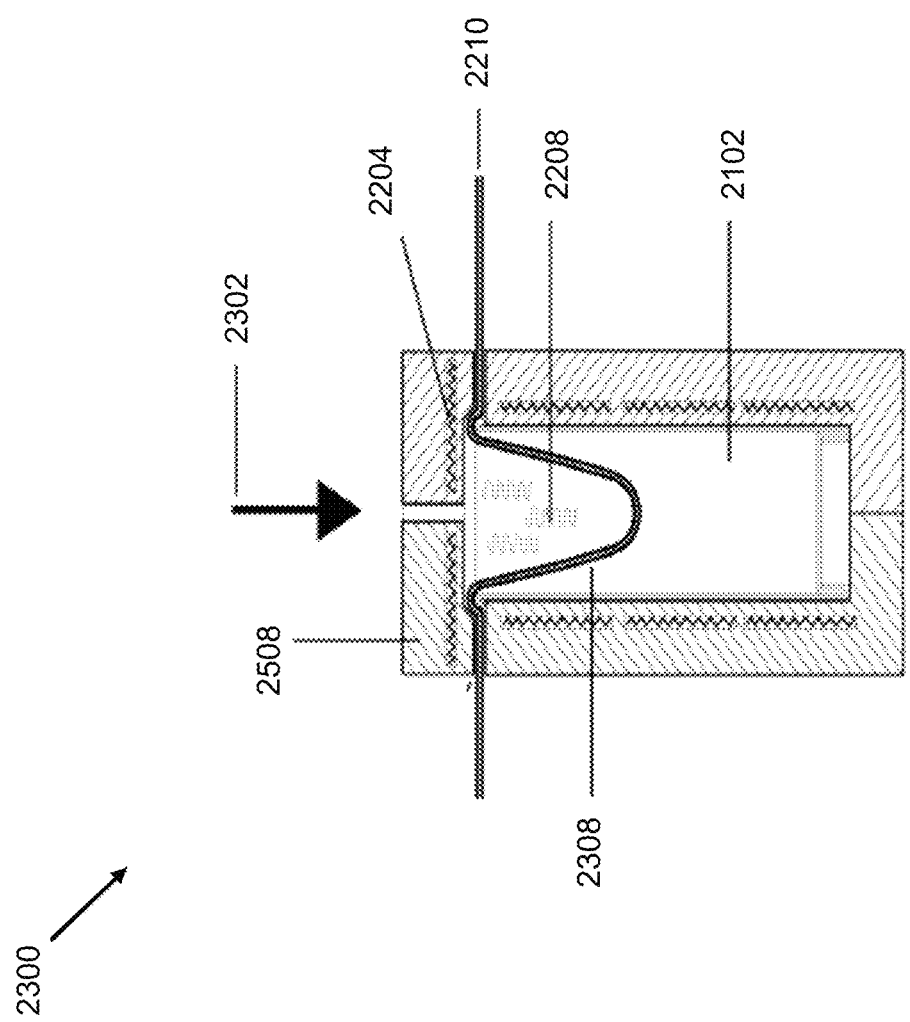
FIG. 23 depicts a section of a tool and a container showing the third step of thermal and pressure forming of the container lining in accordance with various embodiments of the present invention.

Referring to FIG. 23, step three of the seamless liner manufacturing process is depicted. The paper container 2102 may be held in the tool body and the top cover 2508 of the tool 2202 may clamp 2302 from above to seal the perimeter of the container opening by pressing a film of the liquid proof lining material 2210 against the top edge of the container. The heating elements 2204 may continue to heat 2208 the liquid proof lining material 2210 approaching the melting point of the material when it begins to soften and sag 2308 from its own weight into the open end of the paper container 2102.

Figure 24:
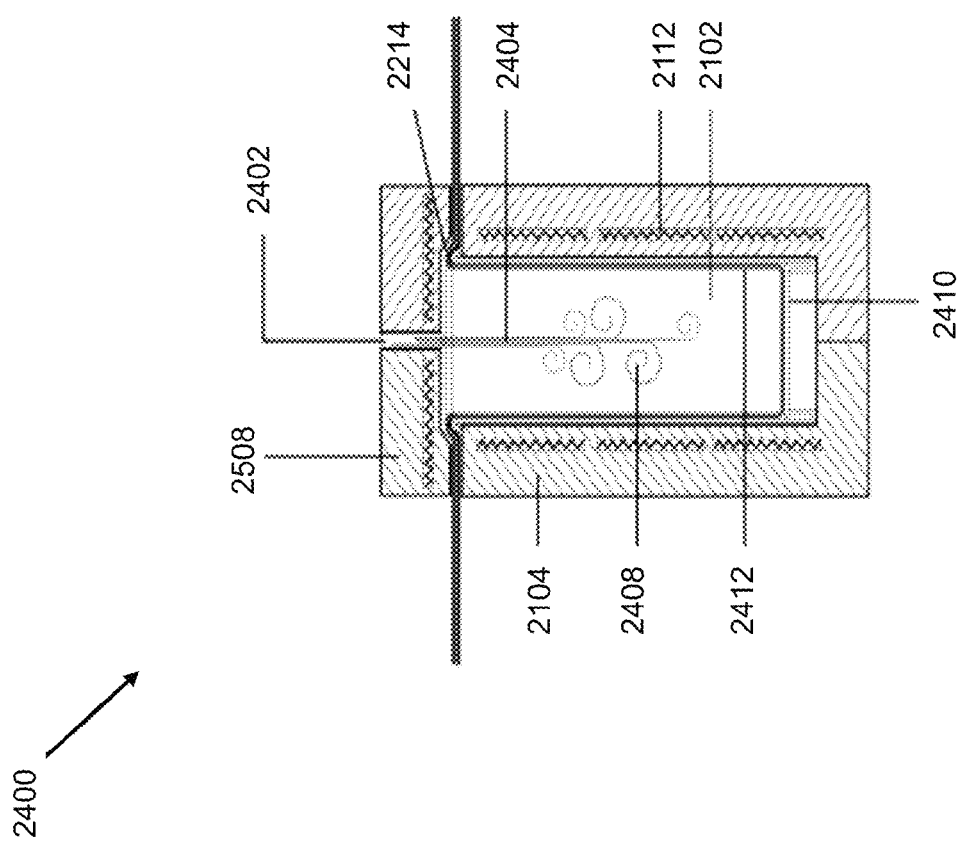
FIG. 24 depicts a section of a tool and a container showing the fourth step of thermal and pressure forming of the container lining in accordance with various embodiments of the present invention.

Referring to FIG. 24, step four of the seamless liner manufacturing process is depicted. The paper container 2102 may be held in the tool body, and air or other gasses from a high pressure source 2402 may be introduced through the top cover 2508 of the tool 2202 into the cavity 2404 above a container body 2412. This pressurizes 2408 the film of a liquid-proof lining material 2410 to expand to the confines of the container body 2412 and in the high thermal environment bond to the inner walls of the paper container 2102 in one seamless lining that wraps over a rolled edge 2414 of the top of the paper container 2102. In some embodiments, the liquid-proof lining material may be seamless. In any case, during the manufacturing process of the paper container 2102, it may be useful to create porosity or deliberate apertures in the bottom of the paper container 2102 to facilitate the pressure forming operation of the seamless liner. Alternatively, if porosity is achieved in the paper container 2102 a vacuum might also be used to pull the seamless liner into intimate contact with the inner surfaces of the paper container 2102.

Figure 25:
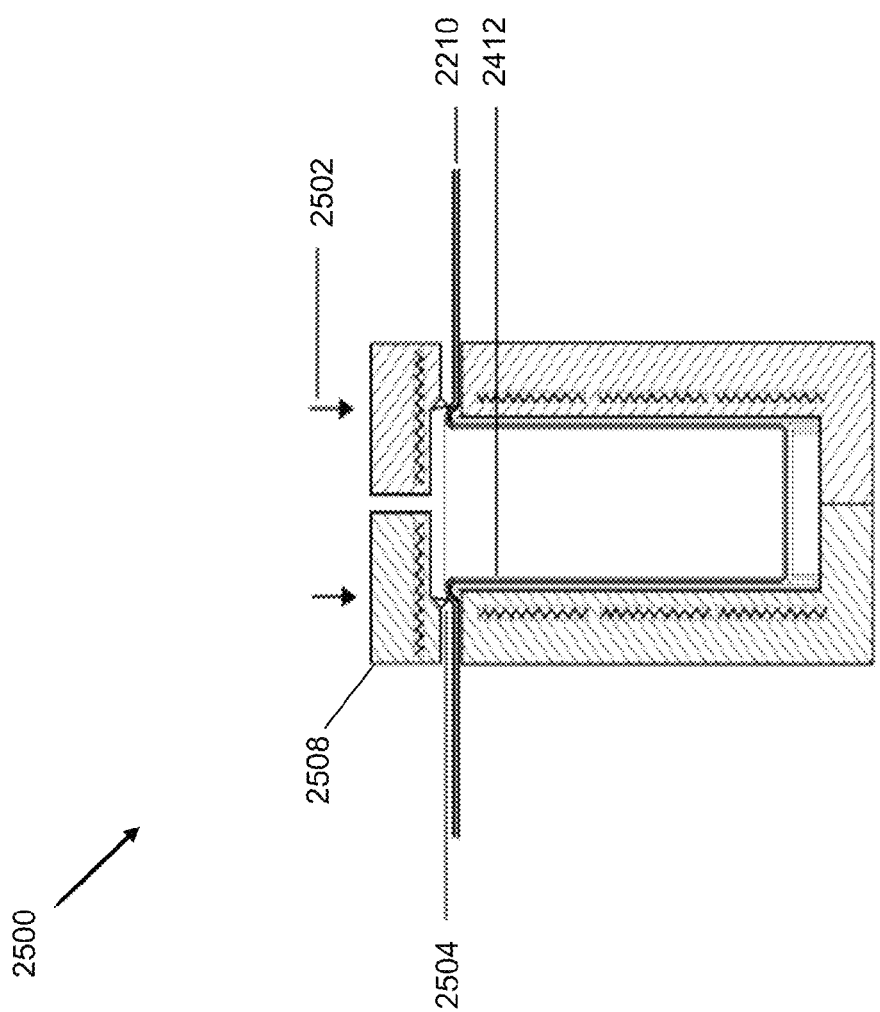
FIG. 25 depicts a section of a tool and a container showing the fifth step of thermal and pressure forming of the container lining in accordance with various embodiments of the present invention.

Referring to FIG. 25, step five of the seamless liner manufacturing process is depicted. The paper container 2102 with the liquid-proof lining material 2410 may be separated from the remainder of the liquid-proof lining material 2210 by a perimeter die knife 2504 that may be actuated 2502 from a top cover 2508 to cut away the external material at the exact outer edge of the container rolled edge freeing the container.

Figure 26:
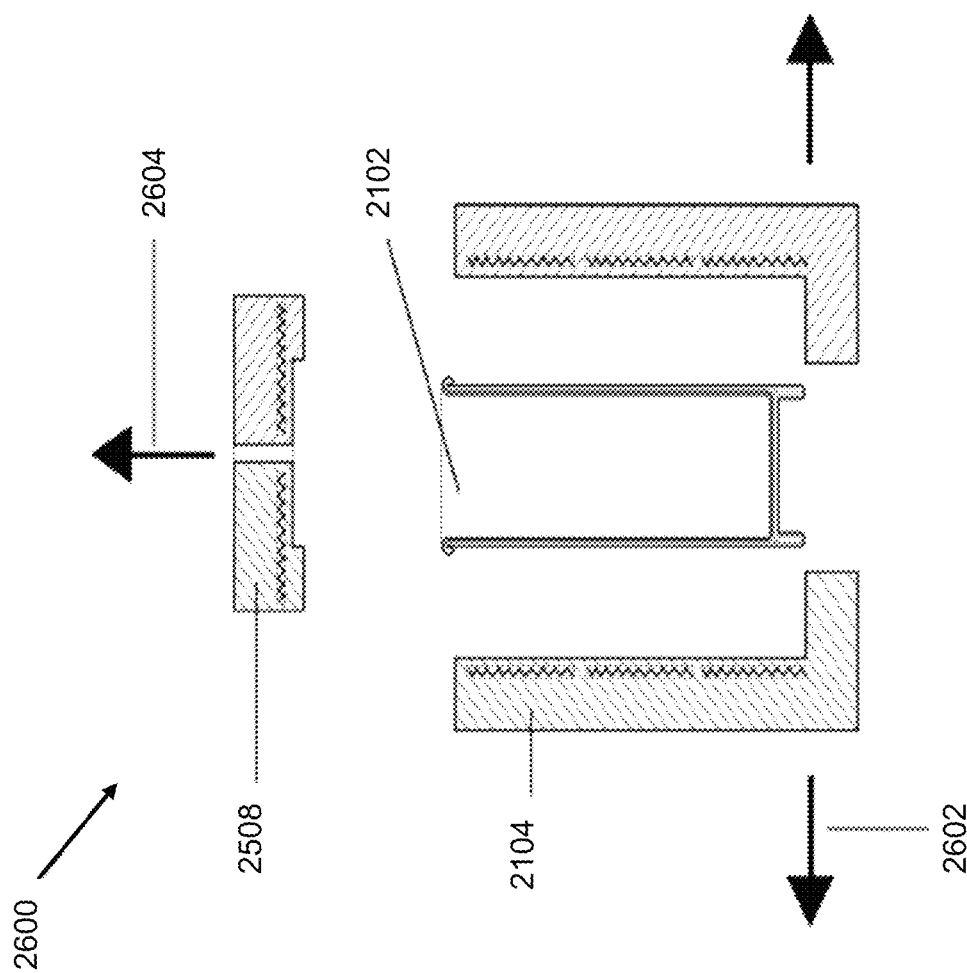
FIG. 26 depicts a section of a tool and a container showing the sixth step of thermal and pressure forming of the container lining in accordance with various embodiments of the present invention.

Referring to FIG. 26, step six of the seamless liner manufacturing process is depicted. The paper container 2102 may be freed from the tool 2202 when the top cover 2508 is withdrawn 2604 and the tool body separates 2602 away or otherwise removes from the grip on the paper container 2102.

Figure 27:
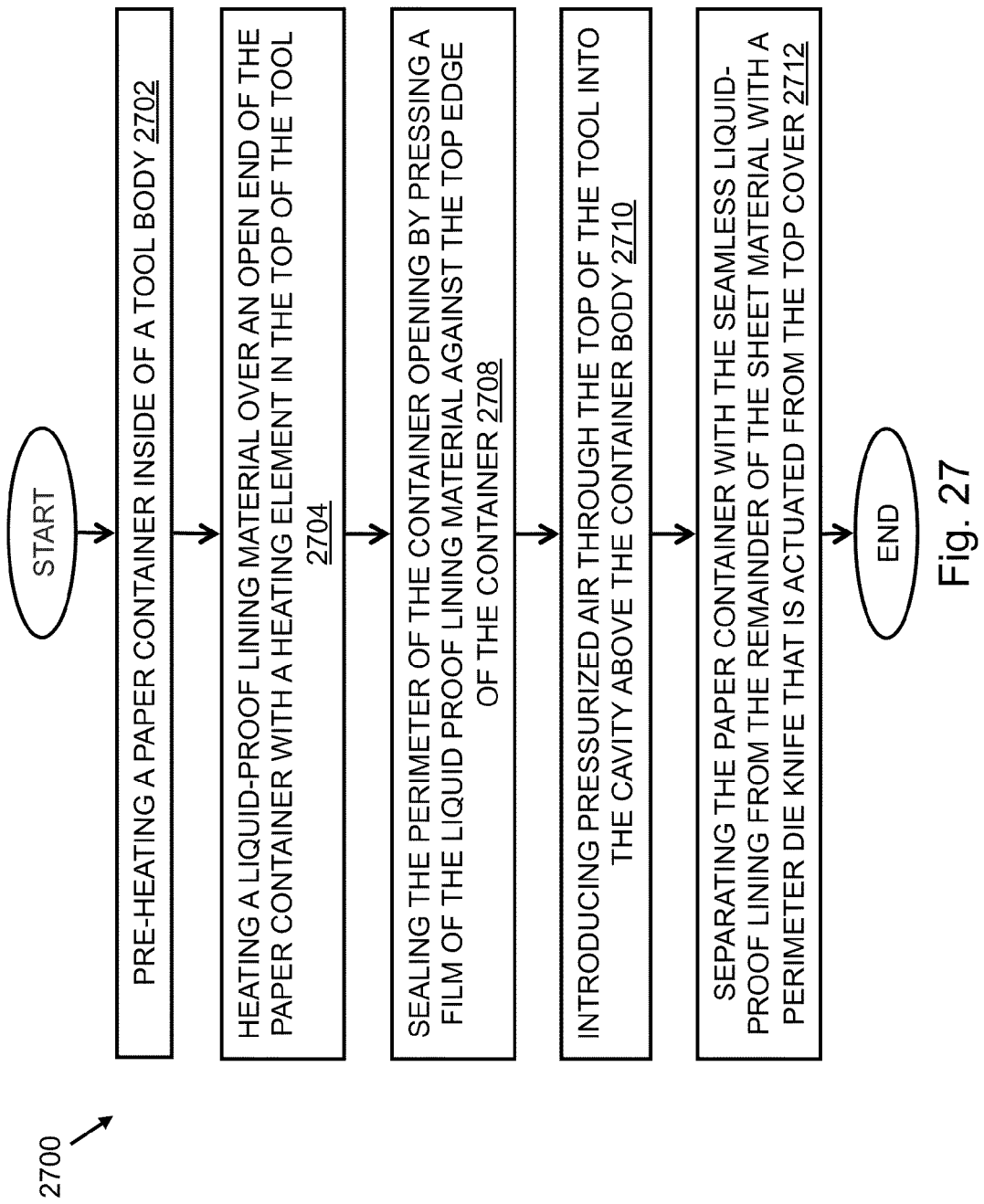
FIG. 27 depicts a process for manufacturing a paper container with a seamless liner in accordance with various embodiments of the present invention.

Referring to FIG. 27, a process 2700 for manufacturing a paper container with a seamless liner is depicted. The process 2700 may be initiated by pre-heating the paper container inside of a tool body, at step 2702. In an embodiment, the heating elements 2112 associated with the tool body may preheat the paper container to bring it to an optimal temperature for bonding the seamless liner. At step 2704, the process 2700 may heat the liquid-proof lining material 2210. The heating may be applied over the open end of the paper container 2102 with the heating elements 2204 positioned at the top cover 2508 of the tool 2202. In an embodiment, the paper container 2102 may be held in the tool body and the film of the liquid-proof lining material 2210 may be brought over the open end of the body 1302. The top of the tool 2202 may contain heating elements 2204 that heat the liquid-proof lining material 2210 approaching the melting point of the material where it begins to soften and sag 2212 from its own weight into the open end of the paper container 2102.

At step 2708, the process 2700 may seal the perimeter of the paper container opening by pressing the film of the liquid proof lining material 2210 against the top edge of the paper container 2102. In an embodiment, the paper container 2102 may be held in the tool body and the top cover 2508 of the tool 2202 with help of the clamp from above to seal the perimeter of the paper container opening. This may be accomplished by pressing the film of the liquid proof lining material 2210 against the top edge of the paper container 2102. The heating elements 2204 may continue to heat the liquid proof lining material 2210 approaching its melting point where it begins to soften and sag from its own weight into the open end of the paper container 2102.

At step 2710, the process 2700 may introduce pressurized air through the top cover 2508 of the tool 2202 into the cavity 2404 above the container body 2412. This may pressurize the film of the liquid-proof lining material 2210 to expand to the confines of the container body 2412 and bond to the inner walls of the paper container 2102 in one seamless lining that wraps over the edge of the top of the paper container 2102. In an embodiment, the paper container 2102 may be held in the tool body, and air or other gasses from a high pressure source 2402 may be introduced through the top cover 2508 of the tool 2202 into the cavity 2404 above the container body 2412. This pressurizes the film of the liquid-proof lining material to expand to the confines of the container body 2412. In addition, the high thermal environment bond to the inner walls of the paper container 2102 in one seamless lining that wraps over the rolled feature 1118 of the top of the paper container 2102. In embodiments, it may be useful to create porosity or deliberate apertures in the bottom of the container to facilitate the pressure forming operation of the seamless liner. Alternatively, if porosity is achieved in the paper container, a vacuum may also be used to pull the seamless liner into intimate contact with the inner surfaces of the paper container.

Finally at step 2712, the process 2700 may separate the paper container 2102 with the liquid-proof lining material 2410 from the remainder of the sheet material 2210 with the perimeter die knife 2504 that may be actuated from the top cover to cut the external material at the outer edge of the container edge.

Referring to FIG. 28A, an exploded bottom view of container components showing container 2800, double action seal and cap is depicted. The container 2800 may contain water and other beverages to permit storage and transport of the contained material. In an embodiment, the entirety of the container 2800 may be biodegradable and/or recyclable. The body 1302 may be manufactured from a paper pulp material that is protected from moisture by a biodegradable organically derived plastic resin coating such as PLA on the inside 1310 and outside 1330 of the container 2800. The paper pulp may be treated inside 1310 and outside 1330 to make it water and air tight; however, it may breakdown into compostable material when exposed to extreme biodegrading influences. The body 1302 may be manufactured from a paper pulp material that is protected from moisture by a biodegradable organically derived plastic resin coating on the inside 1310 and outside 1330 of the container 2800. A triple wrap thermal seal of the plastic coating on the paper pulp material may seal the bottom part 1332 of the container liquid tight. The container 2800 may be sealed and the contents protected from the environment by a two-stage access system provided by the smaller sealing membrane 1804 within the larger sealing membrane 1802. The larger sealing membrane 1802 across the top surface may be adhered to the top edge of the container 2800 by a biodegradable adhesive or thermal seal and may be removed by grasping an edge tab and pulling firmly to break the perimeter seal. The larger sealing membrane 1802 may include a smaller sealing membrane 1804 that covers an access hole to the contents of the container 2800. The lid 1304 may slide onto the upper portion of the container that may be used for secondary short-term closure once the container 2800 has been opened. The resulting container assembly may be recycled by separating its constituent parts or disposed off to be completely biodegradable.

Referring to FIG. 28B, an exploded bottom view of container components showing container 2800, double action seal and cap is depicted. The body of the container 2800 may be manufactured from a paper pulp material that is protected from moisture by a biodegradable organically derived plastic resin coating such as PLA on the inside 1310 and outside 1330 of the container 2800. The paper pulp may be treated inside 1310 and outside 1330 to make it water and air tight; however, it may breakdown into compostable material when exposed to extreme biodegrading influences. The body 1302 may be manufactured from a paper pulp material that is protected from moisture by a biodegradable organically derived plastic resin coating on the inside and outside of the container. The container 2800 may be sealed and the contents protected from the environment by a two-stage access system provided by the smaller sealing membrane 1804 within the larger sealing membrane 1802. The larger sealing membrane 1802 across the top surface may be adhered to the inward or outward rolled top edge 1832 of the container 2800 by a biodegradable adhesive or thermal seal and may be removed by grasping a second edge tab 1838 and pulling firmly to break the perimeter seal. The larger sealing membrane 1802 may include a smaller sealing membrane 1804 that covers an access hole to the contents of the container 2800 that may be removed by grasping a first edge tab 1814 and pulling firmly to break the perimeter seal. The lid 1304 slides onto the upper portion of the container 2800 that may be used for secondary short term closure once the container 2800 has been opened. The resulting container assembly may be recycled by separating its constituent parts or disposed off to be completely biodegradable.

Referring to FIG. 28C, a section of bottom seal construction is depicted. The body 1302 may be manufactured from a paper pulp material that is protected from moisture by a biodegradable organically derived plastic resin coating such as PLA on the inside 1310 and outside 1330 of the container 2800. The paper pulp may be treated inside 1310 and outside 1330 to make it water and air tight; however it may breakdown into compostable material when exposed to extreme biodegrading influences. The container body 134 may be manufactured from a paper pulp material that is protected from moisture by a biodegradable organically derived plastic resin coating on the inside 1310 and outside 1330 of the container 2800. A triple wrap and pressure/thermal seal of the plastic coating on the paper pulp material may seal the bottom part 1332 of the container liquid tight. The bottom paper disc 2010 of the container 2800 may have a downward protruding edge 2840 that engages the rolled outer wall 2842 of the container 2800 to create three interlocked surfaces and two thermally sealed interfaces. The resulting container assembly may be recycled by separating its constituent parts or disposed off to be completely biodegradable.

Referring to FIG. 28D, a container 2800 with inner and outer membrane seal in closed configuration is depicted. The body of the container 2800 may be manufactured from a paper pulp material that is protected from moisture by a biodegradable organically derived plastic resin coating such as PLA on the inside 1310 and outside 1330 of the container 2800. The paper pulp may be treated inside 1310 and outside 1330 to make it water and air tight; however, it may breakdown into compostable material when exposed to extreme biodegrading influences. The container may be sealed and the contents protected from the environment by a two-stage access system provided by the smaller sealing membrane 1804 within the larger sealing membrane 1802. The larger sealing membrane 1802 across the top surface may be adhered to the top edge of the container 2800 by a biodegradable adhesive or thermal seal and may be removed by grasping an edge tab and pulling firmly to break the perimeter seal. The larger sealing membrane 1802 may include a smaller sealing membrane 1804 that covers an access hole to the contents of the container 2800. This seal may be reusable and hinged to the larger sealing membrane 1802 via a permanently bonded base 1808 attached to the larger sealing membrane 1802 using thermal sealing, biodegradable/recyclable adhesive or other method.

Referring to FIG. 28E, a container 2800 with inner and outer membrane seal having inner seal open for contents access is depicted. The container 2800 may have two-stage access for water and other beverages to permit storage and transport of the contained material. The entirety of the container 2800 may be biodegradable and/or recyclable. The body 1302 may be manufactured from a paper pulp material that is protected from moisture by a biodegradable organically derived plastic resin coating such as PLA on the inside 1310 and outside 1330 of the container 2800. The user 1810 may access the contents of the container 2800 by lifting and breaking the seal of the smaller inner membrane sealing surface 1840 that reveals an access opening 1844 by which the contents of the container 2800 may be accessed. The perimeter of this membrane seal 1818 may have a reusable adhesive so that the smaller sealing membrane 1804 can be re-closed to provide a water resistant seal.

Referring to FIG. 28F, a container 2800 with inner and outer membrane seal showing removal of outer seal element is depicted. The container 2800 may have two-stage access for water and other beverages to permit storage and transport of the contained material. The entirety of the container 2800 may be biodegradable and/or recyclable. The body 1302 may be manufactured from a paper pulp material that is protected from moisture by a biodegradable organically derived plastic resin coating such as PLA on the inside 1310 and the outside 1330 of the container 2800. In embodiments, the contents of the container 2800 may be gone or the user 1810 may wish complete access to the contents without the need to reseal. In this case, the larger sealing membrane 1802 may be removed permanently from the top edge of the container 1800 by the second edge tab 1838 at the edge. Both the larger and smaller membrane seals may be composed of a paper pulp material such as sheet paper or cardboard that is protected from moisture by a biodegradable plastic resin coating on the inside and outside of the sheet material. This coating may be a material such as polylactic acid ("PLA") resin, high amylase corn starch based resins or oxo-PET or other biodegradable modified plastic resins. Alternatively, the container seal may be of aluminum or other air tight material that may be easily recyclable in its own channel and similarly the full width membrane seal may be bonded to the inward or outward rolled upper edge 1832 of the container 2800 or the smaller onto the full width membrane seal.

Referring to FIG. 29A, a container 2900 for water and other beverages that permits storage and transport of a contained material. In embodiments, the entirety of the container may be biodegradable and/or recyclable. The container 2900 includes a tubular body 2902, which may be manufactured from a paper pulp material that is protected from condensation and other moisture by a biodegradable organically derived plastic resin coating such as PLA on the outside of the container 2900. The structure of the tubular body 2902 can be of spiral wrap, convolute wrap or other construction. The container 2900 also includes a bottom 2904, which may be structurally sealed by a bonded disc attached by curl and disc, press form and adhesive or other method to create a durable connection of the bottom to the tube.

The container 2900 may be protected from the contained liquid by an inserted and bonded seamless liner comprised of an organic, vegetable based and biodegradable plastic resin coating such as PLA, which makes the liner and container 2900 both water/air tight and biodegradable into compostable material. This liner is formed by a thermal/pressure process from sheet plastic such as extrusion blow molding, thermoforming with plug assist or other high volume production methods. The liner may be bonded to the paper container so as to form an integral assembly. The container may be sealed by a biodegradable plastic double-coated paper lid 2908 across the top surface adhered to the top edge of the biodegradable plastic liner 2910. This bond may be welded, adhesive bonded, mechanical or achieved by other methods. This lid may be assembled to the container before filling with the beverage wherein the filling is achieved through the drink hole in the lid and the peel away seal 2912 then affixed to seal the container. Alternatively, the container may be filled with the beverage and the assembly of the lid plus the peel away seal of the opening bonded as a single operation. This lid may have a drink opening at the edge and a secondary peel away covering 2912 of a mouth-sized opening bonded at the perimeter to the lid that when removed permits the user to partake of the beverage without removing the entire lid for the container. In embodiments, the peel away covering 2912 of the drink opening may be of paper pulp double coated with an organic, vegetable based and biodegradable plastic resin coating (such as and without limitation PLA) and may have a pressure formed feature that protrudes into the drink opening and provides a friction fit closure after the seal has been broken that can be used for secondary short term closure once the container has been opened. The resulting container assembly can be recycled into the paper recycle stream or disposed of to biodegrade in a composting process.

Referring to FIG. 29B, a container 2900 for water and other beverages that permits storage and transport of a contained material. In embodiments, the entirety of the container may be biodegradable and/or recyclable. The body of the container 2902 may be tubular, and may be manufactured from a paper pulp material that is protected from condensation and other moisture by a biodegradable organically derived plastic resin coating (such as and without limitation PLA) on the outside of the container. The structure of the body of the container 2902 can be of spiral wrap, convolute wrap or other construction. The bottom 2904 may be structurally sealed by a bonded disc attached by curl and disc, press form and adhesive or other method wherein the perimeter feature of the disc 2918 is affixed to the inner surface of the tubular container 2920 to create a durable connection of the bottom to the tube. The paper container may be protected from the liquid contained by an inserted and bonded seamless liner 2914 comprised of an organic, vegetable based and biodegradable plastic resin coating such as PLA to make it water and air tight but the liner as well as the paper container, when exposed to extreme biodegradation influences able to breakdown as a compostable material. In embodiments, this liner 2914 is a tight fit to the internal diameter of the container 2900 and may be formed by a thermal/pressure process from sheet plastic such as extrusion blow molding, thermoforming with plug assist or other high volume production methods. The liner may be bonded to the paper container so as to form an integral assembly by thermal welding, biodegradable and recyclable adhesive, mechanical connection or a combination of these methods or other bonding method. The container may be sealed by a biodegradable plastic double-coated paper lid 2908 across the top surface adhered to the top edge 2910 of the biodegradable plastic liner. In embodiments, this bond can be welded, adhesive bonded, mechanical or achieved by other methods. This lid can be assembled to the container before filling with the beverage wherein the filling may be achieved through the drink hole in the lid and the peel away seal 2912 then affixed to seal the container. Alternatively, the container may be filled with the beverage and the assembly of the lid plus the peel away seal 2912 of the opening bonded as a single operation. This lid has a drink opening at the edge and a secondary peel away covering 2912 of a mouth-sized opening bonded at the perimeter to the lid that when removed permits the user to partake of the beverage without removing the entire lid for the container. The peel away covering 2912 of the drink opening may be of paper pulp double coated with an organic, vegetable based and biodegradable plastic resin coating (such as and without limitation PLA) and may have a pressure formed feature that protrudes into the drink opening and provides a friction fit closure after the seal has been broken that can be used for secondary short term closure once the container has been opened. The resulting container assembly can be recycled into the paper recycle stream or disposed of to biodegrade in a composting process.

Referring to FIG. 29C, a cross section through the top of the container for water and other beverages illustrates the construction of the container and the peel away seal for drink access. The paper container 2902 may be protected from the liquid contained therein by an inserted and bonded seamless liner 2914 that includes an organic, vegetable based and biodegradable plastic resin coating (such as and without limitation PLA) to make it water and air tight yet biodegradable into compostable material. In embodiments, this liner 2914 can have a tight fit to the internal diameter of the tubular container 2902 and may be formed by a thermal/pressure process from sheet plastic such as extrusion blow molding, thermoforming with plug assist or other high volume production methods. The liner may be bonded to the paper container 2902 so as to form an integral assembly by thermal welding, biodegradable and recyclable adhesive, mechanical connection or a combination of these methods or other bonding method. The container may be sealed by a biodegradable plastic double-coated paper lid 2908 across the top surface adhered to the top edge 2910 of the biodegradable plastic liner. In embodiments, this bond can be welded, adhesive bonded, mechanical or achieved by other methods. This lid may be assembled to the container before filling with the beverage wherein the filling is achieved through the drink hole in the lid and the peel away seal 2912 then affixed to seal the container. Alternatively, the container may be filled with the beverage and the assembly of the lid plus the peel away seal 2912 of the opening bonded as a single operation. This lid may have a drink opening at the edge 2922 and a secondary peel away covering 2912 of a mouth-sized opening bonded at the perimeter to the lid that when removed permits the user to partake of the beverage without removing the entire lid for the container. In embodiments, the peel away covering 2912 of the drink opening can be of paper pulp double coated with an organic, vegetable based and biodegradable plastic resin coating (such as and without limitation PLA) and may have a pressure formed feature that protrudes into the drink opening and provides a friction fit closure after the seal has been broken that can be used for secondary short term closure once the container has been opened. The peel away covering 2912 of the drink opening may have a tab 2928 that provides a grip feature for the user to grab. The peel away covering may be permanently attached to the lid 2930 via a welded, adhesive, mechanical or other connection. The covering, which may be flexible so that it can be pulled away or reclosed, may have a pressure formed feature 2924 that protrudes into the drink opening 2922 and provides a friction fit closure after the seal has been broken that can be used for secondary short term closure once the container has been opened. The resulting container assembly can be recycled into the paper recycle stream or disposed of to biodegrade in a composting process.

Referring to FIG. 29D, a user 2932 may open the biodegradable and/or recyclable container by gripping the tab on the peel away covering and then releasing the perimeter seal 2912 of the covering by upward pressure. This thermal or adhesive perimeter seal 2912 may be adapted to break (and then not re-adhere) upon application of the upward pressure, thus providing access to the contents through the drink opening 2922. Additionally, the peel away covering, which may be flexible so that it can be pulled out of the way for drinking, may be re-closed by way of a pressure formed feature 2924 that protrudes into the drink opening 2922 and provides a friction fit closure after the seal has been broken. This may allow for secondary short term closure once the container has been opened.

Referring to FIG. 29E, the user 2932 may close the biodegradable and/or recyclable container by applying a downward pressure on the pressure formed feature 2924, forcing the feature 2924 into the drink opening 2922, creating a friction fit closure between the drink opening 2922 and the feature 2924. In embodiments, the pressure formed feature 2924 may be strongly adhered 2930 to the lid 2912 of the container, so that the feature 2924 remains attached to the lid 2912 even when not engaged with the drink opening 2922. In embodiments, the downward pressure of a user's finger pressing down on the top of the peel away seal 2912 may suffice to create the friction fit closure.

Referring to FIG. 30A, a container 3000 for water and other beverages that permits storage and transport of a contained material. In embodiments, the entirety of the container may be biodegradable and/or recyclable. The body of the tubular container 3002 may be manufactured by a spiral wound construction 3004 made from several layers of paper stock sequentially wound one upon the other. In embodiments, the innermost lining layer may include a paper pulp material that is protected from water by a biodegradable organically derived plastic resin coating such as and without limitation PLA. The bottom may be structurally sealed by a curl 3010 and disc 3008 to create a durable connection of the bottom to the tube. Bonding of the coating of one component to the other may create a water tight bond. The paper container may be protected from the liquid contained therein by a lining layer with a coating comprised of an organic, vegetable based and biodegradable plastic resin coating (such as and without limitation PLA) to make it water and air tight yet biodegradable into compostable material. The container may be sealed at the top by a biodegradable PLA (or the like) double-coated paper lid 3014 across the top surface adhered to the outward curled top edge 3012 of the biodegradable container. This bond can be welded, adhesive bonded, mechanical or achieved by other methods. This lid may be assembled to the container before filling with the beverage wherein the filling is achieved through the drink hole in the lid and the peel away seal 3018 then affixed to seal the container. Alternatively, the container may be filled with the contained material (such as a beverage or the like) and the assembly of the lid plus the peel away seal of the opening bonded as a single operation. This lid may have a drink opening at the edge and a secondary peel away covering 3018 of a mouth-sized opening bonded at the perimeter to the lid that when removed permits the user to partake of the beverage without removing the entire lid for the container. The container seal may be protected by an optional molded paper lid 3020 that is PLA (or the like) coated and that also serves as a secondary closure for the container once the container has been opened. The resulting container assembly can be recycled into the paper recycle stream or disposed of to biodegrade in a composting process.

Referring to FIG. 30B, a biodegradable container may be sealed by a biodegradable PLA double-coated 3024 paper lid 3014 across the top surface adhered to the PLA coated 3024 outward curled top edge 3012 of the biodegradable container. This bond can be ultrasonically or thermally welded, adhesive bonded, mechanically bonded or achieved by other methods. This lid may be assembled to the container before filling with a beverage or other material wherein the filling is achieved through the drink hole in the lid and the peel away seal 3018 then affixed to seal the container. Alternatively, the container may be filled with the beverage or other material and the assembly of the lid plus the peel away seal of the opening bonded as a single operation. This lid may have a drink opening at the edge and a secondary peel away covering 3018 of a mouth-sized opening bonded at the perimeter to the lid. The lid may have a thermal/pressure formed tear zone 3022, which provides a weakened line in the sealing membrane so that a clean tear along the line forms when a user applies a force on the peel tab. The peel away seal 3018, when removed, may permit the user to partake of the beverage or other material without removing the entire lid from the container.

Referring to FIG. 30C, the container may be sealed by a biodegradable PLA double-coated paper lid across the top surface adhered to the PLA coated 3024 outward curled top edge 3012 of the biodegradable container. In a preferred method, this bond may be ultrasonically or thermally welded. When the lid is welded to the curled top edge 3012 of the container, heat (ultrasonic, hot plate, inductive or other) and pressure may be applied at the perimeter 3028 of the lid seal to force it into intimate contact 3030 with the curled edge of the container and the contacting PLA lining and weld the two contacting plastic layers together 3030 to form a water tight bond. The tool that creates the welded bond may wrap the seal 3032 around the outside of the curled edge 3012 to create a bond with more surface area for greater mechanical strength.

Referring to FIG. 30D, the body of the tubular container may be manufactured by a spiral wound construction made from several layers of paper stock sequentially wound 3034 one upon the other. The innermost lining layer may be comprised of a paper pulp material that is protected from water by a biodegradable organically derived plastic resin coating such as PLA. The spiral wound liner may include an organic, vegetable based and biodegradable plastic resin coating of PLA or the like bonded to a paper backing layer. The leading edge of the spiral wound liner winding may be folded back upon itself 3038 so that there is no cut edge of paper that would allow water to wick into the paper. This construction of the PLA lining may be water and air tight yet biodegradable into compostable material.

Referring to FIG. 30E, the body of the tubular container may be manufactured by a spiral wound construction made from several layers of paper stock 3044 sequentially wound one upon the other. The innermost lining layer may be comprised of a paper pulp material that is protected from water by a biodegradable organically derived plastic resin coating such as PLA. The spiral wound liner 3034 may be comprised of an organic, vegetable based and biodegradable plastic resin coating of PLA or the like bonded to a paper backing layer. The leading edge of the liner winding may be folded back upon itself 3040 so that there is no cut edge of paper that would allow water to wick into the paper. In the winding process, heat and pressure may be applied to the layered construction at the point of the folded edge of the lining and the layers of PLA coating are welded together 3042 to create a water tight joint. This construction of the PLA lining may be water and air tight yet biodegradable into compostable material.

Referring to FIG. 30F, the bottom of the container may be structurally sealed by a curl and disc construction to create a durable connection of the bottom to the tube. In embodiments, bonding of the PLA coating of one component to the other creates a water tight bond. The bottom disc may be made of a thick layer of paperboard 3050 and the watertight seal may be accomplished with a disc comprised of PLA 3048 with a paper backing. These may be assembled sequentially with the PLA membrane thermally bonded to the PLA lining of the spiral tube.

Referring to FIG. 30G, the bottom of the container may be structurally sealed by a curl and disc construction to create a durable connection of the bottom to the tube. Bonding of the PLA coating of one component to the other creates a water tight bond. The bottom disc may be made of a thick layer of paperboard and the watertight seal may be accomplished with a layer of PLA with a paper backing. These may be preassembled into a paperboard disc with a PLA film "skirt" 3008 that is thermally bonded to the PLA lining of the spiral tube.

Referring to FIG. 30H, the bottom of the container may be structurally sealed by a curl and disc construction to create a durable connection of the bottom to the tube wall 3002. The bonding of the PLA coating of one component to the other creates a water tight bond. In the first step, the PLA sealing disc, which includes a PLA coating on a lightweight paper oversized disc, is inserted into the spiral wound container such that the outer diameter of the disc folds down to provide a flange of PLA 3048 surface that conforms with the inner diameter of the spiral wound container 3002 and contacts the inside lining surface of the PLA coating 3024. Heat and pressure 3054 are applied inside and outside to weld the two PLA linings together to form a water tight seal. Either simultaneously or sequentially the sealing disc may be combined with a structural paperboard disc 3050 that is inserted into the PLA coated spiral wound container.

Referring to FIG. 30I, the bottom of the container may be structurally sealed by a curl 3010 and disc 3050 construction to create a durable connection of the bottom to the tube wall 3002. The bonding of the PLA coating of one component to the other creates a water tight bond. In the first step, the PLA sealing disc comprised of a PLA coating 3048 on a lightweight paper oversized disc is inserted into the spiral wound container such that the outer diameter of the disc folds down to provide a flange of PLA 3048 surface that conforms with the inner diameter of the spiral wound container 3002 and contacts the inside lining surface of the PLA coating 3024. Heat and pressure 3054 are applied inside and outside to weld the two PLA linings together 3052 to form a water tight seal. Either simultaneously or sequentially the sealing disc may be combined with a structural paperboard disc 3050 that is inserted into the PLA coated spiral wound container. In the second step, the welded surfaces of the tube wall and the sealing disc 3058 are curled inward 3060 to support the bottom surface 3050 of the container. This inward curl 3010 structurally supports the disc 3050 to prevent displacement from the forces of the environment acting upon the liquid contents.

Referring to FIG. 31A, a container 3100 permits storage and transport of contained material (including without limitation beverages and the like). The container 3100 may be biodegradable and/or recyclable. The body of the container 3102, which without limitation can be tubular, may be manufactured by a spiral wound construction 3104 made from several layers of paper stock sequentially wound one upon the other. The innermost lining layer may include a paper pulp material that is protected from water by a biodegradable organically derived plastic resin coating such as PLA or the like. The bottom may be structurally sealed by a curl 3110 and disc 3108 to create a durable connection of the bottom to the tube. Bonding of the PLA coating of one component to the other creates a water tight bond. The paper container may be protected from the liquid contained by a lining layer with a coating comprised of an organic, vegetable based and biodegradable plastic resin coating such as PLA to make it water and air tight yet biodegradable into compostable material. The container may be sealed at the top by a biodegradable PLA double-coated paper lid applied in a curl and disc assembly similar to the bottom closure of the container. Bonding of the PLA coating of one component to the other creates a water tight bond. In the first step, the PLA sealing disc including a PLA coating 3102 on a lightweight paper oversized disc is inserted into the spiral wound container such that the outer diameter of the disc folds down to provide a flange of PLA surface that conforms with the inner diameter of the spiral wound container 3002 and contacts the inside lining surface of the PLA coating. Heat and pressure are applied inside and outside to weld the two PLA linings together to form a water tight seal. Either simultaneously or sequentially the sealing disc may be combined with a structural paperboard disc 3104 that is inserted into the PLA coated spiral wound container. In the second step, the welded surfaces of the tube wall and the sealing disc are curled inward to support the bottom surface of the container. This inward curl structurally supports the disc to prevent displacement from the forces of the environment acting upon the liquid contents. The top sealing disc may have one or two holes that provide access for filling 3110 and drinking 3108. The cut edges of these holes may be sealed by the PLA film to prevent water from wicking into the paper edge. The inside PLA membrane may be thermoformed into the holes to cover the cut edge of paperboard and to contact the external closures consisting of the drink hole peel tab 3112 and the fill hole plug 3114 so they can be bonded together to create a water tight seal.

Referring to FIG. 31B, the container may be sealed at the top by a biodegradable PLA double-coated paper lid 3104 applied in a curl and disc assembly similar to the bottom closure of the container. The bonding of the PLA coating of one component to the other creates a water tight bond. In the first step, the PLA sealing disc comprised of a PLA coating 3102 on a lightweight paper oversized disc is inserted into the spiral wound container such that the outer diameter of the disc folds up to provide a flange of PLA surface that conforms with the inner diameter of the spiral wound container and contacts the inside lining surface of the PLA coating 3024. Heat and pressure 3118 are applied inside and outside to weld the two PLA linings together to form a water tight seal 3120. Either simultaneously or sequentially the sealing disc is combined with a structural paperboard disc 3104 that is inserted into the PLA coated spiral wound container. In the second step, the welded surfaces of the tube wall and the sealing disc are curled inward 3122 to support the top seal of the container. This inward curl 3122 structurally supports the disc 3104 to prevent displacement from the forces of the environment acting upon the liquid contents. The top sealing disc may have one or two holes that provide access for filling and drinking. The cut edges of these holes may be sealed by the PLA film to prevent water from wicking into the paper edge. The inside PLA membrane 3102 may be thermoformed into the holes to cover the cut edge of paperboard and to contact the external closures consisting of the drink hole peel tab 3112 and the fill hole plug 3114 so they can be bonded together to create a water tight seal. The internal PLA membrane 3102 may be welded to the underside of the peel tab 3112 so that when the user pulls the tab it tears away the local bonded membrane to expose the interior of the container. Likewise, the internal PLA membrane 3102 may be welded to the underside of the fill plug 3114, either extruded to the top surface of the sealing disc or bonded at the bottom with a fill plug that conforms into the opening to contact the PLA interior membrane 3124.

Referring to FIG. 31C, the body of the tubular container may be manufactured by a spiral wound construction made from several layers of paper stock sequentially wound 3034 one upon the other. The innermost lining layer includes a paper pulp material that is protected from water by a biodegradable organically derived plastic resin coating such as PLA. The spiral wound liner may include an organic, vegetable based and biodegradable plastic resin coating of PLA or the like bonded to a paper backing layer. The leading edge of the liner winding is folded back upon itself 3038 so that there is no cut edge of paper that would allow water to wick into the paper. This construction of the PLA lining may be water and air tight yet biodegradable into compostable material.

Referring to FIG. 31D, the body of the tubular container may be manufactured by a spiral wound construction made from several layers of paper stock 3044 sequentially wound one upon the other. The innermost lining layer may include a paper pulp material that is protected from water by a biodegradable organically derived plastic resin coating such as PLA. The spiral wound liner 3034 may include an organic, vegetable based and biodegradable plastic resin coating of PLA or the like bonded to a paper backing layer. The leading edge of the liner winding may be folded back upon itself 3040 so that there is no cut edge of paper that would allow water to wick into the paper. In the winding process, heat and pressure may be applied to the layered construction at the point of the folded edge of the lining and the layers of PLA coating may be welded together 3042 to create a water tight joint. This construction of the PLA lining may be water and air tight yet biodegradable into compostable material.

Referring to FIG. 31E, the bottom of the container may be structurally sealed by a curl and disc construction to create a durable connection of the bottom to the tube and the bonding of the PLA coating of one component to the other creates a water tight bond. The bottom disc may be made of a thick layer of paperboard 3050. The watertight seal may be accomplished with a disc including PLA 3048 with a paper backing. These may be assembled sequentially with the PLA membrane thermally bonded to the PLA lining of the spiral tube.

Referring to FIG. 31F, the bottom of the container may be structurally sealed by a curl and disc construction to create a durable connection of the bottom to the tube. Bonding of the PLA coating of one component to the other may create a water tight bond. The bottom disc may be made of a thick layer of paperboard. The watertight seal may be accomplished with a layer of PLA with a paper backing. These may be preassembled into a paperboard disc with a PLA film "skirt" 3008, which is thermally bonded to the PLA lining of the spiral tube.

Referring to FIG. 31G, the bottom of the container may be structurally sealed by a curl and disc construction to create a durable connection of the bottom to the tube wall 3002. The bonding of the PLA coating of one component to the other may create a water tight bond. In the first step, the PLA sealing disc that includes a PLA coating on a lightweight paper oversized disc is inserted into the spiral wound container such that the outer diameter of the disc folds down to provide a flange of PLA 3048 surface that conforms with the inner diameter of the spiral wound container 3002 and contacts the inside lining surface of the PLA coating 3024. Heat and pressure 3054 may be applied inside and outside to weld the two PLA linings together to form a water tight seal. Either simultaneously or sequentially the sealing disc may be combined with a structural paperboard disc 3050 that is inserted into the PLA coated spiral wound container.

Referring to FIG. 31H, the bottom of the container may be structurally sealed by a curl 3010 and disc 3050 construction to create a durable connection of the bottom to the tube wall 3002. The bonding of the PLA coating of one component to the other may create a water tight bond. In the first step, the PLA sealing disc includes a PLA coating 3048 on a lightweight paper oversized disc, which is inserted into the spiral wound container such that the outer diameter of the disc folds down to provide a flange of PLA 3048 surface that conforms with the inner diameter of the spiral wound container 3002 and contacts the inside lining surface of the PLA coating 3024. Heat and pressure 3054 may be applied inside and outside to weld the two PLA linings together 3052 to form a water tight seal. Either simultaneously or sequentially the sealing disc may be combined with a structural paperboard disc 3050 that is inserted into the PLA coated spiral wound container. In the second step, the welded surfaces of the tube wall and the sealing disc 3058 are curled inward 3060 to support the bottom surface 3050 of the container. This inward curl 3010 structurally supports the disc 3050 to prevent displacement from the forces of the environment acting upon the liquid contents.

Referring to FIG. 32A, a container 3200 for containing liquids (such as water, other beverages, and so on) permits storage and transport of contained material. The container may be biodegradable and/or recyclable. The body of the container 3002, which may be tubular, can be manufactured by a spiral wound construction 3004 made from several layers of paper stock sequentially wound one upon the other. Both the top and bottom of the tube may be curled outward 3012, 3214 to provide a bonding surface for the top and bottom closures. The innermost lining layer may include a paper pulp material that is protected from water by a biodegradable organically derived plastic resin coating such as PLA. The bottom may be structurally sealed both by a bonded PLA membrane 3202 welded to the outward curl of the container and with a reinforcing structural cap 3204 to create a durable connection of the bottom to the tube. Bonding of the PLA coating of one component to the other may create a water tight bond. The paper container may be protected from the liquid contained by a lining layer with a coating comprised of an organic, vegetable based and biodegradable plastic resin coating such as PLA to make it water and air tight yet biodegradable into compostable material. The container may be sealed at the top by a biodegradable PLA double-coated paper lid 3014 across the top surface adhered to the outward curled top edge 3012 of the biodegradable container. This bond may be welded, adhesive bonded, mechanical or achieved by other methods. This lid may be assembled to the container before filling with the beverage wherein the filling is achieved through the drink hole in the lid and the peel away seal 3018 then affixed to seal the container. Alternatively, the container may be filled with the beverage and the assembly of the lid plus the peel away seal of the opening bonded as a single operation. This lid may have a drink opening at the edge and a secondary peel away covering 3018 of a mouth-sized opening bonded at the perimeter to the lid that when removed permits the user to partake of the beverage without removing the entire lid for the container. The container seal may be protected by an optional molded paper lid 3020 that is PLA coated and that also serves as a secondary closure for the container once the container has been opened. The resulting container assembly may be recycled into the paper recycle stream or disposed of to biodegrade in a composting process.

Referring to FIG. 32B, the container may be sealed by a biodegradable PLA double-coated 3024 paper lid 3014 across the top surface adhered to the PLA coated 3024 outward curled top edge 3012 of the container, which may be biodegradable. This bond can be ultrasonically or thermally welded, adhesive bonded, mechanically bonded or achieved by other methods. This lid may be assembled to the container before filling with the beverage wherein the filling is achieved through the drink hole in the lid and the peel away seal 3018 then affixed to seal the container. Alternatively, the container may be filled with the beverage and the assembly of the lid plus the peel away seal of the opening bonded as a single operation. This lid may have a drink opening at the edge and a secondary peel away covering 3018 of a mouth-sized opening bonded at the perimeter to the lid that has a thermal/pressure formed tear zone 3022 which provides a weakened line in the sealing membrane so that when subjected to the force of the user on the peel tab, will tear cleanly along that line. The peel away seal, when removed, may permit the user to partake of the beverage without removing the entire lid for the container.

Referring to FIG. 32C, the container may be sealed by a biodegradable PLA double-coated paper lid across the top surface adhered to the PLA coated 3024 outward curled top edge 3012 of the biodegradable container. In a preferred method, this bond may be ultrasonically or thermally welded. When the lid is welded to the curled top edge 3012 of the container, heat (ultrasonic, hot plate, inductive or other) and pressure may be applied at the perimeter 3028 of the lid seal to force it into intimate contact 3030 with the curled edge of the container and the contacting PLA lining and weld the two contacting plastic layers together 3030 to form a water tight bond. The tool that creates the welded bond may wrap the seal 3032 around the outside of the curled edge 3012 to create a bond with more surface area for greater mechanical strength.

Referring to FIG. 32D, the body of the tubular container may be manufactured by a spiral wound construction made from several layers of paper stock sequentially wound 3034 one upon the other. The innermost lining layer may include a paper pulp material that is protected from water by a biodegradable organically derived plastic resin coating such as PLA. The spiral wound liner may include an organic, vegetable based and biodegradable plastic resin coating of PLA bonded to a paper backing layer has the leading edge of the liner winding, which may be folded back upon itself 3038 so that there is no cut edge of paper that would allow water to wick into the paper. This construction of the PLA lining may be water and air tight yet biodegradable into compostable material.

Referring to FIG. 32E, the body of the tubular container may be manufactured by a spiral wound construction made from several layers of paper stock 3044 sequentially wound one upon the other. The innermost lining layer may include a paper pulp material that is protected from water by a biodegradable organically derived plastic resin coating such as PLA. The spiral wound liner 3034 may include an organic, vegetable based and biodegradable plastic resin coating of PLA bonded to a paper backing layer. The leading edge of the liner winding may be folded back upon itself 3040 so that there is no cut edge of paper that would allow water to wick into the paper. In the winding process, heat and pressure may be applied to the layered construction at the point of the folded edge of the lining and the layers of PLA coating may be welded together 3042 to create a water tight joint. This construction of the PLA lining may be water and air tight yet biodegradable into compostable material.

Referring to FIG. 32F, the bottom of the container may be structurally sealed by a bonded PLA membrane 3202 with a reinforcing structural cap 3204 which covers the bottom of the container to create a durable connection of the bottom to the tube. Bonding of the PLA coating of one component to the other creates a water tight bond. The PLA water seal membrane may be welded to the outward curled edge of the spiral wound container. The bottom cap may be made of a thick layer of paperboard 3204. the watertight seal may be accomplished with a disc comprised of PLA 3202 with a paper backing. These may be assembled sequentially with the PLA membrane thermally bonded to the PLA lining that is exposed on the outward curled edge of the spiral tube.

Referring to FIG. 32G, alternatively the bottom of the container may be structurally sealed by a bonded PLA membrane 3202 with a reinforcing structural bottom disc 3208, which covers the bottom of the container to create a strong surface at the bottom to the tube. The bonding of the PLA coating of one component to the other creates a water tight bond. The assembly may be reinforced by a structural band 3210 that is heat shrunk, adhesive applied, heat welded, or the like to the perimeter of the container joint. The PLA water seal membrane may be welded to the outward curled edge of the spiral wound container. The bottom cap may be made of a thick layer of paperboard 3208. The watertight seal may be accomplished with a disc comprised of PLA 3202 with a paper backing. These may be assembled sequentially with the PLA membrane thermally bonded to the PLA lining that is exposed on the outward curled edge of the spiral tube. The reinforcing ring 3210 may be applied last to integrate the structural integrity of the assembled bottom seal.

Referring to FIG. 32H, the bottom of the container may be structurally sealed by a bonded PLA membrane 3202 with a reinforcing structural cap 3204, which covers the bottom of the container to create a durable connection of the bottom to the tube. The bonding of the PLA coating 3024 of one component to the other may create a water tight bond. The PLA water seal membrane 3024 may be welded to the outward curled edge 3214 of the spiral wound container. The bottom cap may be made of a thick layer of paperboard 3204. The watertight seal may be accomplished with a disc including PLA 3202 with a paper backing. These may be assembled sequentially with the PLA membrane thermally bonded to the PLA lining that is exposed on the outward curled edge of the spiral tube 3218 to create a water tight joint 3212. The reinforcing paperboard cap may be bonded to the side wall of the spiral wound tube 3220 to create a sound structural joint.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A container comprising:
    a body comprising a paper pulp;
    a coating applied to an exterior of the body, the coating comprising a first biodegradable, organically derived, plastic resin;
    a liner attached to an interior of the body, the liner comprising a second biodegradable, organically derived plastic resin;
    a lid dimensioned to attach to a top of the liner, thereby creating a liquid-proof container, wherein the lid includes a hole and the lid comprises paper pulp coated with a third biodegradable, organically derived, plastic resin; and
    a perimeter seal attached to the lid, the perimeter seal including a region dimensioned to create a friction fit when the region is disposed within the hole.

2. The container of claim 1, wherein the body bears a spiral wrap construction.

3. The container of claim 1, wherein the body bears a convolute wrap construction.

4. The container of claim 1, wherein any one of the first, second, or third biodegradable, organically derived plastic resins include polylactic acid.

5. The container of claim 1, wherein the liner is seamless.

6. The container of claim 1, wherein the liner is attached to the interior of the body via an adhesive bond.

7. The container of claim 1, wherein the liner is attached to the interior of the body via a weld.

8. The container of claim 1, wherein the perimeter seal is removably attached to the lid via an adhesive.

9. The container of claim 1, wherein the perimeter seal comprises a paper pulp coated with a fourth biodegradable, organically derived, plastic resin.

10. The container of claim 1, wherein the body includes a bottom portion that terminates in a curl extending towards the interior of the body, and the container further comprises a disk attached to the container at the curl.

11. The container of claim 1, wherein the body portion includes a bottom portion that terminates in a curl extending towards the exterior of the body, and the container further comprises a base portion attached to the exterior of body at the curl.

* * * * *